(12) United States Patent
Takeda et al.

(10) Patent No.: US 12,709,625 B2
(45) Date of Patent: Aug. 18, 2026

(54) ORGANOMETALLIC COMPOUND FOR MASK, LAYER, METHOD FOR PROCESSING ORGANIC SEMICONDUCTOR LAYER, AND METHOD FOR MANUFACTURING ORGANIC SEMICONDUCTOR DEVICE

(71) Applicant: Semiconductor Energy Laboratory Co., Ltd., Atsugi (JP)

(72) Inventors: Kyoko Takeda, Atsugi (JP); Masatoshi Takabatake, Atsugi (JP); Sachiko Kawakami, Atsugi (JP); Yui Yoshiyasu, Atsugi (JP); Tsunenori Suzuki, Yokohama (JP); Toshiki Sasaki, Kawasaki (JP); Naoaki Hashimoto, Sagamihara (JP); Tomoya Aoyama, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 370 days.

(21) Appl. No.: 18/682,991

(22) PCT Filed: Aug. 9, 2022

(86) PCT No.: PCT/IB2022/057394
§ 371 (c)(1),
(2) Date: Feb. 12, 2024

(87) PCT Pub. No.: WO2023/021370
PCT Pub. Date: Feb. 23, 2023

(65) Prior Publication Data

US 2024/0391939 A1 Nov. 28, 2024

(30) Foreign Application Priority Data

Aug. 20, 2021 (JP) ................................ 2021-134695

(51) Int. Cl.
*C07F 5/06* (2006.01)
*G03F 7/00* (2006.01)
(Continued)

(52) U.S. Cl.
CPC ............ *C07F 5/069* (2013.01); *G03F 7/0035* (2013.01); *G03F 7/161* (2013.01); *H10K 71/221* (2023.02)

(58) Field of Classification Search
CPC ........ C07F 5/069; G03F 7/0035; G03F 7/161; H10K 71/221; H10K 10/40; H10P 50/00;
(Continued)

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 103594646 A 2/2014
CN 104218156 A 12/2014
(Continued)

OTHER PUBLICATIONS

International Search Report (Application No. PCT/IB2022/057394) Dated Oct. 25, 2022.

(Continued)

*Primary Examiner* — Marcos D. Pizarro
(74) *Attorney, Agent, or Firm* — Eric J. Robinson; Robinson Intellectual Property Law Office, P.C.

(57) ABSTRACT

An increase in the voltage of an organic semiconductor device including a step of forming an aluminum oxide film over and in contact with an organic semiconductor layer is inhibited. A layer containing an organometallic compound for a mask for an organic semiconductor layer, which is
(Continued)

represented by General Formula (G1) below, is provided between the organic semiconductor layer and the aluminum oxide film. In General Formula (G1), Ar represents a substituted or unsubstituted aryl group having 6 to 30 carbon atoms or a substituted or unsubstituted heteroaryl group having 1 to 30 carbon atoms, X represents oxygen or sulfur, M represents a metal, n represents an integer greater than or equal to 1 and less than or equal to 5, and n is the same as the valence of the metal M. Note that when n is greater than or equal to 2, a plurality of Ars may be the same or different and Xs may be the same or different. When Ar represents the substituted or unsubstituted heteroaryl group having 1 to 30 carbon atoms, a heteroatom of the heteroaryl group may be coordinated to the metal M.

(G1)

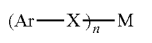

12 Claims, 19 Drawing Sheets

(51) Int. Cl.
*G03F 7/16* (2006.01)
*H10K 71/20* (2023.01)

(58) Field of Classification Search
CPC .... H10P 50/691; H10D 30/021; H10D 30/67; H05B 33/10
See application file for complete search history.

(56) References Cited

U.S. PATENT DOCUMENTS

| | | | |
|---|---|---|---|
| 10,862,036 | B2 | 12/2020 | Ke et al. |
| 2002/0072139 | A1 | 6/2002 | Kashiwabara |
| 2011/0148290 | A1 | 6/2011 | Oota |
| 2012/0256204 | A1 | 10/2012 | Yoshizumi et al. |
| 2012/0273804 | A1 | 11/2012 | Hatano |
| 2012/0276484 | A1 | 11/2012 | Izumi et al. |
| 2013/0084531 | A1 | 4/2013 | Hamaguchi et al. |
| 2013/0084664 | A1 | 4/2013 | Yoshitoku et al. |
| 2013/0084666 | A1 | 4/2013 | Oshige |
| 2013/0280839 | A1 | 10/2013 | Sonoda et al. |
| 2013/0295705 | A1 | 11/2013 | Sonoda et al. |
| 2014/0004640 | A1 | 1/2014 | Hamaguchi et al. |
| 2014/0004642 | A1 | 1/2014 | Otsuka et al. |
| 2015/0060826 | A1 | 3/2015 | Matsumoto et al. |
| 2015/0069360 | A1 | 3/2015 | Sato |
| 2015/0076476 | A1 | 3/2015 | Odaka et al. |
| 2016/0172595 | A1 | 6/2016 | Malinowski et al. |
| 2016/0315133 | A1 | 10/2016 | Sato |
| 2017/0141167 | A1 | 5/2017 | Naganuma |
| 2017/0256754 | A1 | 9/2017 | Defranco et al. |
| 2018/0190908 | A1 | 7/2018 | Ke et al. |
| 2020/0203662 | A1 | 6/2020 | Mollard et al. |
| 2025/0151601 | A1 | 5/2025 | Yoshiyasu et al. |

FOREIGN PATENT DOCUMENTS

| | | | |
|---|---|---|---|
| JP | 2000-012237 | A | 1/2000 |
| JP | 2000-036385 | A | 2/2000 |
| JP | 2003-059663 | A | 2/2003 |
| JP | 2008-098106 | A | 4/2008 |
| JP | 2008-147072 | A | 6/2008 |
| JP | 2008-251270 | A | 10/2008 |
| JP | 2014-120218 | A | 6/2014 |
| JP | 2014-135251 | A | 7/2014 |
| JP | 2014-232568 | A | 12/2014 |
| JP | 2015-115178 | A | 6/2015 |
| JP | 2016-197494 | A | 11/2016 |
| JP | 2018-521459 | | 8/2018 |
| JP | 2019-179696 | A | 10/2019 |
| JP | 2020-160305 | A | 10/2020 |
| KR | 2000-0006418 | A | 1/2000 |

OTHER PUBLICATIONS

Written Opinion (Application No. PCT/IB2022/057394) Dated Oct. 25, 2022.

Zakhidov.A et al., “Orthogonal processing: A new strategy for organic electronics”, Chem. Sci. (Chemical Science), Apr. 7, 2011, vol. 2, No. 6, pp. 1178-1182.

Malinowski.P et al., “High resolution photolithography for direct view active matrix organic light-emitting diode augmented reality displays”, J. Soc. Inf. Display (Journal of the Society for Information Display), Apr. 2, 2018, vol. 26, No. 3, pp. 128-136.

Malinowski.P et al., “Photolithographic patterning of organic photodetectors with a non-fluorinated photoresist system”, Organic Electronics, Jul. 12, 2014, vol. 15, No. 10, pp. 2355-2359.

Malinowski.P et al., “Multicolor 1250 ppi OLED Arrays Patterened by Photolithography”, SID Digest ’16 : SID International Symposium Digest of Technical Papers, May 22, 2016, vol. 47, No. 1, pp. 1009-1012.

Papadopoulos.N et al., “AMOLED Displays with In-Pixel Photodetector”, Liquid Crystals and Display Technology, Jul. 9, 2020, pp. 1-19.

Ke.T et al., “Technology Developments in High-Resolution FMM-free OLED and BEOL IGZO TFTs for Power-Efficient Microdisplays”, SID Digest ’21 : SID International Symposium Digest of Technical Papers, May 1, 2021, vol. 52, No. 1, pp. 127-130.

Malinowski.P et al., “Integration of additional functionalities into the frontplane of AMOLED displays”, SID Digest ’20 : SID International Symposium Digest of Technical Papers, Aug. 1, 2020, vol. 51, No. 1, pp. 646-649.

Malinowski.P et al., “Organic photolithography for displays with integrated fingerprint scanner”, SID Digest ’19 : SID International Symposium Digest of Technical Papers, May 29, 2019, vol. 50, No. 1, pp. 1007-1010.

Ke.T et al., “Island and Hole Fabrication on OLED Stack for High-Resolution Sensor in Display Application”, IDW ’20 : Proceedings of the 27th International Display Workshops, Dec. 9, 2020, vol. 27, pp. 902-905.

Gather.M et al., “Solution-Processed Full-Color Polymer-OLED Displays Fabricated by Direct Photolithography”, SID Digest ’06 : SID International Symposium Digest of Technical Papers, Jun. 1, 2006, vol. 37, No. 1, pp. 909-911.

Malinowski.P et al., “Photolithography as Enabler of AMOLED Displays Beyond 1000 ppi”, SID Digest ’17 : SID International Symposium Digest of Technical Papers, May 1, 2017, vol. 48, No. 1, pp. 623-626.

153
151

151s
151

153r
151

FIG. 6A
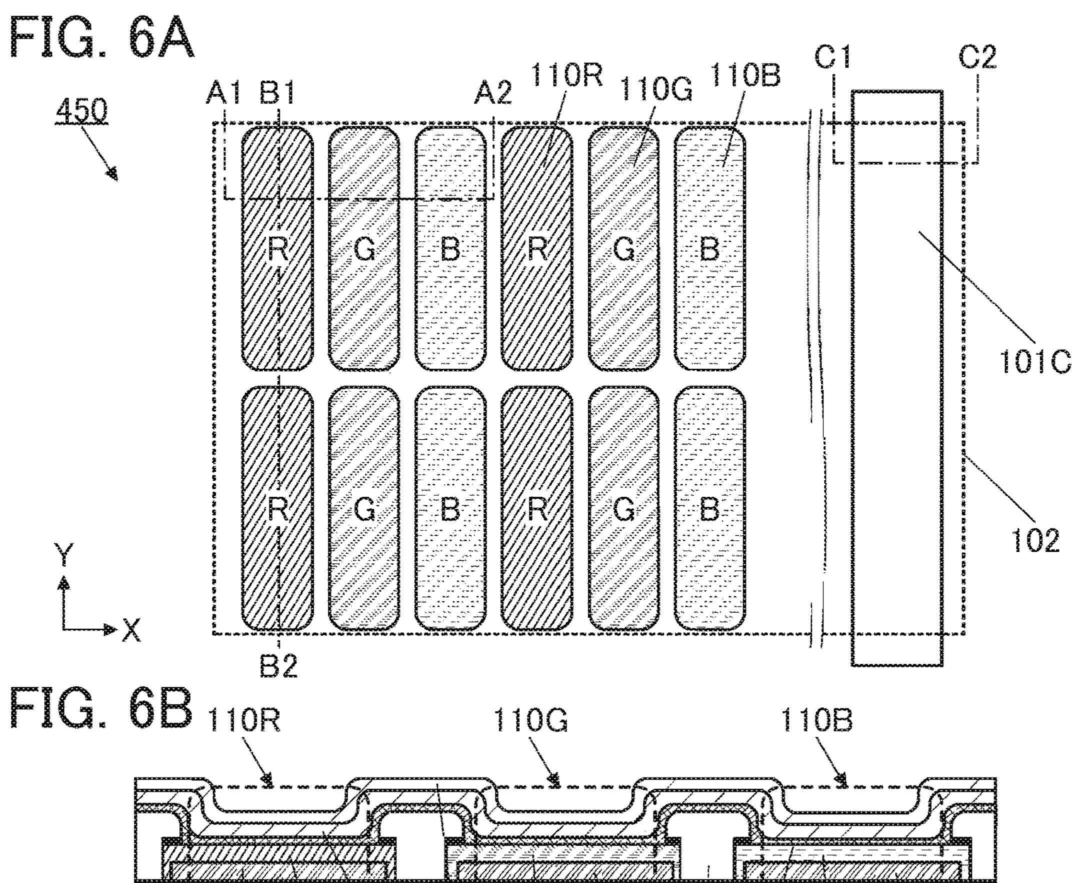
FIG. 6B
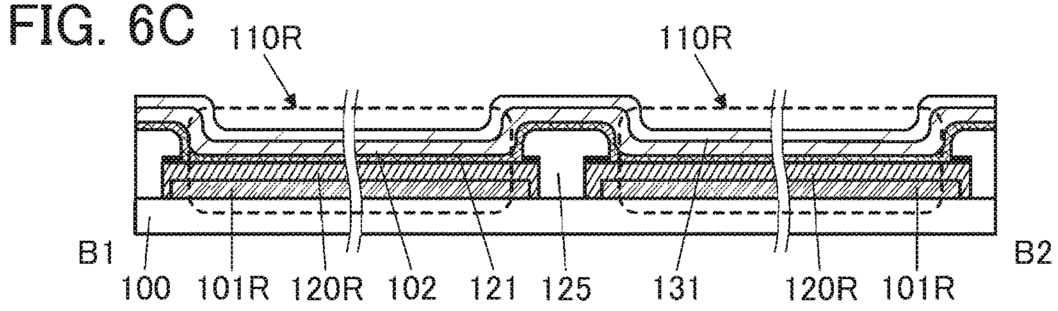
FIG. 6C
110R 110R
B1 B2
100 101R 120R 102 121 125 131 120R 101R
FIG. 6D
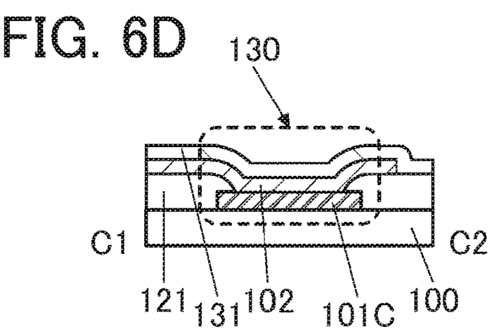

100
101B
101G
101R
101C

120Bb
144a
146a
148a 143a
144a
146a
148a 147a
144a
148a
147a 145a
145a
149a 120B
101B 605
602
D
C
603
B
604
601
610
609
A 605
617
612
610
618
602
613
616
611
614
C
B
607
623
601
604
608
609
A
D 1031
1029
1025
1021
1020
1003
1002
1001
1033
1035
1036
1024B
1034B
1006
1024G
1034G
1024R
1034R
1028
1040
1007
1008
1041
1032
1042

1031
1035
1029
1025
1037
1021
1020
1003
1002
1001
1034B
1024B
1022
1006
1024G
1034G
1006
1024R
1040
1034R
1006
1006
1028
1007
1041
1008
1032
1042

FIG. 14A
7109
7107
7110
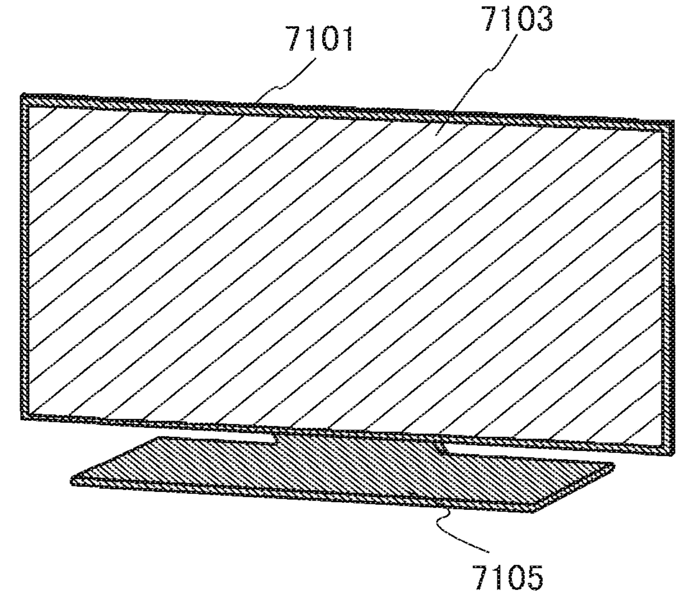
FIG. 14B1
FIG. 14B2
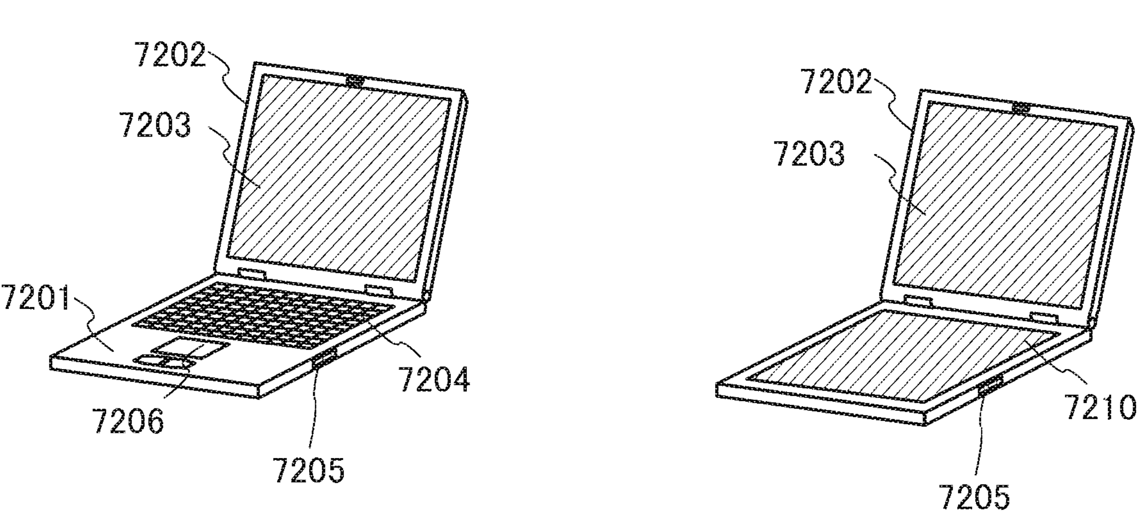
FIG. 14C
7405
7402
7403
7401
7403
7406
7404

ORGANOMETALLIC COMPOUND FOR MASK, LAYER, METHOD FOR PROCESSING ORGANIC SEMICONDUCTOR LAYER, AND METHOD FOR MANUFACTURING ORGANIC SEMICONDUCTOR DEVICE

TECHNICAL FIELD

One embodiment of the present invention relates to an organic compound, an organic EL device, a display module, a lighting module, a display apparatus, a light-emitting apparatus, an electronic appliance, a lighting device, and an electronic device. Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter. Accordingly, more specific examples of the technical field of one embodiment of the present invention disclosed in this specification include a semiconductor device, a display apparatus, a liquid crystal display apparatus, a light-emitting apparatus, a lighting device, a power storage device, a memory device, an imaging device, a driving method thereof, and a manufacturing method thereof.

BACKGROUND ART

Organic EL devices including organic compounds and utilizing electroluminescence (EL) have been put to more practical use. In the basic structure of such organic EL devices, an organic compound layer containing a light-emitting material (an EL layer) is held between a pair of electrodes. Carriers are injected by application of voltage to the device, and recombination energy of the carriers is used, whereby light emission can be obtained from the light-emitting material.

Such organic EL devices are of self-luminous type and thus have advantages over liquid crystal devices, such as high visibility and no need for a backlight when used for pixels of a display, and are particularly suitable for flat panel displays. Displays including such organic EL devices are also highly advantageous in that they can be thin and lightweight. Another feature is an extremely fast response speed.

Since light-emitting layers of such organic EL devices can be successively formed two-dimensionally, planar light emission can be obtained. This feature is difficult to realize with point light sources typified by incandescent lamps and LEDs or linear light sources typified by fluorescent lamps; thus, the organic EL devices also have great potential as planar light sources, which can be used for lighting and the like.

Light-emitting apparatuses including organic EL devices are suitable for a variety of electronic appliances as described above, and research and development of organic EL devices has progressed for better characteristics.

In order to obtain a higher-resolution light-emitting apparatus using an organic EL device, patterning an organic layer by a photolithography method using a photoresist or the like, instead of an evaporation method using a metal mask, has been studied. By using the photolithography method, a high-resolution light-emitting apparatus in which the distance between EL layers is several micrometers can be obtained (see Patent Document 1, for example).

REFERENCE

Patent Document

[Patent Document 1] Japanese Translation of PCT International Application No. 2018-521459

SUMMARY OF THE INVENTION

Problems to be Solved by the Invention

In patterning of an organic layer by a photolithography method, an aluminum oxide film is sometimes used as a mask layer for the organic layer. An aluminum oxide film is suitable for a mask film for the organic layer because the organic layer is less likely to suffer serious damage from the formation and removal of the aluminum oxide film. However, although the damage is not serious, long-term exposure of a surface of the organic layer to a processing condition for removing the aluminum oxide film might result in degraded characteristics. Furthermore, if the aluminum oxide film remains on the surface of the organic layer, a device to be manufactured later might have an increased voltage.

In view of the above, an object of one embodiment of the present invention is to inhibit an increase in the voltage of an organic semiconductor device which including a step of forming an aluminum oxide film over and in contact with an organic semiconductor layer. Another object of one embodiment of the present invention is to provide an organic semiconductor device having favorable characteristics, which is manufactured by a method including a step of forming an aluminum oxide film over and in contact with an organic semiconductor layer.

Means for Solving the Problems

In view of the above, one embodiment of the present invention provides an organometallic compound represented by General Formula (G1) below for a mask for an organic semiconductor layer used to remove an aluminum oxide film formed over the organic semiconductor layer.

[Chemical formula 1]

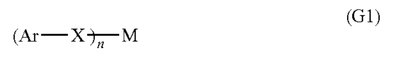

(G1)

In General Formula (G1), Ar represents a substituted or unsubstituted aryl group having 6 to 30 carbon atoms or a substituted or unsubstituted heteroaryl group having 1 to 30 carbon atoms, X represents oxygen or sulfur, M represents a metal, n represents an integer greater than or equal to 1 and less than or equal to 5, and n is the same as the valence of the metal M. Note that when n is greater than or equal to 2, a plurality of Ars may be the same or different and Xs may be the same or different. When Ar represents the substituted or unsubstituted heteroaryl group having 1 to 30 carbon atoms, a heteroatom of the heteroaryl group may be coordinated to the metal M.

Another embodiment of the present invention is an organometallic compound for a mask for an organic semiconductor layer with the above structure, in which the organometallic compound represented by General Formula (G1) is an organometallic compound represented by General Formula (G2) below.

[Chemical formula 2]

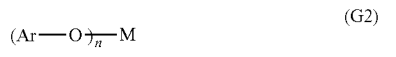

(G2)

In General Formula (G2), Ar represents a substituted or unsubstituted aryl group having 6 to 30 carbon atoms or a substituted or unsubstituted heteroaryl group having 1 to 30 carbon atoms, M represents a metal, n represents an integer greater than or equal to 1 and less than or equal to 3, and n is the same as the valence of the metal M. Note that when n is greater than or equal to 2, a plurality of Ars may be the same or different and Xs may be the same or different. When Ar represents the substituted or unsubstituted heteroaryl group having 1 to 30 carbon atoms, a heteroatom of the heteroaryl group may be coordinated to the metal M.

Another embodiment of the present invention is an organometallic compound for a mask for an organic semiconductor layer with the above structure, in which the organic semiconductor layer includes a photoelectric conversion layer.

Another embodiment of the present invention is an organometallic compound for a mask for an EL layer with the above structure, in which the organic semiconductor layer is an EL layer.

Another embodiment of the present invention is a layer that is positioned between an organic semiconductor layer and an aluminum oxide film and includes an organometallic compound represented by General Formula (G1) below.

[Chemical formula 3]

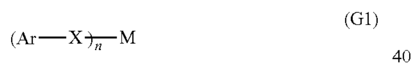

(G1)

In General Formula (G1), Ar represents a substituted or unsubstituted aryl group having 6 to 30 carbon atoms or a substituted or unsubstituted heteroaryl group having 1 to 30 carbon atoms, X represents oxygen or sulfur, M represents a metal, n represents an integer greater than or equal to 1 and less than or equal to 5, and n is the same as the valence of the metal M. Note that when n is greater than or equal to 2, a plurality of Ars may be the same or different and Xs may be the same or different. When Ar represents the substituted or unsubstituted heteroaryl group having 1 to 30 carbon atoms, a heteroatom of the heteroaryl group may be coordinated to the metal M.

Another embodiment of the present invention is a layer that is positioned between an organic semiconductor layer and an aluminum oxide film, includes an organometallic compound represented by General Formula (G1) below, and is used to remove the aluminum oxide film.

[Chemical formula 4]

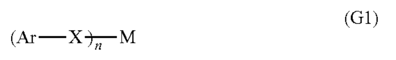

(G1)

In General Formula (G1), Ar represents a substituted or unsubstituted aryl group having 6 to 30 carbon atoms or a substituted or unsubstituted heteroaryl group having 1 to 30 carbon atoms, X represents oxygen or sulfur, M represents a metal, n represents an integer greater than or equal to 1 and less than or equal to 5, and n is the same as the valence of the metal M. Note that when n is greater than or equal to 2, a plurality of Ars may be the same or different and Xs may be the same or different. When Ar represents the substituted or unsubstituted heteroaryl group having 1 to 30 carbon atoms, a heteroatom of the heteroaryl group may be coordinated to the metal M.

Another embodiment of the present invention is a layer with the above structure, in which the organometallic compound represented by General Formula (G1) is an organometallic compound represented by General Formula (G2) below.

[Chemical formula 5]

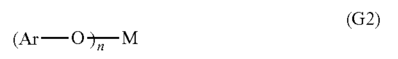

(G2)

In General Formula (G2), Ar represents a substituted or unsubstituted aryl group having 6 to 30 carbon atoms or a substituted or unsubstituted heteroaryl group having 1 to 30 carbon atoms, M represents a metal, n represents an integer greater than or equal to 1 and less than or equal to 3, and n is the same as the valence of the metal M. Note that when n is greater than or equal to 2, a plurality of Ars may be the same or different and Xs may be the same or different. When Ar represents the substituted or unsubstituted heteroaryl group having 1 to 30 carbon atoms, a heteroatom of the heteroaryl group may be coordinated to the metal M.

Another embodiment of the present invention is a layer with the above structure, in which the organic semiconductor layer includes a photoelectric conversion layer.

Another embodiment of the present invention is a layer with the above structure, in which the organic semiconductor layer is an EL layer.

Another embodiment of the present invention is a method for processing an organic semiconductor layer, which includes: a step of forming an organic semiconductor layer over a first electrode; a step of forming a mask layer including an organometallic compound represented by General Formula (G1) over the organic semiconductor layer; a step of forming an aluminum oxide film over the mask layer; a step of processing a shape of the organic semiconductor layer with the use of the aluminum oxide film; and a step of removing the mask layer and the aluminum oxide film by means of water or a liquid containing water as a solvent.

[Chemical formula 6]

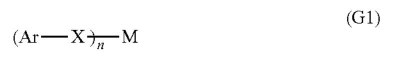

(G1)

In General Formula (G1), Ar represents a substituted or unsubstituted aryl group having 6 to 30 carbon atoms or a substituted or unsubstituted heteroaryl group having 1 to 30 carbon atoms, X represents oxygen or sulfur, M represents a metal, n represents an integer greater than or equal to 1 and less than or equal to 5, and n is the same as the valence of the metal M. Note that when n is greater than or equal to 2, a plurality of Ars may be the same or different and Xs may be the same or different. When Ar represents the substituted or unsubstituted heteroaryl group having 1 to 30 carbon atoms, a heteroatom of the heteroaryl group may be coordinated to the metal M.

Another embodiment of the present invention is a method for processing an organic semiconductor layer with the above structure, in which the organometallic compound represented by General Formula (G1) is an organometallic compound represented by General Formula (G2) below.

[Chemical formula 7]

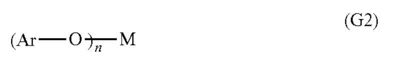

(G2)

In General Formula (G2), Ar represents a substituted or unsubstituted aryl group having 6 to 30 carbon atoms or a substituted or unsubstituted heteroaryl group having 1 to 30 carbon atoms, M represents a metal, n represents an integer greater than or equal to 1 and less than or equal to 3, and n is the same as the valence of the metal M. Note that when n is greater than or equal to 2, a plurality of Ars may be the same or different and Xs may be the same or different. When Ar represents the substituted or unsubstituted heteroaryl group having 1 to 30 carbon atoms, a heteroatom of the heteroaryl group may be coordinated to the metal M.

Another embodiment of the present invention is a method for processing an organic semiconductor layer with the above structure, in which the aluminum oxide film is formed by an atomic layer deposition method.

Another embodiment of the present invention is a method for processing an organic semiconductor layer with the above structure, in which a mask layer containing the organometallic compound is formed by a vacuum evaporation method.

Another embodiment of the present invention is a method for processing an organic semiconductor layer with the above structure, which includes, after the step of forming the aluminum oxide film over the mask layer: a step of forming a metal film or a metal compound film over the aluminum oxide film; a step of processing a shape of the organic semiconductor layer with the use of the aluminum oxide film and the metal film or the metal compound film; and a step of removing the mask layer and the aluminum oxide film by means of water or a liquid containing water as a solvent.

Another embodiment of the present invention is a method for processing an organic semiconductor layer with the above structure, which includes, after the step of processing the shape of the organic semiconductor layer: a step of removing the metal film or the metal compound film; and the step of removing the mask layer and the aluminum oxide film by means of water or a liquid containing water as a solvent.

Another embodiment of the present invention is a method for processing an organic semiconductor layer with the above structure, in which water is used in the step of removing the mask layer and the aluminum oxide film by means of water or a liquid containing water as a solvent.

Another embodiment of the present invention is a method for processing an organic semiconductor layer with the above structure, which includes a step of removing part or the whole of the aluminum oxide film by means of an alkaline solution or an acidic solution before the step of removing the mask layer and the aluminum oxide film by means of water.

Another embodiment of the present invention is a method for processing an organic semiconductor layer with the above structure, in which the organic semiconductor layer includes a photoelectric conversion layer.

Another embodiment of the present invention is a method for processing an EL layer with the above structure, in which the organic semiconductor layer is an EL layer.

Another embodiment of the present invention is a method for processing an EL layer with the above structure, in which the EL layer has a stacked-layer structure and the EL layer includes a hole-injection layer, a hole-transport layer, a light-emitting layer, and an electron-transport layer in this order from the first electrode side.

Another embodiment of the present invention is a method for manufacturing an organic semiconductor device, which includes: a step of forming an organic semiconductor film over a first electrode; a step of forming a mask film including an organometallic compound represented by General Formula (G1) over the organic semiconductor film; a step of forming a first aluminum oxide film over the mask film; a step of forming a metal film or a metal compound film over the first aluminum oxide film; a step of forming a photomask over the metal film or the metal compound film; a step of forming a metal layer or a metal compound layer overlapping with the first electrode by etching the metal film or the metal compound film with the use of the photomask; a step of removing the photomask; a step of forming a first aluminum oxide layer, a mask layer, and an organic semiconductor layer by etching the first aluminum oxide film, the mask film, and the organic semiconductor film with the use of the metal layer or the metal compound layer as a mask; a step of removing the metal layer or the metal compound layer; a step of forming an organic resin film covering the first electrode, the organic semiconductor layer, the mask layer, and the first aluminum oxide layer; a step of forming, in the organic resin film, an opening portion overlapping with the first electrode, the organic semiconductor layer, the mask layer, and the first aluminum oxide layer; and a step of removing the mask layer and the first aluminum oxide layer that overlap with the opening portion by means of water or a liquid containing water as a solvent.

[Chemical formula 8]

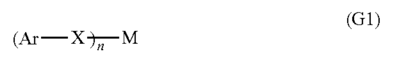

(G1)

In General Formula (G1), Ar represents a substituted or unsubstituted aryl group having 6 to 30 carbon atoms or a substituted or unsubstituted heteroaryl group having 1 to 30 carbon atoms, X represents oxygen or sulfur, M represents a metal, n represents an integer greater than or equal to 1 and less than or equal to 5, and n is the same as the valence of the metal M. Note that when n is greater than or equal to 2, a plurality of Ars may be the same or different and Xs may be the same or different. When Ar represents the substituted or unsubstituted heteroaryl group having 1 to 30 carbon atoms, a heteroatom of the heteroaryl group may be coordinated to the metal M.

Another embodiment of the present invention is a method for manufacturing an organic semiconductor device with the above structure, in which the organometallic compound represented by General Formula (G1) is an organometallic compound represented by General Formula (G2) below.

[Chemical formula 9]

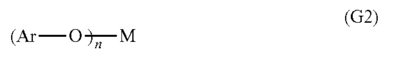

(G2)

In General Formula (G2), Ar represents a substituted or unsubstituted aryl group having 6 to 30 carbon atoms or a substituted or unsubstituted heteroaryl group having 1 to 30 carbon atoms, M represents a metal, n represents an integer greater than or equal to 1 and less than or equal to 3, and n is the same as the valence of the metal M. Note that when n is greater than or equal to 2, a plurality of Ars may be the same or different and Xs may be the same or different. When Ar represents the substituted or unsubstituted heteroaryl group having 1 to 30 carbon atoms, a heteroatom of the heteroaryl group may be coordinated to the metal M.

Another embodiment of the present invention is a method for manufacturing an organic semiconductor device with the above structure, in which water is used in the step of removing the mask layer and the first aluminum oxide layer that overlap with the opening portion by means of water or a liquid containing water as a solvent.

Another embodiment of the present invention is a method for manufacturing an organic semiconductor device with the above structure, which includes a step of removing part or the whole of the first aluminum oxide layer by means of an alkaline solution or an acidic solution before the step of removing the mask layer and the first aluminum oxide layer that overlap with the opening portion by means of water or a liquid containing water as a solvent.

Another embodiment of the present invention is a method for manufacturing an organic semiconductor device, which includes: a step of forming an organic semiconductor film over a first electrode; a step of forming a mask film including an organometallic compound represented by General Formula (G1) over the organic semiconductor film; a step of forming a first aluminum oxide film over the mask film; a step of forming a metal film or a metal compound film over the first aluminum oxide film; a step of forming a photomask over the metal film or the metal compound film; a step of forming a metal layer or a metal compound layer overlapping with the first electrode by etching the metal film or the metal compound film with the use of the photomask; a step of removing the photomask; a step of forming a first aluminum oxide layer, a mask layer, and an organic semiconductor layer by etching the first aluminum oxide film, the mask film, and the organic semiconductor film with the use of the metal layer or the metal compound layer as a mask; a step of removing the metal layer or the metal compound layer; a step of forming a second aluminum oxide film covering the first electrode, the organic semiconductor layer, the mask layer, and the first aluminum oxide layer; a step of forming an organic resin film covering the first electrode, the organic semiconductor layer, the mask layer, the first aluminum oxide layer, and the second aluminum oxide film; a step of forming, in the organic resin film, an opening portion overlapping with the first electrode, the organic semiconductor layer, the mask layer, the first aluminum oxide layer, and the second aluminum oxide film; and a step of removing the mask layer, the first aluminum oxide layer, and the second aluminum oxide film that overlap with the opening portion by means of water or a liquid containing water as a solvent.

[Chemical formula 10]

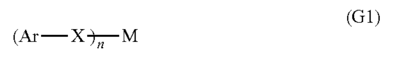

(G1)

In General Formula (G1), Ar represents a substituted or unsubstituted aryl group having 6 to 30 carbon atoms or a substituted or unsubstituted heteroaryl group having 1 to 30 carbon atoms, X represents oxygen or sulfur, M represents a metal, n represents an integer greater than or equal to 1 and less than or equal to 5, and n is the same as the valence of the metal M. Note that when n is greater than or equal to 2, a plurality of Ars may be the same or different and Xs may be the same or different. When Ar represents the substituted or unsubstituted heteroaryl group having 1 to 30 carbon atoms, a heteroatom of the heteroaryl group may be coordinated to the metal M.

Another embodiment of the present invention is a method for manufacturing an organic semiconductor device with the above structure, in which the organometallic compound represented by General Formula (G1) is an organometallic compound represented by General Formula (G2) below.

[Chemical formula 11]

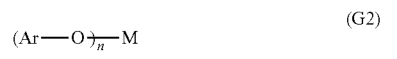

(G2)

In General Formula (G2), Ar represents a substituted or unsubstituted aryl group having 6 to 30 carbon atoms or a substituted or unsubstituted heteroaryl group having 1 to 30 carbon atoms, M represents a metal, n represents an integer greater than or equal to 1 and less than or equal to 3, and n is the same as the valence of the metal M. Note that when n is greater than or equal to 2, a plurality of Ars may be the same or different and Xs may be the same or different. When Ar represents the substituted or unsubstituted heteroaryl group having 1 to 30 carbon atoms, a heteroatom of the heteroaryl group may be coordinated to the metal M.

Another embodiment of the present invention is a method for manufacturing an organic semiconductor device with the above structure, in which water is used in the step of removing the mask layer, the first aluminum oxide layer, and the second aluminum oxide film that overlap with the opening portion by means of water or a liquid containing water as a solvent.

Another embodiment of the present invention is a method for manufacturing an organic semiconductor device with the above structure, which includes a step of removing part or the whole of the second aluminum oxide film and the first aluminum oxide layer by means of an alkaline solution or an acidic solution before the step of removing the mask layer and the first aluminum oxide layer that overlap with the opening portion by means of water or a liquid containing water as a solvent.

Another embodiment of the present invention is a method for manufacturing an organic semiconductor device with the above structure, in which the second aluminum oxide film is formed by an atomic layer deposition method.

Another embodiment of the present invention is a method for manufacturing an organic semiconductor device with the above structure, in which the first aluminum oxide film is formed by an atomic layer deposition method.

Another embodiment of the present invention is a method for manufacturing an organic semiconductor device with the above structure, in which a mask layer containing the organometallic compound is formed by a vacuum evaporation method.

Another embodiment of the present invention is a method for manufacturing an organic semiconductor device with the above structure, in which the organic semiconductor layer includes a photoelectric conversion layer.

Another embodiment of the present invention is a method for manufacturing an organic EL device with the above structure, in which the organic semiconductor layer is an EL layer.

Another embodiment of the present invention is a method for manufacturing an organic EL device with the above structure, in which the EL layer has a stacked-layer structure and the EL layer includes a hole-injection layer, a hole-transport layer, a light-emitting layer, and an electron-transport layer in this order from the first electrode side.

Note that the light-emitting apparatus in this specification includes, in its category, an image display device that uses an organic EL device. The light-emitting apparatus may also include a module in which an organic EL device is provided with a connector such as an anisotropic conductive film or a TCP (Tape Carrier Package), a module in which a printed wiring board is provided at the end of a TCP, and a module in which an IC (integrated circuit) is directly mounted on an organic EL device by a COG (Chip On Glass) method. Furthermore, a lighting device or the like may include the light-emitting apparatus.

Effect of the Invention

According to one embodiment of the present invention, an increase in the voltage of an organic semiconductor device including a step of forming an aluminum oxide film over and in contact with an organic semiconductor layer can be inhibited. According to another embodiment of the present invention, an organic semiconductor device having favorable characteristics, which is the organic semiconductor device including a step of forming an aluminum oxide film over and in contact with an organic semiconductor layer.

Note that the description of these effects does not preclude the existence of other effects. Note that one embodiment of the present invention does not need to have all these effects. Other effects will be apparent from the description of the specification, the drawings, the claims, and the like, and other effects can be derived from the description of the specification, the drawings, the claims, and the like.

BRIEF DESCRIPTION OF THE DRAWINGS

FIG. 6A to FIG. 6D are diagrams illustrating a light-emitting apparatus.

FIG. 14A, FIG. 14B 1, FIG. 14B2, and FIG. 14C are diagrams illustrating electronic devices.

MODE FOR CARRYING OUT THE INVENTION

Embodiments of the present invention will be described in detail below with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

In this specification and the like, a device formed using a metal mask or an FMM (fine metal mask, high-resolution metal mask) may be referred to as a device having an MM (metal mask) structure. In addition, in this specification and the like, a device formed without using a metal mask or an FMM may be referred to as a device having an MML (metal maskless) structure.

In this specification and the like, a film that is not processed into any shape after being formed is referred to as a "film," and a film that is processed into a shape after being formed is referred to as a "layer" in many cases. However, they are distinguished mainly for easy understanding of the progress of the process, and there is no big difference between them, whereby a "film" can be read as a "layer," and a "layer" can be read as a "film." In particular, both of them have the same meaning in a description that does not refer to a processing step.

Embodiment 1

As a method for forming an organic semiconductor film in a predetermined shape, a vacuum evaporation method with a metal mask (mask vapor deposition) is widely used. However, in these days of higher density and higher resolution, mask vapor deposition has come close to the limit of increasing the resolution for various reasons such as the alignment accuracy and the distance between the mask and the substrate. Meanwhile, shape processing of an organic semiconductor film by a photolithography method enables the formation of a finer pattern. The processing of an organic semiconductor film by a photolithography method can also achieve an increase in area easily and thus has been actively researched.

However, the shape processing of an organic semiconductor film by a photolithography method requires many problems to be overcome. Examples of these problems include the influence of the following: exposure of the organic semiconductor film to the air, light irradiation in exposure of a photosensitive resin to light, a developer to which the light-exposed photosensitive resin is exposed at the time of development, and formation of a metal film that is sometimes formed to reduce the influence of the developer.

The influence of the above is considered problematic because it eliminates the organic semiconductor film itself, or damages a surface of the organic semiconductor film to significantly degrade the characteristics of a device to be manufactured later, for example.

Figure 2A:
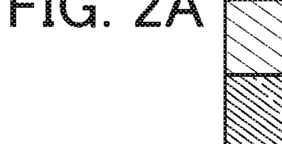
FIG. 2A to FIG. 2C are diagrams illustrating a conventional structure.
Figure 2A:
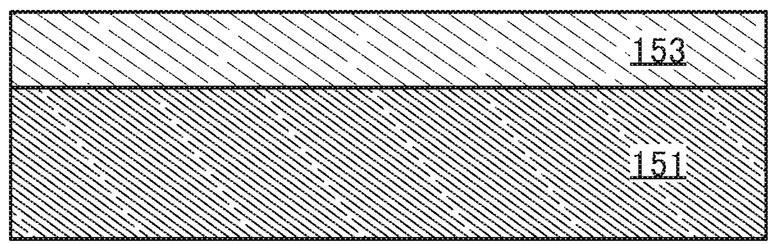

Here, as one means to solve the above problems, an aluminum oxide film 153 is provided over and in contact with an organic semiconductor film 151 as a protective film as illustrated in FIG. 2A, and then a step that would cause the above-described problems is performed. Since an aluminum oxide film can be formed dense and is highly capable of blocking liquid and gas, the adverse effects caused by the step can be inhibited. Furthermore, the aluminum oxide film can be formed and removed by a method that is less likely to damage the organic semiconductor film, and thus is extremely suitable as a protective film for the organic semiconductor film 151.

Note that an atomic layer deposition method (an ALD method) that is capable of forming a denser film and is less likely to damage the organic semiconductor film is preferably employed as a formation method of the aluminum oxide film.

Figure 2B:
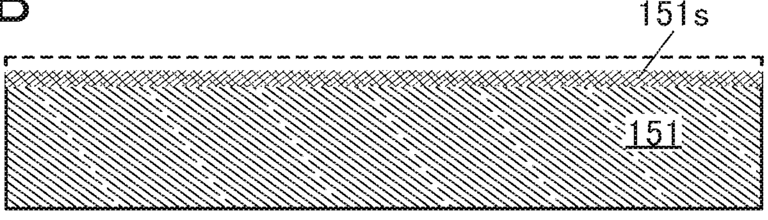

As described above, since the formation and removal of an aluminum oxide film cause relatively less damage to the organic semiconductor film, an aluminum oxide film is suitably used as a protective film in processing of the organic semiconductor film by a photolithography method. However, it is natural that a surface 151*s* of the organic semiconductor film 151 is damaged, as illustrated in FIG. 2B, when the surface of the organic semiconductor film is excessively exposed to a step of removing the aluminum oxide film, whereby the characteristics of the organic semiconductor might be degraded. Accordingly, the time taken for the removal of the aluminum oxide film is preferably as short as possible.

Figure 2C:
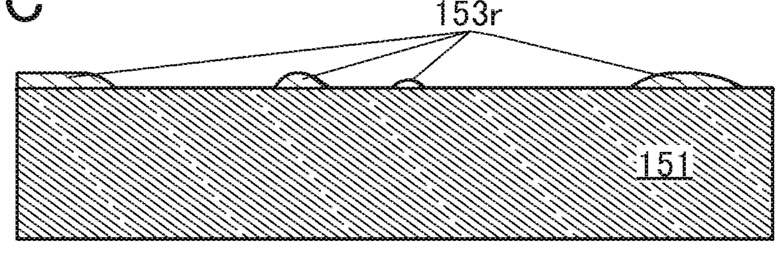

In order to complete the removal step in the shortest period of time, the step is preferably ended once the aluminum oxide is removed from an upper surface of the organic semiconductor film. However, determining that is extremely difficult. In addition, in-plane variation of the film quality of the aluminum oxide film may cause in-plane variation of the etching rate in etching that is the step of removing the aluminum oxide film. As illustrated in FIG. 2C, even when the aluminum oxide film can be removed partially, aluminum oxide films 153*r* might remain in some portions. In particular, in the case where an aluminum oxide film is provided over an organic film by an ALD method, the film formation cannot be performed at high temperature and the above-described in-plane variation is easily caused. Accordingly, the aluminum oxide films 153*r*, which remain due to the in-plane variation, may be generated in some portions. When the aluminum oxide remains over the organic semiconductor film, the driving voltage of a device manufactured later might increase. Note that excessive etching for removing all of the aluminum oxide films 153*r* is extremely undesirable because such etching might cause side etching of the aluminum oxide film that should remain in the process and is provided in an adjacent pixel direction (unremoved aluminum oxide film) from the lateral direction.

Figure 1A:
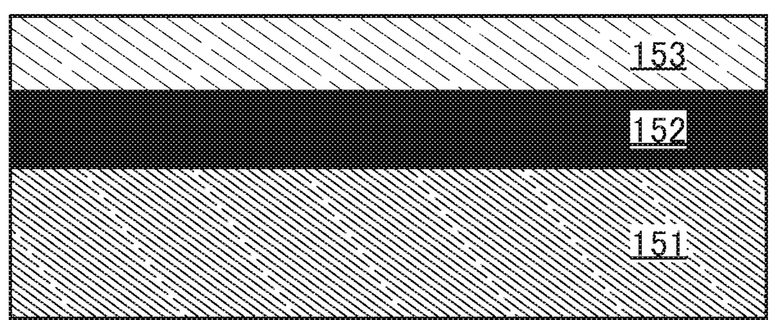
FIG. 1A and FIG. 1B are diagrams illustrating one embodiment of the present invention.

In one embodiment of the present invention, as illustrated in FIG. 1A, a film containing an organometallic compound having a specific structure (a mask film) 152 is provided between the organic semiconductor film 151 and the aluminum oxide film 153 to facilitate removal of the aluminum oxide film.

As the organometallic compound, an organometallic compound represented by General Formula (G1) below is preferably used.

[Chemical formula 12]

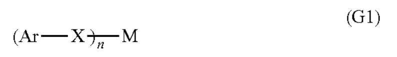

(G1)

In General Formula (G1), Ar represents a substituted or unsubstituted aryl group having 6 to 30 carbon atoms or a substituted or unsubstituted heteroaryl group having 1 to 30 carbon atoms, X represents oxygen or sulfur, M represents a metal, n represents an integer greater than or equal to 1 and less than or equal to 5, and n is the same as the valence of the metal M. Note that when n is greater than or equal to 2, a plurality of Ars may be the same or different and Xs may be the same or different. When Ar represents the substituted or unsubstituted heteroaryl group having 1 to 30 carbon atoms, a heteroatom of the heteroaryl group may be coordinated to the metal M.

Figure 1B:
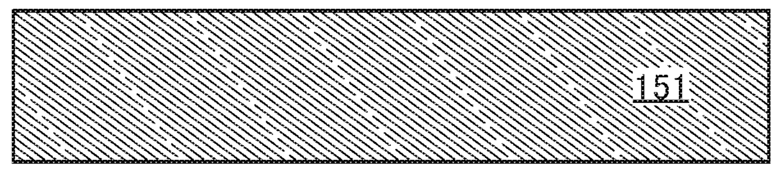

When the layer containing the organometallic compound represented by General Formula (G1) above (mask layer) is provided between the organic semiconductor film and the aluminum oxide film, the aluminum oxide film can be easily removed from the organic semiconductor film 151, as in FIG. 1B, by means of water or a liquid containing water as a solvent. The removal of the mask layer by means of water or a liquid containing water as a solvent can cause less damage to the organic semiconductor film 151 than the removal of the aluminum oxide film and also can significantly reduce lateral damage to the aluminum oxide film that is to remain in patterning of an organic semiconductor layer; accordingly, degradation of the characteristics of a device to be manufactured later can be inhibited.

Note that in the organometallic compound represented by General Formula (G1) above, X is preferably an oxygen atom, in which case an interaction with water or a liquid containing water as a solvent is strong, the aluminum oxide film can be more easily removed, and evaporation can be performed stably, enabling the formation of a film with high heat resistance and stability. That is, an organometallic represented by General Formula (G2) below is preferred.

[Chemical formula 13]

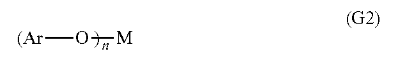

(G2)

In General Formula (G2), Ar represents a substituted or unsubstituted aryl group having 6 to 30 carbon atoms or a substituted or unsubstituted heteroaryl group having 1 to 30 carbon atoms, M represents a metal, n represents an integer greater than or equal to 1 and less than or equal to 3, and n is the same as the valence of the metal M. Note that when n is greater than or equal to 2, a plurality of Ars may be the same or different and Xs may be the same or different. When Ar represents the substituted or unsubstituted heteroaryl group having 1 to 30 carbon atoms, a heteroatom of the heteroaryl group may be coordinated to the metal M.

In General Formula (G1) or (G2) above, M is preferably aluminum, in which case an interaction with water or a liquid containing water as a solvent is strong, the layer containing the organometallic compound represented by General Formula (G1) or (G2) above (mask layer) can be more easily removed, evaporation can be performed stably, a film with high heat resistance and stability can be formed, and the effect of improving adhesion to the aluminum oxide film can be expected.

As the aryl group having 6 to 30 carbon atoms, a phenyl group, a biphenyl group, a terphenyl group, a naphthyl group, an anthracenyl group, a fluorenyl group, a dibenzofluorenyl group, a diphenylfluorenyl group, a spirobifluorenyl group, a pyrenyl group, a phenanthrenyl group, a triphenylenyl group, a perylenyl group, a tetracenyl group, or a chrysenyl group is preferred. As the heteroaryl group having 1 to 30 carbon atoms, a group having a pyridine ring, a pyrazine ring, a pyrimidine ring, a pyridazine ring, a triazine ring, a quinoline ring, a quinazoline ring, an isoquinoline ring, a pyrrole ring, a naphthyridine ring, a phenanthridine ring, a quinoxaline ring, an imidazole ring, a benzimidazole ring, an oxazole ring, an isoxazole ring, a thiazole ring, an isothiazole ring, or a benzofuran ring is preferred; a pyridyl group or a quinolyl group is further preferred because a coordinate bond with the metal M can be easily formed; and a 2-pyridyl group or a 8-quinolyl group is still further preferred because a stable coordinate bond with the metal M can be formed. In the case where the aryl group having 6 to 30 carbon atoms or the heteroaryl group having 1 to 30 carbon atoms has a substituent, examples of the substituent include an alkyl group having 1 to 6 carbon atoms, a cycloalkyl group having 3 to 10 carbon atoms, an alkoxy group having 1 to 6 carbon atoms, and a halogen.

Specific examples of the organometallic compounds represented by General Formula (G1) and General Formula (G2) above include organometallic compounds represented by Structural Formulae (100) to (115) below.

[Chemical formula 14]

(100)

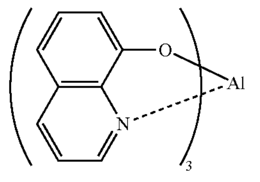

(101)

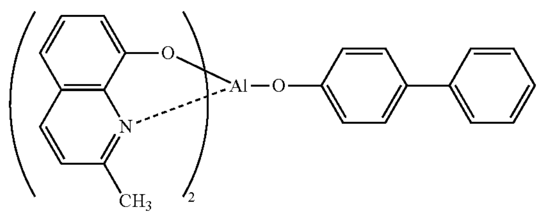

(102)

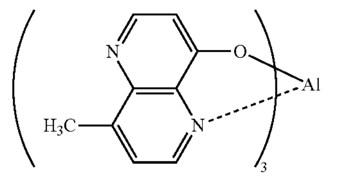

-continued (103)

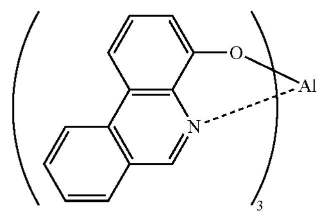

(104)

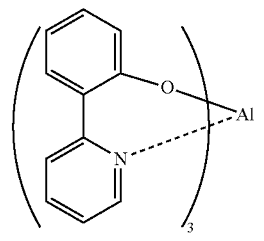

(105)

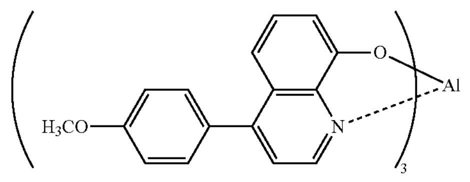

(106)

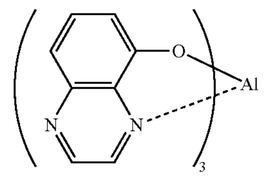

(107)

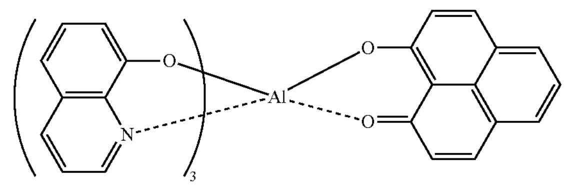

(108)

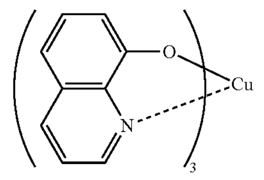

(109)

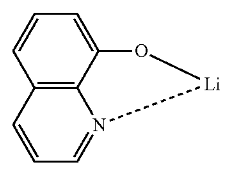

-continued (110)

(111)

(112)

(113)

(114)

(115)

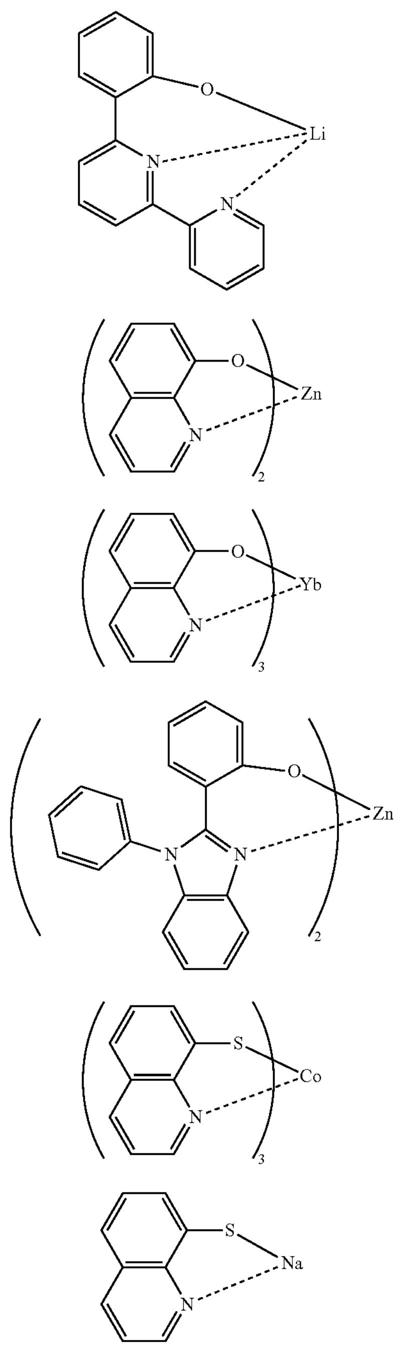

In particular, (8-quinolinolato)lithium (abbreviation: Liq) and tris(8-quinolinolato)aluminum (abbreviation: $Alq_3$), which are used conventionally and inexpensive, are easy to remove by means of water; these materials are highly preferred.

In general, Liq and $Alq_3$ are known to be hardly dissolved in water. However, it is found that Liq or $Alq_3$ formed into an evaporation film over the organic semiconductor layer can be easily removed by means of water and very suitably used as the mask layer for the organic semiconductor layer for removal of the aluminum oxide film. This finding cannot be reached from the technical knowledge that Liq and $Alq_3$ are not dissolved in water; the person skilled in the art cannot assume that removal by means of water is facilitated with a film containing the organometallic compound represented by General Formula (G1) or General Formula (G2), in particular, Liq or $Alq_3$, which is formed between the organic semiconductor layer and an aluminum oxide layer and used for the mask layer for the organic semiconductor for removal of the aluminum oxide film.

Formation of such a film containing the organometallic compound between the organic semiconductor layer and the aluminum oxide film facilitates removal of the aluminum oxide film while inhibiting the damage to the organic semiconductor layer and preventing the increase in voltage. As a result, an ultra-high-resolution device having favorable characteristics, which has gone through processing by a photolithography method, can be provided.

The structure in this embodiment can be used in an appropriate combination with the structures described in the other embodiments.

Embodiment 2

In this embodiment, a method for processing an organic semiconductor layer of one embodiment of the present invention is described with reference to FIG. 3 and FIG. 4.

Figure 3A:
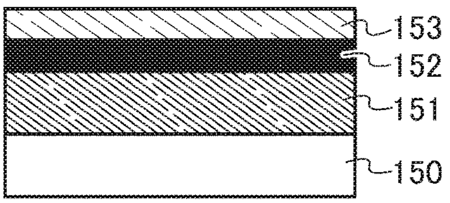
FIG. 3A to FIG. 3E are diagrams illustrating a method for processing a film.

First, the organic semiconductor film 151 is formed over a base film 150 (FIG. 3A). The base film may be either an insulating film or a conductive film depending on a device manufactured later. The organic semiconductor film 151 may be formed by a dry method such as an evaporation method or a wet method such as a spin coating method.

Next, the mask layer 152 containing the organometallic compound represented by General Formula (G1) or General Formula (G2) above is formed over the organic semiconductor film 151 (FIG. 3A). The mask layer 152 is preferably formed by a vacuum evaporation method.

Next, the aluminum oxide film 153 is formed over the mask layer 152 (FIG. 3A). The aluminum oxide film is preferably formed by a method that causes small damage to the organic semiconductor film 151, and is preferably formed by an ALD method.

Figure 3B:
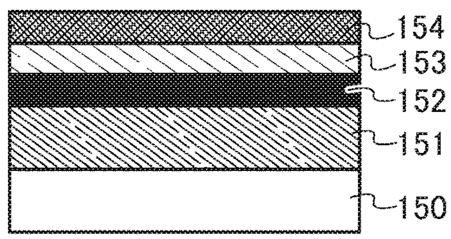

A metal film or metal compound film 154 is preferably formed over the aluminum oxide film 153 (FIG. 3B). Since the aluminum oxide film 153 can reduce damage to the organic semiconductor film 151, a formation method that causes relatively great damage to a formation surface, such as a sputtering method, can be selected for the formation of the metal film or metal compound film 154. Examples of a material forming the metal film or metal compound film 154 include silicon, silicon nitride, silicon oxide, tungsten, titanium, molybdenum, tantalum, tantalum nitride, an alloy containing molybdenum and niobium, or an alloy containing molybdenum and tungsten, and an indium gallium zinc oxide (also denoted as In—Ga—Zn oxide or IGZO). It is also possible to use indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Alternatively, indium tin oxide containing silicon, or the like can also be used.

Figure 3C:
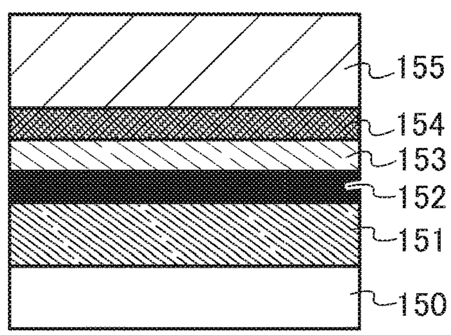
Figure 3D:
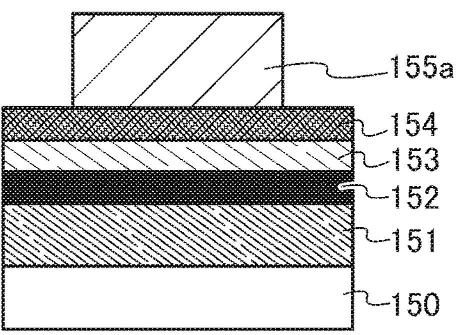

Then, a photosensitive resin is applied over the metal film or metal compound film 154 to form a resin film 155 (FIG. 3C). The photosensitive resin may be either a positive type resist or a negative type resist.

Figure 3E:
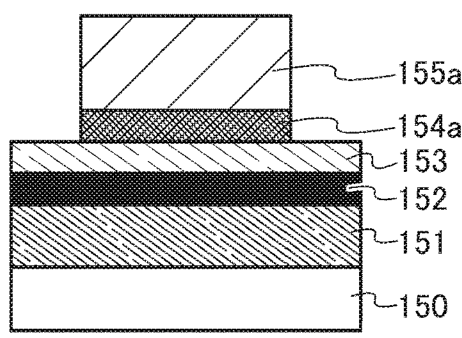

Next, a photomask layer 155*a* is formed by performing light exposure in accordance with the photosensitivity of the resin and performing development (FIG. 3D), and the metal film or metal compound film 154 is etched using the photomask layer 155*a* to form the metal layer or metal compound layer 154*a* is formed by etching (FIG. 3E). The metal film or the metal compound film 154 may be etched by either wet etching or dry etching. For the etching, a condition where the metal film or metal compound film 154 has a higher selectivity with respect to the aluminum oxide film 153 is preferably selected.

Figure 4A:
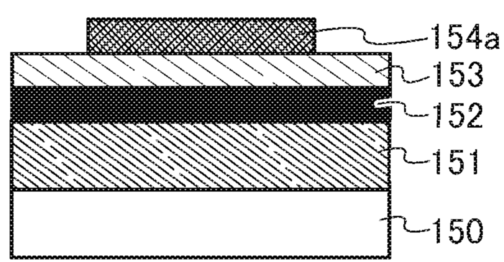
FIG. 4A to FIG. 4E is a diagram illustrating a method for processing a film.

After the metal layer or metal compound layer 154*a* is formed, the photomask layer 155*a* is removed (FIG. 4A). Owing to the metal film or metal compound film 154 and the aluminum oxide film 153, the organic semiconductor film 151 is prevented from being adversely affected, for example, being eliminated or being damaged, by treatment in forming and removing the photomask layer 155*a*, and thus, an organic semiconductor device having favorable characteristics can be manufactured.

Figure 4B:
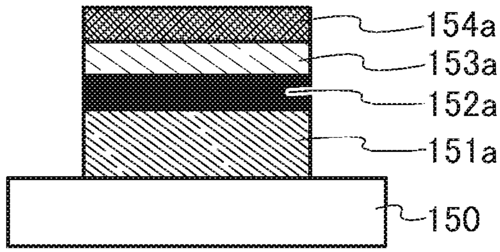

After that, the organic semiconductor layer 151*a*, the mask layer 152*a*, and the aluminum oxide layer 153*a* are formed by etching using the metal film or metal compound film 154*a* as a mask (FIG. 4B). This etching may be either wet etching or dry etching, but dry etching is preferable.

Figure 4C:
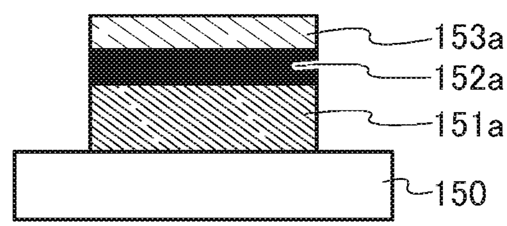

After the processing of the organic semiconductor layer 151*a* is completed, the metal layer or metal compound layer 154*a* is removed (FIG. 4C). The metal layer or metal compound layer 154*a* can be removed by either wet etching or dry etching, but dry etching is preferred. For the etching, a condition where the metal layer or metal compound layer 154*a* has a higher selectivity with respect to the aluminum oxide layer 153*a*.

Figure 4D:
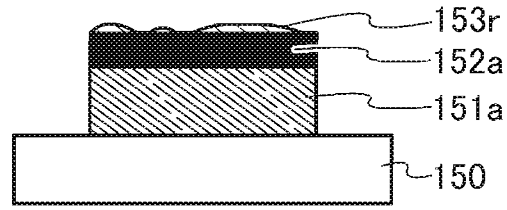
Figure 4E:
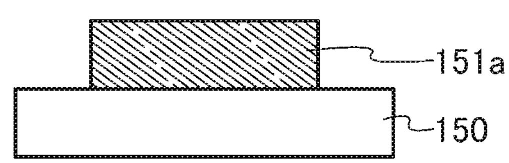

Lastly, the aluminum oxide layer 153*a* and the mask layer 152*a* are treated with water or a liquid containing water as a solvent to be removed at once (FIG. 4E). As the removing method, the aluminum oxide layer 153*a* and the mask layer 152*a* are immersed in water or the liquid containing water as a solvent for a predetermined time, and then showered with pure water. The metal layer or metal compound layer 154*a* and the mask layer 152*a* can be removed only in this step. The liquid used for the removal is preferably water because water causes less damage to the organic semiconductor layer 151*a*.

Note that after the metal layer or metal compound layer 154*a* is removed, the aluminum oxide layer 153*a* may be removed to some extent before the mask layer 152*a* is treated by means of water or a liquid containing water as a solvent (FIG. 4D). The aluminum oxide layer 153*a* is removed by etching. Although either wet etching or dry etching can be employed, wet etching using an alkaline solution or an acid solution is preferred, and wet etching using an alkaline solution is further preferred. The surface of the organic semiconductor layer 151*a* is prevented from being exposed to the alkaline solution or the acid solution owing to the mask layer 152*a*, whereby degradation of the characteristics can be prevented. Furthermore, treatment is performed such that the aluminum oxide film 153*r* remains over the mask layer 152*a* to some extent, whereby the next step of removing the mask layer 152*a* can be performed more smoothly.

The organic semiconductor layer 151*a* processed through the above steps has less processing damage, so that an organic semiconductor device can have favorable characteristics. Furthermore, the aluminum oxide films 153*r* are inhibited from remaining on the surface of the organic semiconductor layer 151*a*, whereby an increase in voltage of an organic semiconductor device manufactured later can be prevented.

Figure 5A:
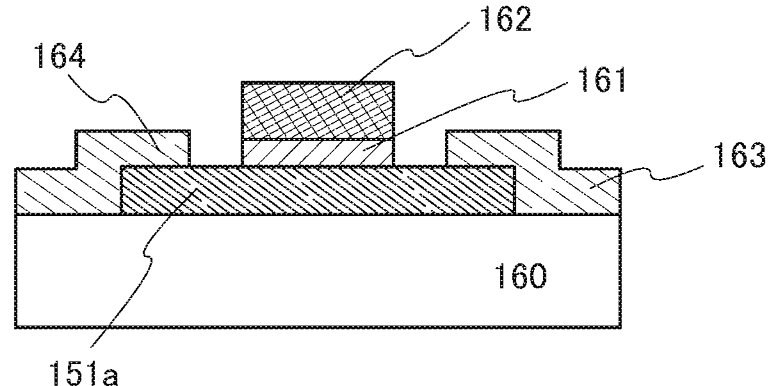
FIG. 5A to FIG. 5C are diagrams each illustrating an organic semiconductor device.
Figure 5B:
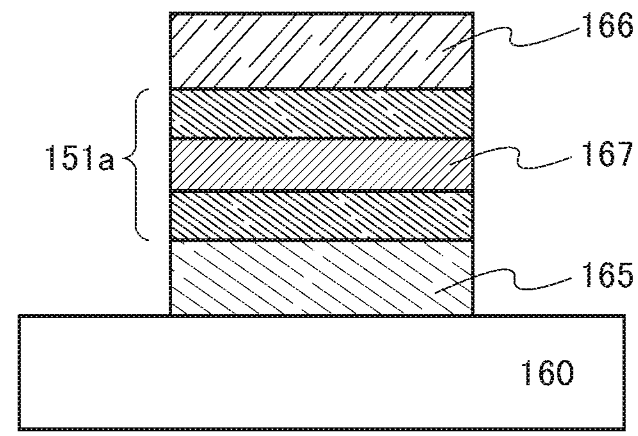
Figure 5C:
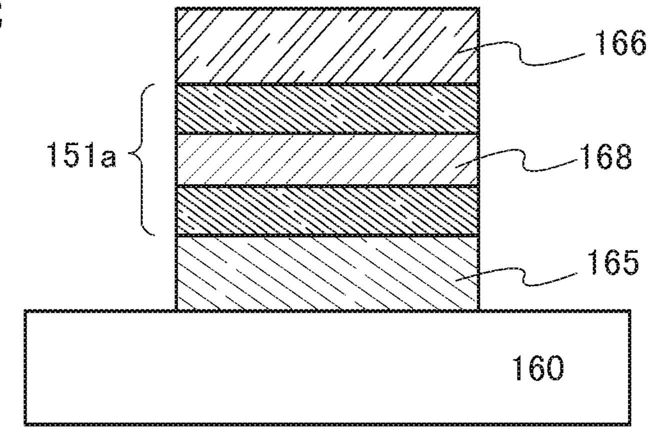

As illustrated in FIG. 5A, the organic semiconductor layer 151*a* can be used for an organic TFT including, over an insulating layer 160, the organic semiconductor layer 151*a*, a gate insulating layer 161, a gate electrode 162, a source and a drain electrode 163 and 164. As illustrated in FIG. 5B, the organic semiconductor layer 151*a* can be used for a photoelectric conversion device such as a solar cell or a photosensor, including, over the insulating layer 160, a first electrode 165, a second electrode 166, and a photoelectric conversion layer 167. As illustrated in FIG. 5C, the organic semiconductor layer 151*a* can be used for an organic EL device including, over the insulating layer 160, the first electrode 165, the second electrode 166, and a light-emitting layer 168.

The structure in this embodiment can be used in an appropriate combination with the structures described in the other embodiments.

Embodiment 3

Manufacturing Method Example

In this embodiment, an example of a method for manufacturing an organic semiconductor device of one embodiment of the present invention is described with reference to drawings. Here, description is made with use of a light-emitting apparatus 450 illustrated in FIG. 6 as an example. The light-emitting apparatus 450 includes an organic EL device in which the organic semiconductor layer in Embodiment 1 or Embodiment 2 is an EL layer. That is, a layer denoted as an EL layer below corresponds to the organic semiconductor layer. Note that when an organic semiconductor layer including a photoelectric conversion layer is used instead of the EL layer, it can be used as a photosensor. The light-emitting apparatus may include both the photosensor and the organic EL device.

FIG. 6A is a schematic top view of a light-emitting apparatus 450. The light-emitting apparatus 450 includes a plurality of organic EL devices 110B exhibiting blue, a plurality of organic EL devices 110G exhibiting green, and a plurality of organic EL devices 110R exhibiting red. In FIG. 6A, light-emitting regions of the organic EL devices are denoted by R, G, and B to easily differentiate the organic EL devices.

The organic EL devices 110B, the organic EL devices 110G, and the organic EL devices 110R are arranged in a matrix. FIG. 6A illustrates what is called stripe arrangement, in which the organic EL devices of the same color are arranged in one direction. Note that the arrangement method of the organic EL devices is not limited thereto; another arrangement method such as delta arrangement, zigzag arrangement, or PenTile arrangement may also be used.

The organic EL devices 110B, the organic EL devices 110G, and the organic EL devices 110R are arranged in the X direction. The organic EL devices of the same color are arranged in the Y direction intersecting with the X direction.

The organic EL device 110B, the organic EL device 110G, and the organic EL device 110R have the above-described structure.

FIG. 6B is a schematic cross-sectional view taken along the dashed-dotted line A1-A2 in FIG. 6A, and FIG. 6C is a schematic cross-sectional view taken along the dashed-dotted line B1-B2.

FIG. 6B illustrates cross sections of the organic EL device 110B, the organic EL device 110G, and the organic EL device 110R. The organic EL device 110B includes a first electrode (pixel electrode) 101B, a first EL layer 120B, a second EL layer 121, and a second electrode 102. The organic EL device 110G includes a first electrode (pixel electrode) 101G, a first EL layer 120G, the second EL layer (electron-injection layer) 121, and the second electrode 102. The organic EL device 110R includes a first electrode (pixel electrode) 101R, a first EL layer 120R, the second EL layer 121, and the second electrode (common electrode) 102. The second EL layer 121 and the second electrode 102 are provided to be shared by the organic EL device 110B, the organic EL device 110G, and the organic EL device 110R. The second EL layer 121 can also be referred to as a common layer. Note that a case where the first electrode 101 is an anode and the second electrode 102 is a cathode is described as an example in this embodiment.

The first EL layer 120B included in the organic EL device 110B contains at least a light-emitting organic compound that emits light with intensity in the blue wavelength range. The first EL layer 120G included in the organic EL device 110G contains at least a light-emitting organic compound that emits light with intensity in the green wavelength range. The first EL layer 120R included in the organic EL device 110R contains at least a light-emitting organic compound that emits light with intensity in the red wavelength range.

Each of the first EL layer 120B, the first EL layer 120G, and the first EL layer 120R includes at least a light-emitting layer, and may further include one or more of a hole-blocking layer, an electron-injection layer, an electron-transport layer, a hole-transport layer, a hole-injection layer, an electron-blocking layer, an exciton-blocking layer, and the like. The second EL layer 121 does not include the light-emitting layer. The second EL layer 121 is preferably the electron-injection layer. In the case where the second-electrode-side surfaces of the first EL layer 120B, the first EL layer 120G, and the first EL layer 120R also function as the electron-injection layers, the second EL layer 121 is not necessarily provided.

The first electrode (anode) 101B, the first electrode (anode) 101G, and the first electrode (anode) 101R are provided for the respective organic EL devices. The second electrode 102 and the second EL layer 121 are each preferably provided as a continuous layer shared by the organic EL devices.

A conductive film having a property of transmitting visible light is used for either the first electrodes 101 or the second electrode 102, and a conductive film having a reflective property is used for the other. When the first electrodes 101 have light-transmitting properties and the second electrode 102 has a reflective property, a bottom-emission display apparatus can be provided, whereas when the first electrodes have reflective properties and the second electrode 102 has a light-transmitting property, a top-emission display apparatus can be provided. Note that when both the first electrodes and the second electrode 102 have light-transmitting properties, a dual-emission display apparatus can be obtained. The organic EL device in this embodiment is suitable as a top-emission organic EL device.

The first EL layer 120B, the first EL layer 120G, and the first EL layer 120R are provided to cover end portions of the first electrode 101B, the first electrode 101G, and the first electrode 101R, respectively. The insulating layer 125 is provided to cover end portions of the first EL layer 120B, the first EL layer 120G, and the first EL layer 120R. In other words, the insulating layer 125 has opening portions overlapping with the first electrode 101B, the first electrode 101G, the first electrode 101R, the first EL layer 120B, the first EL layer 120G, and the first EL layer 120R. End portions of the insulating layer 125 in the opening portions are preferably tapered. Note that the end portions of the first electrode 101B, the first electrode 101G, and the first electrode 101R are not necessarily covered with the first EL layer 120B, the first EL layer 120G, and the first EL layer 120R, respectively.

The first EL layer 120B, the first EL layer 120G, and the first EL layer 120R include a region in contact with the top surfaces of the first electrode 101B, the first electrode 101G, and the first electrode 101R, respectively. The end portions of the first EL layer 120B, the first EL layer 120G, and the first EL layer 120R are positioned under the insulating layer 125. Each of the top surfaces of the first EL layer 120B, the first EL layer 120G, and the first EL layer 120R includes a region in contact with the insulating layer 125 and a region in contact with the second EL layer 121 (the second electrode 102 in the case where the second EL layer is not provided).

Figure 7:
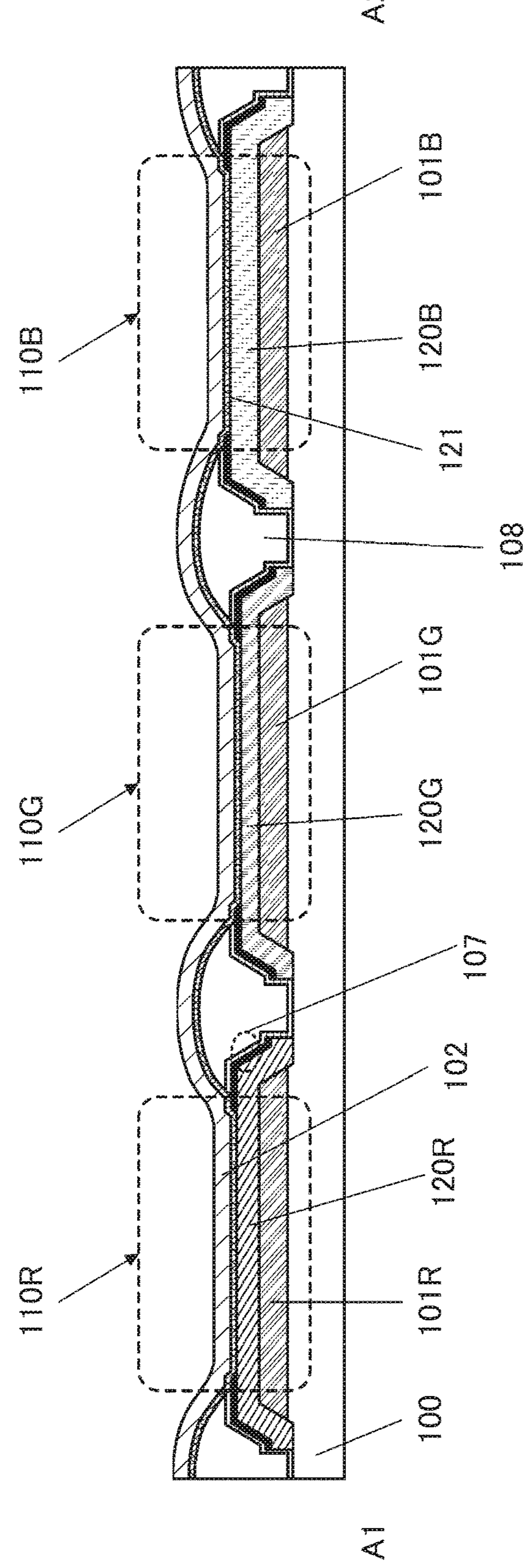
FIG. 7 is a diagram illustrating a light-emitting apparatus.

FIG. 7 is a modification example of FIG. 6B. In FIG. 7, the end portions of the first electrode 101B, the first electrode 101G, and the first electrode 101R have a tapered shape that extends toward the substrate, resulting in improvement in the coverage with a film formed thereover. In addition, the end portions of the first electrode 101B, the first electrode 101G, and the first electrode 101R are covered with the first EL layer 120B, the first EL layer 120G, and the first EL layer 120R, respectively. A mask layer 107 is formed to cover the EL layers. This inhibits the EL layers from being damaged at the time of etching by a photolithography method. An insulating layer 108 is provided between the organic EL device 110B and the organic EL device 110G, and between the organic EL device 110G and the organic EL device 110R. End portions of the insulating layers 108 have a gentle tapered shape, thereby suppressing disconnection of the second EL layer 121 and the second electrode 102 which are formed later.

As illustrated in FIG. 6B and FIG. 7, there is a gap between two EL layers of organic EL devices of different colors. In this manner, the first EL layer 120B, the first EL layer 120G, and the first EL layer 120R are preferably provided so as not to be in contact with each other. This effectively prevents unintentional light emission from being caused by current flowing through two adjacent EL layers. As a result, the contrast can be increased to achieve a display apparatus with high display quality. The distance between facing end portions of EL layers of adjacent organic EL devices (e.g., the organic EL device 110B and the organic EL device 110G) can be set greater than or equal to 2 μm and less than or equal to 5 μm by fabricating the organic EL devices by a photolithography method. Note that the distance can be rephrased as the distance between the light-emitting layers included in the EL layers. It is difficult to set the distance less than 10 μm by a formation method using a metal mask.

As described above, fabrication of the light-emitting apparatus by a photolithography method can greatly reduce the area of a non-light-emitting region that can exist between two organic EL devices, thereby significantly increasing the aperture ratio. For example, in the display apparatus of one embodiment of the present invention, the aperture ratio higher than or equal to 40%, higher than or equal to 50%, higher than or equal to 60%, higher than or equal to 70%, higher than or equal to 80%, or higher than or equal to 90% and lower than 100% can be achieved.

Note that increasing the aperture ratio of the display apparatus can improve the reliability of the display apparatus. Specifically, with reference to the lifetime of a display apparatus including an organic EL device and having an aperture ratio of 10%, a display apparatus having an aperture ratio of 20% (that is, two times the aperture ratio of the reference) has a lifetime approximately 3.25 times as long as that of the reference, and a display apparatus having an aperture ratio of 40% (that is, four times the aperture ratio of the reference) has a lifetime approximately 10.6 times as long as that of the reference. Thus, the density of current flowing to the organic EL device can be reduced with increasing aperture ratio, and accordingly the lifetime of the display apparatus can be increased. The display apparatus described in this embodiment can have a higher aperture ratio and thus can have higher display quality. Furthermore, an excellent effect that the reliability (especially the lifetime) of the display apparatus is significantly improved with increasing aperture ratio of the display apparatus can be produced.

FIG. 6C illustrates an example in which the EL layer 120R is divided for the organic EL devices in the Y direction. Note that FIG. 6C illustrates the cross sections of the organic EL devices 110R as an example; the organic EL device 110G and the organic EL device 110B can have a similar shape. Note that the EL layer may be continuous in the Y direction and the EL layer 120R may be formed in a belt-like shape. When the EL layer 120R and the like are formed in a belt-like shape, no space for dividing the layer is needed and thus the area of a non-light-emitting region between the organic EL devices can be reduced, resulting in a higher aperture ratio.

A barrier layer 131 is provided over the second electrode 102 to cover the organic EL device 110B, the organic EL device 110G, and the organic EL device 110R. The barrier layer 131 has a function of preventing diffusion of impurities that adversely affect the organic EL devices from above.

The barrier layer 131 can have, for example, a single-layer structure or a stacked-layer structure at least including an inorganic insulating film. Examples of the inorganic insulating film include oxide films and nitride films such as a silicon oxide film, a silicon oxynitride film, a silicon nitride oxide film, a silicon nitride film, an aluminum oxide film, an aluminum oxynitride film, and a hafnium oxide film. Alternatively, a semiconductor material such as indium gallium oxide or indium gallium zinc oxide may be used for the barrier layer 131.

As the barrier layer 131, a stacked-layer film of an inorganic insulating film and an organic insulating film can be used. For example, a structure in which an organic insulating film is interposed between a pair of inorganic insulating films is preferable. Furthermore, the organic insulating film preferably functions as a planarization film. Thus, the top surface of the organic insulating film can be flat, and accordingly, coverage with the inorganic insulating film thereover can be improved, resulting in an improvement in barrier properties. Moreover, the barrier layer 131 has a flat top surface, which is preferable because the influence of an uneven shape due to the lower structure can be reduced in the case where a component (e.g., a color filter, an electrode of a touch sensor, a lens array, or the like) is provided over the barrier layer 131.

FIG. 6A also illustrates a connection electrode 101C that is electrically connected to the second electrode 102. The connection electrode 101C is supplied with a potential (e.g., an anode potential or a cathode potential) that is to be supplied to the second electrode 102. The connection electrode 101C is provided outside a display region where the organic EL devices 110B and the like are arranged. In FIG. 6A, the second electrode 102 is denoted by a dashed line.

The connection electrode 101C can be provided along the outer periphery of the display region. For example, the connection electrode 101C may be provided along one side of the outer periphery of the display region or two or more sides of the outer periphery of the display region. That is, in the case where the display region has a rectangular top surface shape, the top surface shape of the connection electrode 101C can be a belt-like shape, an L shape, a U shape (a square bracket shape), a quadrangular shape, or the like.

FIG. 6D is a schematic cross-sectional view taken along the dashed-dotted line C1-C2 in FIG. 6A. FIG. 6D illustrates a connection portion 130 in which the connection electrode 101C is electrically connected to the second electrode 102. In the connection portion 130, the second electrode 102 is provided over and in contact with the connection electrode 101C and the barrier layer 131 is provided to cover the second electrode 102. In addition, the EL layer 121 is provided to cover end portions of the connection electrode 101C.

FIG. 8A to FIG. 9F are each a schematic cross-sectional view of a step in a method for fabricating the display apparatus 450 described above. In these views, the schematic cross-sectional views of the connection portion 130 and the periphery thereof are also illustrated on the right side.

Note that thin films included in the display apparatus (insulating films, semiconductor films, conductive films, and the like) can be formed by any of a sputtering method, a chemical vapor deposition (CVD) method, a vacuum evaporation method, a pulsed laser deposition (PLD) method, an atomic layer deposition (ALD) method, and the like. Examples of the CVD method include a plasma-enhanced chemical vapor deposition (PECVD) method and a thermal CVD method. An example of a thermal CVD method is a metal organic chemical vapor deposition (MOCVD) method.

Alternatively, thin films included in the display apparatus (insulating films, semiconductor films, conductive films, and the like) can be formed by a method such as spin coating, dipping, spray coating, ink jetting, dispensing, screen printing, offset printing, a doctor knife method, a slit coater, a roll coater, a curtain coater, or a knife coater.

Thin films included in the display apparatus can be processed by a photolithography method or the like.

There are two typical examples of photolithography methods. In one of the methods, a resist mask is formed over a thin film that is to be processed, the thin film is processed by etching or the like, and then the resist mask is removed. In the other method, a photosensitive thin film is formed and then the thin film is processed into a desired shape by performing light exposure and development.

As light used for light exposure in a photolithography method, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Light exposure may be performed by liquid immersion exposure technique. As the light used for light exposure, extreme ultraviolet (EUV) light or X-rays may also be used. Furthermore, instead of the light used for the light exposure, an electron beam can also be used. It is preferable to use extreme ultraviolet light, X-rays, or an electron beam because extremely minute processing can be performed. Note that a photomask is not needed when light exposure is performed by scanning with a beam such as an electron beam.

For etching of thin films, a dry etching method, a wet etching method, a sandblasting method, or the like can be used.

[Preparation for Substrate 100]

A substrate that has heat resistance high enough to withstand at least heat treatment performed later can be used as a substrate 100. When an insulating substrate is used as the substrate 100, a glass substrate, a quartz substrate, a sapphire substrate, a ceramic substrate, an organic resin substrate, or the like can be used. Alternatively, a semiconductor substrate such as a single crystal semiconductor substrate or a polycrystalline semiconductor substrate of silicon, silicon carbide, or the like; a compound semiconductor substrate of silicon germanium or the like; or an SOI substrate can be used.

As the substrate 100, it is particularly preferable to use the semiconductor substrate or the insulating substrate where a semiconductor circuit including a semiconductor element such as a transistor is formed. The semiconductor circuit preferably forms a pixel circuit, a gate line driver circuit (a gate driver), a source line driver circuit (a source driver), or the like. In addition to the above, an arithmetic circuit, a memory circuit, or the like may be formed.

[Formation of First Electrodes 101B, 101G, and 101R and Connection Electrode 101C]

Next, the first electrode 101B, the first electrode 101G, the first electrode 101R, and the connection electrode 101C are formed over the substrate 100. First, a conductive film to be the pixel electrodes (first electrodes) is formed, a resist mask is formed by a photolithography method, and an unnecessary portion of the conductive film is removed by etching. After that, the resist mask is removed to form the first electrode 101B, the first electrode 101G, and the first electrode 101R.

In the case where a conductive film with a property of reflecting visible light is used as each pixel electrode, it is preferable to use a material (e.g., silver or aluminum) having reflectance as high as possible in the whole wavelength range of visible light. This can increase color reproducibility as well as light extraction efficiency of the organic EL devices. In the case where a conductive film with a property of reflecting visible light is used as each pixel electrode, what is called a top-emission light-emitting apparatus in which light is extracted in the direction opposite to the substrate can be obtained. In the case where a conductive film with a light-transmitting property is used as each pixel electrode, what is called a bottom-emission light-emitting apparatus in which light is extracted in the direction of the substrate can be obtained.

[Formation of EL Film 120Bb]

Subsequently, an EL film 120Bb to be the EL layer 120B later is formed over the first electrode 101B, the first electrode 101G, and the first electrode 101R.

The EL film 120Bb includes at least a light-emitting layer containing a light-emitting material. It is also possible to employ a structure in which one or more films functioning as an electron-injection layer, an electron-transport layer, a charge-generation layer, a hole-transport layer, and a hole-injection layer are stacked in addition to the above. The EL film 120Bb can be formed by, for example, an evaporation method, a sputtering method, an ink-jet method, or the like. Note that without limitation to this, a known film formation method can be used as appropriate.

For example, the EL film 120Bb is preferably a stacked-layer film in which a hole-injection layer, a hole-transport layer, a light-emitting layer, and an electron-transport layer are stacked in this order. In that case, a film including an electron-injection layer can be used as the EL layer 121 formed later.

The EL film 120Bb is preferably formed so as not to be provided over the connection electrode 101C. For example, in the case where the EL film 120Bb is formed by an evaporation method (or a sputtering method), it is preferable that the EL film 120Bb be formed using a shielding mask or be removed in a later etching step so as not to be formed over the connection electrode 101C.

[Formation of Mask Film 148*a*]

Next, a mask film 148*a* is formed to cover the EL film 120Bb. It is preferable that the mask film 148*a* be formed using a shielding mask or be removed in a later etching step so as not to be formed over the connection electrode 101C.

The mask film 148*a* is formed with the organometallic compound represented by General Formula (G1) or General Formula (G2) described in Embodiment 1. This organometallic compound is extremely suitable as a material of the mask film 148*a* that is formed to protect the EL film 120Bb and facilitate the removal of an aluminum oxide film formed later. When the organometallic compound is used as a material of the mask film 148*a*, the aluminum oxide film to be formed later or the residue thereof (left in the etching process) can be removed easily by means of water or a liquid containing water as a solvent. Consequently, an increase in voltage of the organic EL device can be prevented. Furthermore, degradation of the characteristics of the organic EL device can be prevented.

[Formation of Aluminum Oxide Film 144*a*]

Then, an aluminum oxide film 144*a* is formed to cover the mask film 148*a*. It preferable that the aluminum oxide film 144*a* be formed using a shielding mask or be removed in a later etching step so as not to be formed over the connection electrode 101C.

As the aluminum oxide film 144*a*, it is possible to use a film highly resistant to etching treatment performed on EL films such as the EL film 120Bb, i.e., a film having high etching selectivity. Furthermore, as the aluminum oxide film 144*a*, it is possible to use a film having high etching selectivity with respect to a protective film such as a metal film or metal compound film 146*a* described later. Moreover, as the aluminum oxide film 144*a*, it is possible to use a film that can be removed by a wet etching method causing less damage to the EL films.

The aluminum oxide film 144*a* can be formed by any of a variety of film formation methods such as a sputtering method, an evaporation method, a CVD method, and an ALD method. An ALD method is preferred because it enables formation of a dense film having a high barrier property against an atmospheric component such as oxygen or water, or liquid such as water.

[Formation of Metal Film or Metal Compound Film 146*a*]

Figures 8A, 8B, 8C, 8D, 8E, 8F:
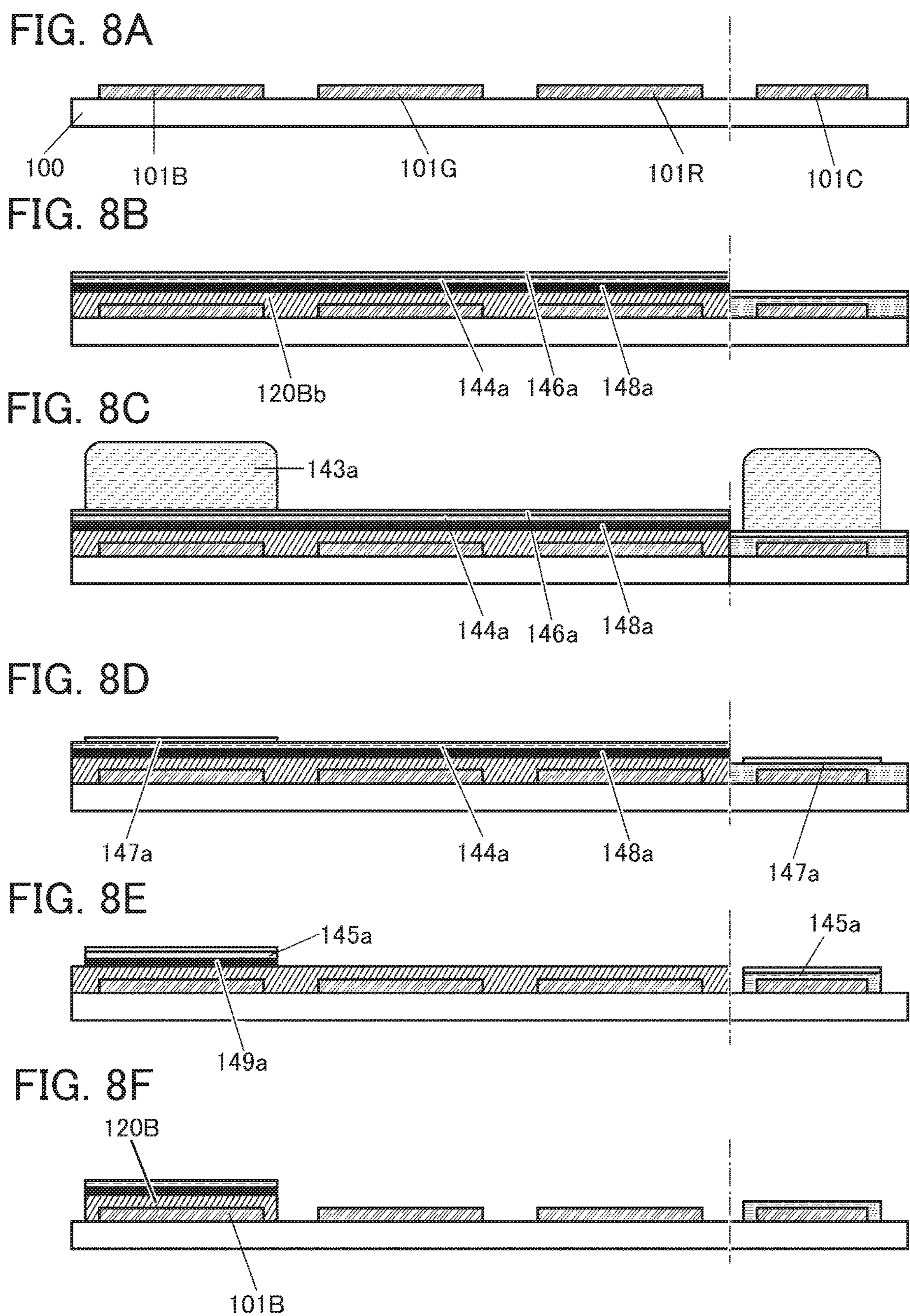
FIG. 8A to FIG. 8F are diagrams illustrating a method for manufacturing organic EL devices and a light-emitting apparatus.

Next, the metal film or metal compound film 146*a* is formed over the aluminum oxide film 144*a* (FIG. 8B).

The metal film or metal compound film 146*a* is a film used as a hard mask when the aluminum oxide film 144*a* is etched later. In a later step of processing the metal film or metal compound film 146*a*, the aluminum oxide film 144*a* is exposed. Thus, the combination of films having high etching selectivity therebetween is selected for the aluminum oxide film 144*a* and the metal film or metal compound film 146*a*. It is thus possible to select a film that can be used for the metal film or metal compound film 146*a* depending on an etching condition of the aluminum oxide film 144*a* and an etching condition of the metal film or metal compound film 146*a*.

For example, in the case where dry etching using a gas containing fluorine (also referred to as a fluorine-based gas) is performed for the etching of the metal film or metal compound film 146*a*, the metal film or metal compound film 146*a* can be formed using silicon, silicon nitride, silicon oxide, tungsten, titanium, molybdenum, tantalum, tantalum nitride, an alloy containing molybdenum and niobium, an alloy containing molybdenum and tungsten, or the like. Here, a metal oxide film is given as a film having high etching selectivity (that is, enabling low etching rate) in dry etching using the fluorine-based gas.

As a metal oxide, a metal oxide such as indium gallium zinc oxide (In—Ga—Zn oxide, also referred to as IGZO) can be used. It is also possible to use indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Alternatively, indium tin oxide containing silicon, or the like can also be used.

Note that a metal oxide using an element M (M is one or more kinds selected from aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium), instead of gallium described above, may be used. In particular, M is preferably one or more kinds selected from gallium, aluminum, and yttrium.

Note that without being limited to the above, a material of the metal film or metal compound film 146*a* can be selected from a variety of materials depending on the etching condition of the aluminum oxide film 144*a* and the etching condition of the metal film or metal compound film 146*a*. For example, any of the films that can be used for the aluminum oxide film 144*a* can be selected.

As the metal film or metal compound film 146*a*, a nitride film can be used, for example. Specifically, it is possible to use a nitride such as silicon nitride, aluminum nitride, hafnium nitride, titanium nitride, tantalum nitride, tungsten nitride, gallium nitride, or germanium nitride.

As the metal film or metal compound film 146*a*, an oxide film can also be used. Typically, it is possible to use an oxide film or an oxynitride film such as silicon oxide, silicon oxynitride, aluminum oxynitride, hafnium oxide, or hafnium oxynitride.

As the metal film or metal compound film 146*a*, an organic film that can be used for the EL film 120B or the like can be used. For example, the organic film that is used as the EL film 120B, an EL film 120G, or an EL film 120R can be used as the metal film or metal compound film 146*a*. The use of such an organic film is preferable, in which case the film formation apparatus for the EL film 120Bb or the like can be used in common.

[Formation of Resist Mask 143*a*]

Then, a resist mask 143*a* is formed in a position being over the metal film or metal compound film 146*a* and overlapping with the first electrode 101E and a position being over the metal film or metal compound film 146*a* and overlapping with the connection electrode 101C (FIG. 8C).

For the resist mask 143*a*, a resist material containing a photosensitive resin such as a positive type resist material or a negative type resist material can be used.

In the case where the resist mask 143*a* is formed over the aluminum oxide film 144*a* without the metal film or metal compound film 146*a* therebetween, there is a risk of dissolving the EL film 120Bb due to a solvent of the resist material if a defect such as a pinhole exists in the aluminum oxide film 144*a*. Such a defect can be prevented by using the metal film or metal compound film 146*a*.

In the case where a film that is unlikely to cause a defect such as a pinhole is used as the aluminum oxide film 144*a*, the resist mask 143*a* may be formed directly on the aluminum oxide film 144*a* without the metal film or metal compound film 146*a* therebetween.

[Etching of Metal Film or Metal Compound Film 146*a*]

Next, part of the metal film or metal compound film 146*a* that is not covered with the resist mask 143*a* is removed by etching, so that a belt-shaped or island-shaped metal layer or metal compound layer 147*a* is formed. At that time, the metal layer or metal compound layer 147*a* is formed also over the connection electrode 101C.

In the etching of the metal film or metal compound film 146*a*, an etching condition with high selectivity is preferably employed so that the aluminum oxide film 144*a* is not removed by the etching. Either wet etching or dry etching can be performed as the etching of the metal film or metal compound film 146*a*; a reduction in a pattern of the metal film or metal compound film 146*a* can be inhibited with use of dry etching.

[Removal of Resist Mask 143*a*]

Next, the resist mask 143*a* is removed (FIG. 8D).

The removal of the resist mask 143*a* can be performed by wet etching or dry etching. It is particularly preferable to perform dry etching (also referred to as plasma ashing) using an oxygen gas as an etching gas to remove the resist mask 143*a*.

At this time, the removal of the resist mask 143*a* is performed in a state where the EL film 120Bb is covered with the aluminum oxide film 144*a*; thus, the EL film 120Bb is less likely to be affected by the removal. This is particularly suitable in the case where etching using an oxygen gas, such as plasma ashing, is performed because the electrical characteristics might be adversely affected when the EL film 120Bb is exposed to oxygen.

[Etching of Aluminum Oxide Film 144*a*]

Next, part of the aluminum oxide film 144*a* that is not covered with the metal layer or metal compound layer 147*a* is removed by etching with use of the metal layer or metal compound layer 147*a* as a mask, so that a belt-shaped aluminum oxide layer 145*a* and mask layer 149*a* is formed (FIG. 8E). At that time, the aluminum oxide layer 145*a* is formed also over the connection electrode 101C.

Either wet etching or dry etching can be performed for the etching of the aluminum oxide film 144*a*; the use of a dry etching method is preferable, in which case shrinkage of the pattern can be inhibited.

[Etching of EL Film 120Bb and Metal Layer or Metal Compound Layer 147*a*]

Next, part of the EL film 120Bb that is not covered with the aluminum oxide layer 145*a* is removed by etching at the same time as etching of the metal layer or metal compound layer 147*a*, whereby the belt-shaped EL layer 120B is formed (FIG. 8F). At that time, the metal layer or metal compound layer 147*a* over the connection electrode 101C is also removed.

The EL film 120Bb and the metal layer or metal compound layer 147*a* are preferably etched by the same treatment so that the process can be simplified to reduce the fabrication cost of the display apparatus.

For the etching of the EL film 120Bb, it is particularly preferable to perform dry etching using an etching gas that does not contain oxygen as its main component. This can inhibit a change in the quality of the EL film 120Bb to achieve a highly reliable display apparatus. Examples of the etching gas that does not contain oxygen as its main component include $CF_4$, $C_4F_8$, $SF_6$, $CHF_3$, $Cl_2$, $H_2O$, $BCl_3$, $H_2$, and a noble gas such as He. Alternatively, a mixed gas of the above gas and a dilution gas that does not contain oxygen can be used as the etching gas.

Note that the etching of the EL film 120Bb and the etching of the metal layer or metal compound layer 147*a* may be performed separately. In that case, either the etching of the EL film 120Bb or the etching of the metal layer or metal compound layer 147*a* may be performed first.

At this step, the EL layer 120B and the connection electrode 101C are covered with the aluminum oxide layer 145*a*.

[Formation of EL Layer 120G and EL Layer 120R]

Figure 9A:
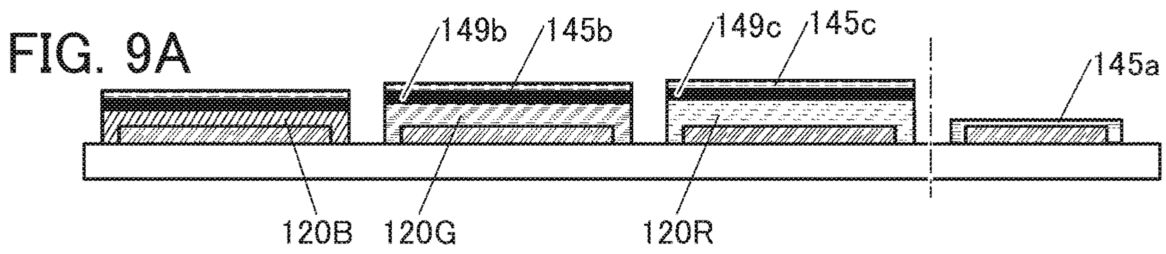
FIG. 9A to FIG. 9F are diagrams illustrating a method for manufacturing organic EL devices and a light-emitting apparatus.

By repeating similar steps, the island-shaped EL layer 120G, the island-shaped EL layer 120R, and island-shaped mask layers 145*b* and 145*c* can be formed (FIG. 9A).

[Formation of Insulating Layer 126*b*]

Figure 9B:
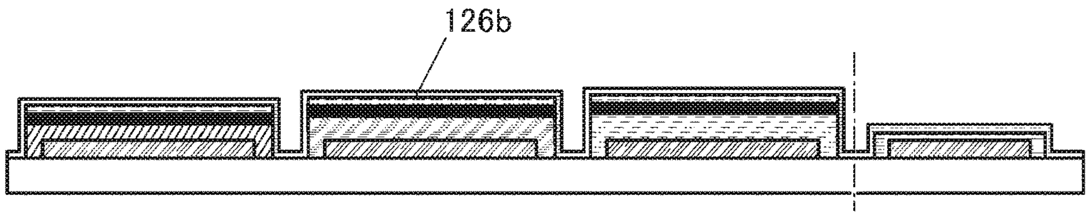

Next, an insulating layer 126*b* is formed over the aluminum oxide layer 145*a*, the aluminum oxide layer 145*b*, and the aluminum oxide layer 145*c* (FIG. 9B). The insulating layer 126*b* can be formed in a manner similar to that of the aluminum oxide layer 145*a*, the aluminum oxide layer 145*b*, and the aluminum oxide layer 145*c*.

[Formation of Insulating Layer 125*b*]

Figure 9C:
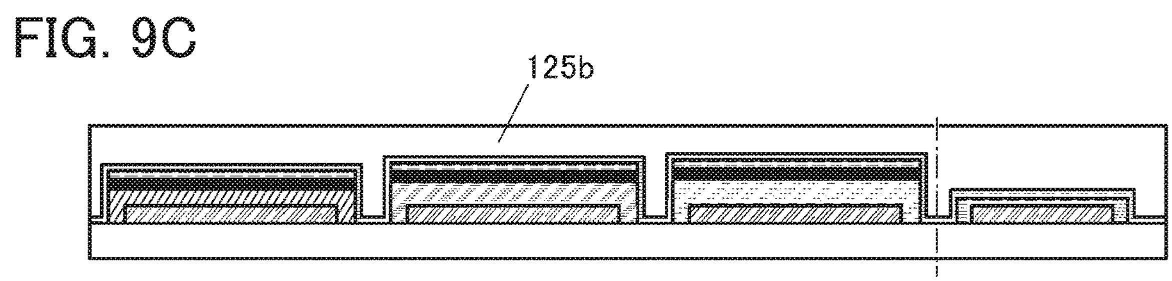

Then, an insulating layer 125*b* is formed to cover the insulating layer 126*b* (FIG. 9C). The insulating layer 125*b* is formed using a photosensitive organic resin. As the organic material, for example, an acrylic resin, a polyimide resin, an epoxy resin, an imide resin, a polyamide resin, a polyimide-amide resin, a silicone resin, a siloxane resin, a benzocyclobutene-based resin, a phenol resin, precursors of these resins, or the like can be used. Alternatively, an organic material such as polyvinyl alcohol (PVA), polyvinyl butyral, polyvinyl pyrrolidone, polyethylene glycol, polyglycerin, pullulan, water-soluble cellulose, or an alcohol-soluble polyamide resin can be used for the insulating layer 125*b* in some cases. As the photosensitive resin, a photoresist can be used in some cases. As the photosensitive resin, a positive photosensitive material or a negative photosensitive material can be used in some cases.

The insulating layer 125*b* is preferably subjected to heat treatment after application. The heat treatment is performed at a temperature lower than the upper temperature limit of the EL layers. The substrate temperature at the time of the heat treatment is higher than or equal to 50° C. and lower than or equal to 200° C., preferably higher than or equal to 60° C. and lower than or equal to 150° C., further preferably higher than or equal to 70° C. and lower than or equal to 120° C. Accordingly, a solvent contained in the insulating layer 125*b* can be removed.

Figure 9D:
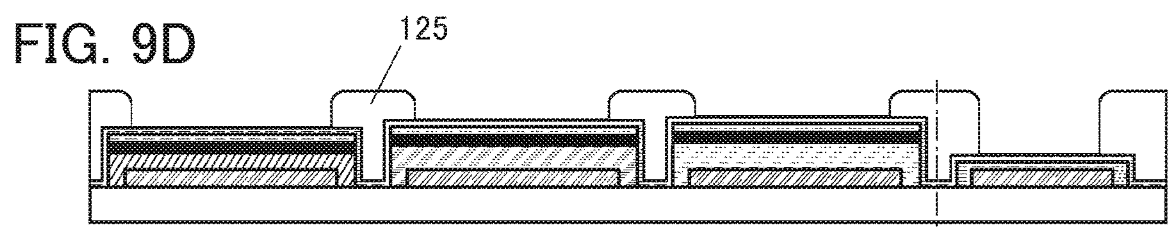

Next, the opening portions are formed in regions of the insulating layer 125*b* that overlap with the first electrodes and the first EL layers by performing light exposure and development, and the insulating layer 125 is formed (FIG. 9D). In the case where a positive acrylic resin is used for the insulating layer 125*b*, a region where the insulating layer 125*b* is removed is irradiated with visible light or ultraviolet rays using a mask.

In the case where visible light is used for light exposure, the visible light preferably includes the i-line (with a wavelength of 365 nm). Furthermore, visible light including the g-line (with a wavelength of 436 nm), the h-line (with a wavelength of 405 nm), or the like may be used.

In the case where an acrylic resin is used for the insulating layer 125*b*, an alkaline solution is preferably used as a developer in development, and for example, an aqueous solution of tetramethyl ammonium hydroxide (TMAH) is used.

Then, light exposure is preferably performed on the entire substrate so that the insulating layer 125 is irradiated with visible light or ultraviolet rays. The energy density for the light exposure is higher than 0 mJ/cm$^2$ and lower than or equal to 800 mJ/cm$^2$, preferably higher than 0 mJ/cm$^2$ and lower than or equal to 500 mJ/cm$^2$. Performing such light exposure after development can improve the transparency of the insulating layer 125 in some cases. In addition, it is sometimes possible to lower the substrate temperature required for subsequent heat treatment for changing the end portions of the insulating layer 125 into a tapered shape.

Next, the heat treatment is performed so that the insulating layer 125*b* can be changed into the insulating layer 125 having a taper-shaped side surface. The heat treatment is performed at a temperature lower than the upper temperature limit of the EL layers. The substrate temperature at the time of the heat treatment is higher than or equal to 50° C. and lower than or equal to 200° C., preferably higher than or equal to 60° C. and lower than or equal to 150° C., further preferably higher than or equal to 70° C. and lower than or equal to 130° C. The substrate temperature in the heat treatment of this step is preferably higher than that in the heat treatment after the application of the insulating layer 125. Accordingly, corrosion resistance of the insulating layer 125 can also be improved.

Figure 9E:
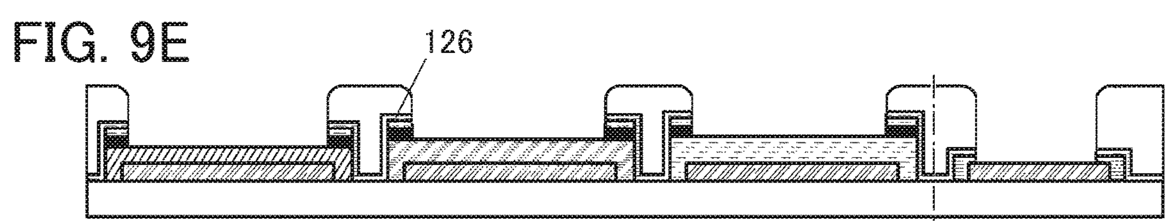

Next, exposed portions of the aluminum oxide layer 145*a*, the aluminum oxide layer 145*b*, and the aluminum oxide layer 145*c*, together with the mask layer 149*a*, a mask layer 149*b*, and a mask layer 149*c*, are removed by means of water or a liquid containing water as a solvent (FIG. 9E).

The removal by means of water or a liquid containing water as a solvent was performed by immersion in water or a liquid containing water as a solvent. Washing with a pure-water shower may be performed after that. By this treatment, the aluminum oxide layers, together with the mask layers, can be removed.

Note that it is preferable that the aluminum oxide layer 145*a*, the aluminum oxide layer 145*b*, and the aluminum oxide layer 145*c* be removed to some extent by wet etching or dry etching before the treatment with water or a liquid containing water as a solvent. At this time, not only does the mask layer exist over the EL layer, but also the aluminum oxide layer 145*a*, the aluminum oxide layer 145*b*, and the aluminum oxide layer 145*c* are not necessarily removed completely. Thus, the EL layer is hardly damaged by the removal of the aluminum oxide layer 145*a*, the aluminum oxide layer 145*b*, and the aluminum oxide layer 145*c*.

Note that in that case, a wet etching method is preferably used. For example, wet etching using an aqueous solution of tetramethyl ammonium hydroxide (TMAH), diluted hydrofluoric acid, oxalic acid, phosphoric acid, acetic acid, nitric acid, or a mixed solution thereof is preferably performed.

Alternatively, the aluminum oxide layer 145*a*, the aluminum oxide layer 145*b*, and the aluminum oxide layer 145*c* are preferably removed by being dissolved in a solvent such as water or alcohol. Examples of the alcohol in which the aluminum oxide layer 145*a*, the aluminum oxide layer 145*b*, and the aluminum oxide layer 145*c* can be dissolved include ethyl alcohol, methyl alcohol, isopropyl alcohol (IPA), and glycerin.

After the aluminum oxide layer 145*a*, the aluminum oxide layer 145*b*, the aluminum oxide layer 145*c*, the mask layer 149*a*, the mask layer 149*b*, and the mask layer 149*c* are removed, drying treatment is preferably performed in order to remove water contained in the EL layer 120B, the EL layer 120G, and the EL layer 120R and water adsorbed on the surfaces of the EL layer 120B, the EL layer 120G, and the EL layer 120R. For example, heat treatment is preferably performed in an inert gas atmosphere or a reduced-pressure atmosphere. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 120° C. Employing a reduced-pressure atmosphere is preferable, in which case drying at a lower temperature is possible.

In the above manner, the EL layer 120B, the EL layer 120G, and the EL layer 120R can be separately formed.

[Formation of EL Layer 121]

Then, the EL layer 121 is formed to cover the EL layer 120R, the EL layer 120G, the EL layer 120B, and the insulating layer 125.

The EL layer 121 can be formed in a manner similar to that for the EL film 120Bb or the like. In the case where the EL layer 121 is formed by an evaporation method, the EL layer 121 is preferably formed using a shielding mask so as not to be formed over the connection electrode 101C.

[Formation of Second Electrode 102]

Figure 9F:
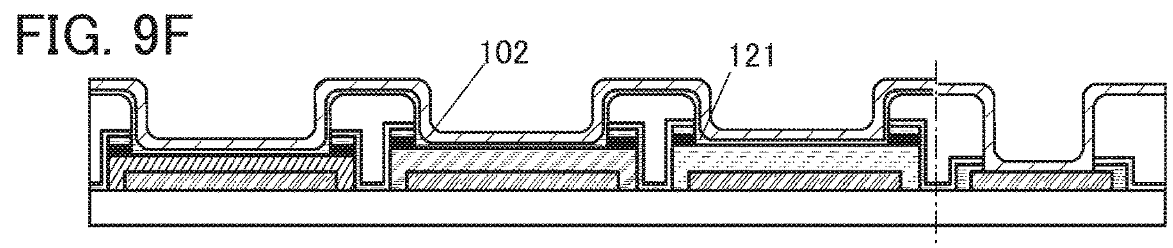

Then, the second electrode 102 is formed to cover the EL layer 121 and the connection electrode 101C (FIG. 9F).

The second electrode 102 can be formed by a film formation method such as an evaporation method or a sputtering method. Alternatively, a film formed by an evaporation method and a film formed by a sputtering method may be stacked. In that case, the second electrode 102 is preferably formed so as to cover a region where the electron-injection layer 115 is formed. That is, a structure in which an end portion of the electron-injection layer 115 overlaps with the second electrode 102 can be obtained. The second electrode 102 is preferably formed using a shielding mask.

The second electrode 102 is electrically connected to the connection electrode 101C outside a display region.

[Formation of Barrier Layer]

Then, a barrier layer is formed over the second electrode 102. An inorganic insulating film used for the barrier layer is preferably formed by a sputtering method, a PECVD method, or an ALD method. In particular, an ALD method is preferable because it provides excellent step coverage and is less likely to cause a defect such as a pinhole. An organic insulating film is preferably formed by an ink jet method because a uniform film can be formed in a desired area.

Through the above steps, the light-emitting apparatus can be manufactured.

Although the case where the second electrode 102 and the second EL layer 121 are formed to have different top surface shapes is described above, they may be formed in the same region.

The structure of this embodiment can be used in combination with any of the other structures as appropriate.

Embodiment 4

Figure 10:
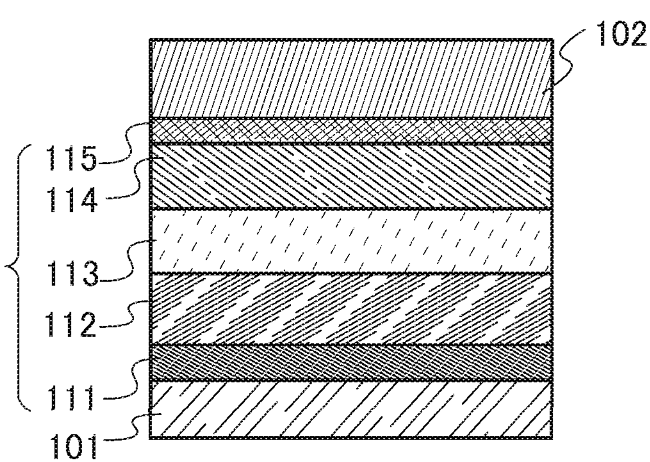
FIG. 10 is a diagram illustrating an organic EL device.

In this embodiment, a structure of an organic EL device, which is an organic oxide semiconductor device including an EL layer as an organic semiconductor layer, is described with reference to FIG. 10. The organic EL device is an organic oxide semiconductor device that includes an EL layer including a light-emitting layer between the first electrode 101 and the second electrode 102.

Note that one of the first electrode 101 and the second electrode 102 functions as an anode, and the other functions as a cathode. A case where the first electrode 101 is an anode is illustrated as an example in FIG. 10.

The anode is preferably formed using any of metals, alloys, and conductive compounds with a high work function (specifically, higher than or equal to 4.0 eV), mixtures thereof, and the like. Specific examples include indium oxide-tin oxide (ITO: Indium Tin Oxide), indium oxide-tin oxide containing silicon or silicon oxide, indium oxide-zinc oxide, and indium oxide containing tungsten oxide and zinc oxide (IWZO). Such conductive metal oxide films are usually formed by a sputtering method, but may be formed by application of a sol-gel method or the like. In an example of the formation method, indium oxide-zinc oxide is formed by a sputtering method using a target obtained by adding 1 to 20 wt % of zinc oxide to indium oxide. Furthermore, a film of indium oxide containing tungsten oxide and zinc oxide (IWZO) can be formed by a sputtering method using a target in which tungsten oxide and zinc oxide are added to indium oxide at 0.5 to 5 wt % and 0.1 to 1 wt %, respectively. Other examples of the material used for the anode include gold (Au), platinum (Pt), nickel (Ni), tungsten (W), chromium (Cr), molybdenum (Mo), iron (Fe), cobalt (Co), copper (Cu), palladium (Pd), and nitride of a metal material (e.g., titanium nitride). Graphene can also be used for the anode. Note that when a composite material described later is used for a layer that is in contact with the anode in the EL layer 103, an electrode material can be selected regardless of its work function.

Although the EL layer 103 preferably has a stacked-layer structure, there is no particular limitation on the stacked-layer structure, and any of various layer structures such as a hole-injection layer, a hole-transport layer, a light-emitting layer, an electron-transport layer, an electron-injection layer, a carrier-blocking layer (a hole-blocking layer and an electron-blocking layer), an exciton-blocking layer, and a charge-generation layer can be employed. Note that one or more of the above layers are not necessarily provided. In this embodiment, a structure including the hole-injection layer 111, the hole-transport layer 112, the light-emitting layer 113, the electron-transport layer 114, and the electron-injection layer 115 as illustrated in FIG. 10 is specifically described below.

The hole-injection layer 111 contains a substance having an acceptor property. Either an organic compound or an inorganic compound can be used as the substance having an acceptor property.

As the substance having an acceptor property, it is possible to use a compound having an electron-withdrawing group (a halogen group or a cyano group); for example, 7,7,8,8-tetracyano-2,3,5,6-tetrafluoroquinodimethane (abbreviation: $F_4$-TCNQ), chloranil, 2,3,6,7,10,11-hexacyano-1,4,5,8,9,12-hexaazatriphenylene (abbreviation: HAT-CN), 1,3,4,5,7,8-hexafluorotetracyano-naphthoquinodimethane (abbreviation: F6-TCNNQ), or 2-(7-dicyanomethylene-1,3,4,5,6,8,9,10-octafluoro-7H-pyren-2-ylidene)malononitrile can be used. A compound in which electron-withdrawing groups are bonded to a condensed aromatic ring having a plurality of heteroatoms, such as HAT-CN, is particularly preferable because it is thermally stable. A [3]radialene derivative having an electron-withdrawing group (in particular, a cyano group or a halogen group such as a fluoro group) has a very high electron-accepting property and thus is preferable. Specific examples include α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], and α,α',α"-1,2,3-cyclopropanetriylidenetris[2,3,4,5,6-pentafluorobenzeneacetonitrile]. As the substance having an acceptor property, molybdenum oxide, vanadium oxide, ruthenium oxide, tungsten oxide, manganese oxide, or the like can be used, other than the above-described organic compounds. Alternatively, the hole-injection layer 111 can be formed using phthalocyanine (abbreviation: $H_2Pc$), a phthalocyanine-based complex compound such as copper phthalocyanine (CuPc), an aromatic amine compound such as 4,4'-bis[N-(4-diphenylaminophenyl)-N-phenylamino]biphenyl (abbreviation: DPAB) or N,N'-bis{4-[bis(3-methylphenyl)amino]phenyl}-N,N'-diphenyl-(1,1'-biphenyl)-4,4'-diamine (abbreviation: DNTPD), or a high molecule such as poly(3,4-ethylenedioxythiophene)/poly(styrenesulfonic acid) (PEDOT/PSS). The substance having an acceptor property can extract electrons from an adjacent hole-transport layer (or hole-transport material) by application of an electric field.

Among substances having an acceptor property, an organic compound having an acceptor property is easy to use because it is easily deposited by vapor deposition.

Alternatively, a composite material in which a hole-transport material contains the above-described substance having an acceptor property can be used for the hole-injection layer 111. By using a composite material in which a hole-transport material contains a substance having an acceptor property, a material used to form an electrode can be selected regardless of its work function. That is, besides a material having a high work function, a material having a low work function can also be used for the anode.

As the hole-transport material used for the composite material, any of a variety of organic compounds such as aromatic amine compounds, carbazole derivatives, aromatic hydrocarbons, and high molecular compounds (e.g., oligomers, dendrimers, and polymers) can be used. Note that the hole-transport material used for the composite material preferably has a hole mobility higher than or equal to $1\times10^{-6}$ $cm^2/Vs$. Organic compounds that can be used as the hole-transport material for the composite material are specifically described below.

Examples of the aromatic amine compound that can be used for the composite material include N,N'-di(p-tolyl)-N,N'-diphenyl p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), and 1,3,5-tris[N-(4-diphenylaminophenyl)-N-phenylamino]benzene (abbreviation: DPA3B). Specific examples of the carbazole derivative include 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthracenyl)phenyl]-9H-carbazole (abbreviation: CzPA), and 1,4-bis[4-(N-carbazolyl)phenyl]-2,3,5,6-tetraphenylbenzene.

Examples of the aromatic hydrocarbon include 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, and 2,5,8,11-tetra(tert-butyl)perylene. Other examples include pentacene and coronene. The aromatic hydrocarbon may have a vinyl skeleton. Examples of the aromatic hydrocarbon having a vinyl group include 4,4'-bis(2,2-diphenylvinyl)biphenyl (abbreviation: DPVBi) and 9,10-bis[4-(2,2-diphenylvinyl)phenyl]anthracene (abbreviation: DPVPA). Note that the organic compound of one embodiment of the present invention can also be used.

A high molecular compound such as poly(N-vinylcarbazole) (abbreviation: PVK), poly(4-vinyltriphenylamine) (abbreviation: PVTPA), poly[N-(4-{N-[4-(4-diphenylamino)phenyl]phenyl-N-phenylamino}phenyl)methacrylamide] (abbreviation: PTPDMA), or poly[NN-bis(4-butylphenyl)-N,N-bis(phenyl)benzidine] (abbreviation: Poly-TPD) can also be used.

The hole-transport material used for the composite material further preferably has any of a carbazole skeleton, a dibenzofuran skeleton, a dibenzothiophene skeleton, and an anthracene skeleton. In particular, an aromatic amine having a substituent that includes a dibenzofuran ring or a dibenzothiophene ring, an aromatic monoamine that includes a naphthalene ring, or an aromatic monoamine in which a 9-fluorenyl group is bonded to nitrogen of amine through an arylene group may be used. Note that the organic compound preferably has an N,N-bis(4-biphenyl)amino group because an organic EL device having a long lifetime can be fabricated. Specific examples of such an organic compound include N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), NN-bis(4-biphenyl)benzo[b]naphtho[1,2-d]furan-8-amine (abbreviation: BBABnf(8)), NN-bis(4-biphenyl)benzo[b]naphtho[2,3-d]furan-4-amine (abbreviation: BBABnf(II)(4)), N,N-bis[4-(dibenzofuran-4-yl)phenyl]-4-amino p-terphenyl (abbreviation: DBfBB1TP), N-[4-(dibenzothiophen-4-yl)phenyl]-N-phenyl-4-biphenylamine (abbreviation: ThBA1BP), 4-(2-naphthyl)-4',4"-diphenyltriphenylamine (abbreviation: BBAβNB), 4-[4-(2-naphthyl)phenyl]-4',4"-diphenyltriphenylamine (abbreviation: BBAβNBi), 4,4'-diphenyl-4"-(6;1'-binaphthyl-2-yl)triphenylamine (abbreviation: BBAαNβNB), 4,4'-diphenyl-4"-(7;1'-binaphthyl-2-yl)triphenylamine (abbreviation: BBAαNβNB-03), 4,4'-diphenyl-4"-(7-phenyl)naphthyl-2-yltriphenylamine (abbreviation: BBAPβNB-03), 4,4'-diphenyl-4"-(6;2'-binaphthyl-2-yl)triphenylamine (abbreviation: BBA(βN2)B), 4,4'-diphenyl-4"-(7;2'-binaphthyl-2-yl)triphenylamine (abbreviation: BBA(βN2)B-03), 4,4'-diphenyl-4"-(4;2'-binaphthyl-1-yl)triphenylamine (abbreviation: BBAβNαNB), 4,4'-diphenyl-4"-(5;2'-binaphthyl-1-yl)triphenylamine (abbreviation: BBAβNαNB-02), 4-(4-biphenylyl)-4'-(2-naphthyl)-4"-phenyltriphenylamine (abbreviation: TPBiAβNB), 4-(3-biphenylyl)-4'-[4-(2-naphthyl)phenyl]-4"-phenyltriphenylamine (abbreviation: mTPBiAβNBi), 4-(4-biphenylyl)-4'-[4-(2-naphthyl)phenyl]-4"-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB 1BP), 4,4'-diphenyl-4"-[4'-(carbazol-9-yl)biphenyl-4-yl]triphenylamine (abbreviation: YGTBi1BP), 4'-[4-(3-phenyl-9H-carbazol-9-yl)phenyl]tris(1,1'-biphenyl-4-yl)amine (abbreviation: YGTBi1BP-02), 4-diphenyl-4'-(2-naphthyl)-4"-{9-(4-biphenylyl)carbazole)}triphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis(4-biphenylyl)-9,9'-spirobi[9H-fluoren]-2-amine (abbreviation: BBASF), N,N-bis(1,1'-biphenyl-4-yl)-9,9'-spirobi[9H-fluoren]-4-amine (abbreviation: BBASF(4)), N-(1,1'-biphenyl-2-yl)-N-(9,9-dimethyl-9H-fluoren-2-yl)-9,9'-spirobi[9H-fluoren]-4-amine (abbreviation: oFBiSF), N-(4-biphenyl)-N-(dibenzofuran-4-yl)-9,9-dimethyl-9H-fluoren-2-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), N-phenyl-N-[4-(9-phenyl-9H-carbazol-3-yl)phenyl]spiro-9,9'-bifluoren-2-amine (abbreviation: PCBASF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), N,N-bis(9,9-dimethyl-9H-fluoren-2-yl)-9,9'-spirobi-9H-fluoren-4-amine, N,N-bis(9,9-dimethyl-9H-fluoren-2-yl)-9,9'-spirobi-9H-fluoren-3-amine, N,N-bis(9,9-dimethyl-9H-fluoren-2-yl)-9,9'-spirobi-9H-fluoren-2-amine, and N,N-bis(9,9-dimethyl-9H-fluoren-2-yl)-9,9'-spirobi-9H-fluoren-1-amine.

Further preferably, the hole-transport material used for the composite material has a relatively deep HOMO level higher than or equal to −5.7 eV and lower than or equal to −5.4 eV. When the hole-transport material used for the composite material has a relatively deep HOMO level, holes can be easily injected into the hole-transport layer 112 to easily provide an organic EL device having a long lifetime. In addition, when the hole-transport material used for the composite material has a relatively deep HOMO level, induction of holes can be inhibited properly so that an organic EL device having a longer lifetime can be easily obtained.

Note that mixing the above composite material with a fluoride of an alkali metal or an alkaline earth metal (the proportion of fluorine atoms in the layer is preferably greater than or equal to 20%) can lower the refractive index of the layer. This also enables a layer with a low refractive index to be formed in the EL layer 103, improving the external quantum efficiency of the organic EL device.

The formation of the hole-injection layer 111 can improve the hole-injection property, offering the organic EL device with a low driving voltage.

The hole-transport layer 112 contains a hole-transport material. The hole-transport material preferably has a hole mobility higher than or equal to $1\times10^{-6}$ $cm^2/Vs$.

Examples of the hole-transport material include compounds having an aromatic amine skeleton, such as 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]spiro-9,9'-bifluoren-2-amine (abbreviation: PCBASF); compounds having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 3,3'-bis(9-phenyl-9H-carbazole) (abbreviation: PCCP), 9,9'-bis(biphenyl-4-yl)-3,3'-bi-9H-carbazole (abbreviation: BisBPCz), 9,9'-bis(1,1'-biphenyl-3-yl)-3,3'-bi-9H-carbazole (abbreviation: BismBPCz), 9-(1,1'-biphenyl-3-yl)-9'-(1,1'-biphenyl-4-yl)-9H,9'H-3,3'-bicarbazole (abbreviation: mBPCCBP), 9-(2-naphthyl)-9'-phenyl-9H,9'H-3,3'-bicarbazole (abbreviation: βNCCP), 9-(3-biphenyl)-9'-(2-naphthyl)-3,3'-bi-9H-carbazole (abbreviation: βNCCmBP), 9-(4-biphenyl)-9'-(2-naphthyl)-3,3'-bi-9H-carbazole (abbreviation: βNCCBP), 9,9'-di-2-naphthyl-3,3'-9H,9'H-bicarbazole (abbreviation: BisβNCz), 9-(2-naphthyl)-9'-[1,1': 4',1"-terphenyl]-3-yl-3,3'-9H,9'H-bicarbazole, 9-(2-naphthyl)-9'-[1,1': 3',1"-terphenyl]-3-yl-3,3'-9H,9'H-bicarbazole, 9-(2-naphthyl)-9'-[1,1': 3',1"-terphenyl]-5'-yl-3,3'-9H,9'H-bicarbazole, 9-(2 naphthyl)-9'-[1,1': 4',1"-terphenyl]-4-yl-3,3'-9H,9'H-bicarbazole, 9-(2-naphthyl)-9'-[1,1': 3',1"-terphenyl]-4-yl-3,3'-9H,9'H-bicarbazole, 9-(2-naphthyl)-9'-(triphenylen-2-yl)-3,3'-9H,9'H-bicarbazole, 9-phenyl-9'-(triphenylen-2-yl)-3,3'-bi-9H-carbazole (abbreviation: PCCzTp), 9,9'-bis(triphenylen-2-yl)-3,3'-9H,9'H-bicarbazole, 9-(4-biphenyl)-9'-(triphenylen-2-yl)-3,3'-9H,9'H-bicarbazole, and 9-(triphenylen-2-yl)-9'-[1,1': 3',1"-terphenyl]-4-yl-3,3'-9H,9'H-bicarbazole; compounds having a thiophene skeleton, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton, such as 4,4',4"-(benzene-1,3,5-triyl)tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II). Among the above materials, the compound having an aromatic amine skeleton and the compound having a carbazole skeleton are preferable because these compounds are highly reliable and have high hole-transport properties to contribute to a reduction in driving voltage. Note that any of the substances given as examples of the hole-transport material used for the composite material for the hole-injection layer 111 can also be suitably used as the material included in the hole-transport layer 112.

The light-emitting layer 113 preferably contains the light-emitting substance and the first organic compound. The second organic compound may be further contained. The light-emitting layer 113 may additionally contain other materials. Alternatively, the light-emitting layer 113 may be a stack of two layers with different compositions. It is preferable that the first organic compound be an organic compound having an electron-transport property and the second organic compound be an organic compound having a hole-transport property.

The light-emitting substance may be a fluorescent substance, a phosphorescent substance, or a substance exhibiting thermally activated delayed fluorescence (TADF).

Examples of the material that can be used as a fluorescent substance in the light-emitting layer 113 are as follows. Other fluorescent substances can also be used.

The examples include κ,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N-diphenyl-N,N-bis[4-(9-phenyl-9H-fluoren-9-yl)phenyl]pyrene-1,6-diamine (abbreviation: 1,6FLPAPrn), N,N-bis(3-methylphenyl)-N,N-bis[3-(9-phenyl-9H-fluoren-9-yl)phenyl]pyrene-1,6-diamine (abbreviation: 1,6mMemFLPAPrn), N,N-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra-tert-butylperylene (abbreviation: TBP), 4-(10-phenyl-9-anthryl)-4'-(9-phenyl-9H-carbazol-3-yl)triphenylamine (abbreviation: PCBAPA), N,N'-(2-tert-butylanthracene-9,10-diyldi-4,1-phenylene)bis[N,N,N-triphenyl-1,4-phenylenediamine] (abbreviation: DPABPA), N,9-diphenyl-N-[4-(9,10-diphenyl-2-anthryl)phenyl]-9H-carbazol-3-amine (abbreviation: 2PCAPPA), N-[4-(9,10-diphenyl-2-anthryl)phenyl]-N,N,N-triphenyl-1,4-phenylenediamine (abbreviation: 2DPAPPA), N,N,N',N',N",N",N"',N"'-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), 9,10-bis(1,1'-biphenyl-2-yl)-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), coumarin 545T, NN-diphenylquinacridone (abbreviation: DPQd), rubrene, 5,12-bis(1,1'-biphenyl-4-yl)-6,11-diphenyltetracene (abbreviation: BPT), 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl] ethenyl}-4H-pyran-4-ylidene)propanedinitrile (abbreviation: BisDCM), 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM), N,N'-diphenyl-N,N'-(1,6-pyrene-diyl)bis[(6-phenylbenzo[b]naphtho[1,2-d]furan)-8-amine] (abbreviation: 1,6BnfAPrn-03), 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02), and 3,10-bis[N-(dibenzofuran-3-yl)-N-phenylamino]naphtho[2,3-b;6,7-b']bisbenzofuran (abbreviation: 3,10FrA2Nbf(IV)-02). Condensed aromatic diamine compounds typified by pyrenediamine compounds such as 1,6FLPAPrn, 1,6mMemFLPAPrn, and 1,6BnfAPrn-03 are particularly preferable because of their high hole-trapping properties, high emission efficiency, or high reliability.

Examples of the material that can be used when a phosphorescent substance is used as the light-emitting substance in the light-emitting layer 113 are as follows.

The examples include an organometallic iridium complex having a pyrimidine skeleton, such as (diisobutyrylmethanato)bis[4,6-bis(3-methylphenyl)pyrimidinato]iridium(III) (abbreviation: [Ir(5mdppm)$_2$(dibm)]), bis[4,6-bis(3-methylphenyl)pyrimidinato](dipivaloylmethanato)iridium(III) (abbreviation: [Ir(5mdppm)$_2$(dpm)]), or bis[4,6-di(naphthalen-1-yl)pyrimidinato](dipivaloylmethanato)iridium(III) (abbreviation: [Ir(d1 npm)$_2$(dpm)]); an organometallic iridium complex having a pyrazine skeleton, such as (acetylacetonato)bis(2,3,5-triphenylpyrazinato)iridium(III) (abbreviation: [Ir(tppr)$_2$(acac)]), bis(2,3,5-triphenylpyrazinato)(dipivaloylmethanato)iridium(III) (abbreviation: [Ir(tppr)$_2$(dpm)]), or (acetylacetonato)bis[2,3-bis(4-fluorophenyl)quinoxalinato]iridium(III) (abbreviation: [Ir(Fdpq)$_2$(acac)]); an organometallic iridium complex having a pyridine skeleton, such as tris(1-phenylisoquinolinato-N,C$^{2'}$)iridium(III) (abbreviation: [Ir(piq)$_3$]), bis(1-phenylisoquinolinato-N,C$^{2'}$)iridium(III) acetylacetonate (abbreviation: [Ir(piq)$_2$(acac)]), (3,7-diethyl-4,6-nonanedionato-κO4,κO6)bis[2,4-dimethyl-6-[7-(1-methylethyl)-1-isoquinolinyl-1κN]phenyl-κC]iridium(III), and (3,7-diethyl-4,6-nonanedionato-κO4,κO6)bis[2,4-dimethyl-6-[5-(1-methylethyl)-2-quinolinyl-κN]phenyl-KC]iridium(III); a platinum complex such as 2,3,7,8,12,13,17,18-octaethyl-21H,23H-porphyrinplatinum(II) (abbreviation: PtOEP); and a rare earth metal complex such as tris(1,3-diphenyl-1,3-propanedionato)(monophenanthroline)europium(III) (abbreviation: [Eu(DBM)$_3$(Phen)]) or tris[1-(2-thenoyl)-3,3,3-trifluoroacetonato](monophenanthroline)europium(III) (abbreviation: [Eu(TTA)$_3$(Phen)]). These compounds have an emission peak in the wavelength range of 600 nm to 700 nm. Organometallic iridium complexes having a pyrazine skeleton can provide red light emission with favorable chromaticity. Note that other known red phosphorescent substances can also be used.

The examples include an organometallic iridium complex having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: [Ir(mpptz-dmp)$_3$]) or tris(5-methyl-3,4-diphenyl-4H-1,2,4-triazolato)iridium(III) (abbreviation: [Ir(Mptz)$_3$]); an organometallic iridium complex having a 1H-triazole skeleton, such as tris[3-methyl-1-(2-methylphenyl)-5-phenyl-1H-1,2,4-triazolato]iridium(III) (abbreviation: [Ir(Mptz1-mp)$_3$]) or tris(1-methyl-5-phenyl-3-propyl-1H-1,2,4-triazolato)iridium(III) (abbreviation: [Ir(Prptz1-Me)$_3$]); an organometallic iridium complex having an imidazole skeleton, such as fac-tris[1-(2,6-diisopropylphenyl)-2-phenyl-1H-imidazole]iridium(III) (abbreviation: [Ir(iPrpmi)$_3$]), tris[3-(2,6-dimethylphenyl)-7-methylimidazo[1,2 f]phenanthridinato]iridium (III) (abbreviation: $[Ir(dmpimpt-Me)_3]$), or tris(2-[1-{2,6-bis(1-methylethyl)phenyl}-1H-imidazol-2-yl-κN3]-4-cyanophenyl-κC) (abbreviation: CNImIr); an organometallic complex having a benzimidazolidene skeleton, such as tris[(6-tert-butyl-3-phenyl-2H-imidazo[4,5-b]pyrazin-1-yl-κC2)phenyl-κC]iridium(III) (abbreviation: $[Ir(cb)_3]$); and an organometallic iridium complex in which a phenylpyridine derivative having an electron-withdrawing group is a ligand, such as bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis{2-[3',5'-bis(trifluoromethyl)phenyl]pyridinato-N,$C^{2'}$}iridium(III) picolinate (abbreviation: $[Ir(CF_3ppy)_2(pic)]$), or bis[2-(4',6'-difluorophenyl)pyridinato-N, $C^{2'}$]iridium(III) acetylacetonate (abbreviation: FIracac). These compounds exhibit blue phosphorescent light and have an emission peak in the wavelength range of 440 nm to 520 nm.

Other examples include organometallic iridium complexes having a pyrimidine skeleton, such as tris(4-methyl-6-phenylpyrimidinato)iridium(III) (abbreviation: $[Ir(mppm)_3]$), tris(4-t-butyl-6-phenylpyrimidinato)iridium(III) (abbreviation: $[Ir(tBuppm)_3]$), (acetylacetonato)bis(6-methyl-4-phenylpyrimidinato)iridium(III) (abbreviation: $[Ir(mppm)_2(acac)]$), (acetylacetonato)bis(6-tert-butyl-4-phenylpyrimidinato)iridium(III) (abbreviation: $[Ir(tBuppm)_2(acac)]$), (acetylacetonato)bis[6-(2-norbornyl)-4-phenylpyrimidinato]iridium(III) (abbreviation: $[Ir(nbppm)_2(acac)]$), (acetylacetonato)bis[5-methyl-6-(2-methylphenyl)-4-phenylpyrimidinato]iridium(III) (abbreviation: $[Ir(mpmppm)_2(acac)]$), and (acetylacetonato)bis(4,6-diphenylpyrimidinato)iridium(III) (abbreviation: $[Ir(dppm)_2(acac)]$); organometallic iridium complexes having a pyrazine skeleton, such as (acetylacetonato)bis(3,5-dimethyl-2-phenylpyrazinato)iridium(III) (abbreviation: $[Ir(mppr-Me)_2(acac)]$) and (acetylacetonato)bis(5-isopropyl-3-methyl-2-phenylpyrazinato)iridium(III) (abbreviation: $[Ir(mppr-iPr)_2(acac)]$); organometallic iridium complexes having a pyridine skeleton, such as tris(2-phenylpyridinato-N, $C^{2'}$)iridium(III) (abbreviation: $[Ir(ppy)_3]$), bis(2-phenylpyridinato-N,$C^{2'}$)iridium(III) acetylacetonate (abbreviation: $[Ir(ppy)_2(acac)]$), bis(benzo[h]quinolinato)iridium(III) acetylacetonate (abbreviation: $[Ir(bzq)_2(acac)]$), tris(benzo[h]quinolinato)iridium(III) (abbreviation: $[Ir(bzq)_3]$), tris(2-phenylquinolinato-N,$C^{2'}$)iridium(III) (abbreviation: $[Ir(pq)_3]$), bis(2-phenylquinolinato-N,$C^{2'}$)iridium(III) acetylacetonate (abbreviation: $[Ir(pq)_2(acac)]$), [2-d3-methyl-8-(2-pyridinyl-κN)benzofuro[2,3-b]pyridine-κC]bis[2-(5-d3-methyl-2-pyridinyl-κN2)phenyl-κC]iridium(III) (abbreviation: $Ir(5mppy-d3)_2(mbfpypy-d3)$), [2-(methyl-d3)-8-[4-(1-methylethyl-1-d)-2-pyridinyl-κN]benzofuro[2,3-b]pyridin-7-yl-κC]bis[5-(methyl-d3)-2-[5-(methyl-d3)-2-pyridinyl-κN]phenyl-κC]iridium(III) (abbreviation: $Ir(5mtpy-d6)_2(mbfpypy-iPr-d4)$), [2-d3-methyl-(2-pyridinyl-κN)benzofuro[2,3-b]pyridine-κC]bis[2-(2-pyridinyl-κN)phenyl-κC]iridium(III) (abbreviation: $Ir(ppy)_2(mbfpypy-d3)$), [2-(4-d3-methyl-5-phenyl-2-pyridinyl-κN2)phenyl-κC]bis[2-(5-d3-methyl-2-pyridinyl-κN2)phenyl-κC]iridium(III) (abbreviation: [Ir(5mppy-d3)2(mdppy-d3)]), [2-methyl-(2-pyridinyl-κN)benzofuro[2,3-b]pyridine-κC]bis[2-(2-pyridinyl-κN)phenyl-κC]iridium(III) (abbreviation: $[Ir(ppy)_2(mbfpypy)]$), and [2-(4-methyl-5-phenyl-2-pyridinyl-κN)phenyl-κC]bis[2-(2-pyridinyl-κN)phenyl-κC]iridium(III) (abbreviation: $Ir(ppy)_2(mdppy)$); and rare earth metal complexes such as tris(acetylacetonato)(monophenanthroline)terbium(III) (abbreviation: $[Tb(acac)_3(Phen)]$). These are mainly compounds that exhibit green phosphorescence and have an emission peak in the wavelength range of 500 nm to 600 nm. Note that organometallic iridium complexes having a pyrimidine skeleton have distinctively high reliability or emission efficiency and thus are particularly preferable.

Examples of the TADF material include a fullerene, a derivative thereof, an acridine, a derivative thereof, and an eosin derivative. Other examples include a metal-containing porphyrin containing magnesium (Mg), zinc (Zn), cadmium (Cd), tin (Sn), platinum (Pt), indium (In), palladium (Pd), or the like. Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2OEP$), which are represented by the following structural formulae.

[Chemical Formula 15]

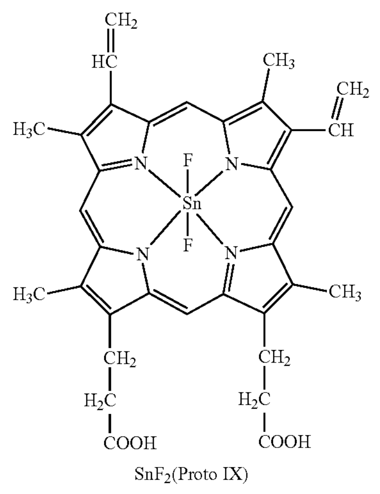

$SnF_2$(Proto IX)

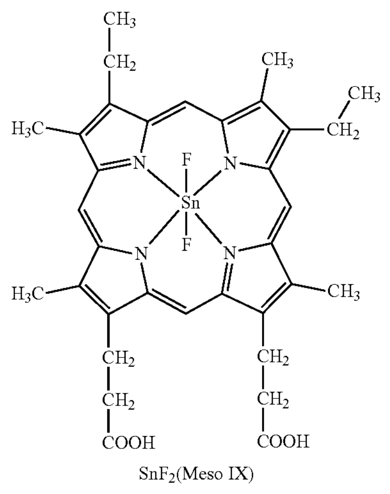

$SnF_2$(Meso IX)

-continued

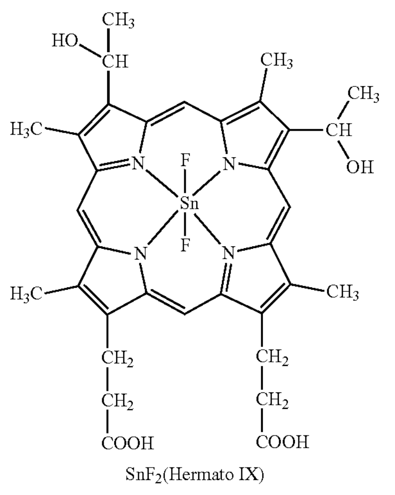

$SnF_2$(Hermato IX)

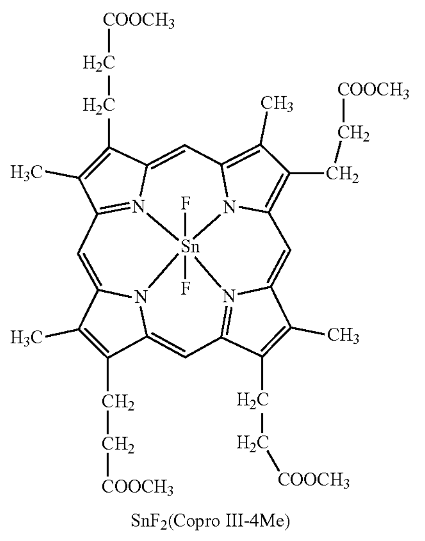

$SnF_2$(Copro III-4Me)

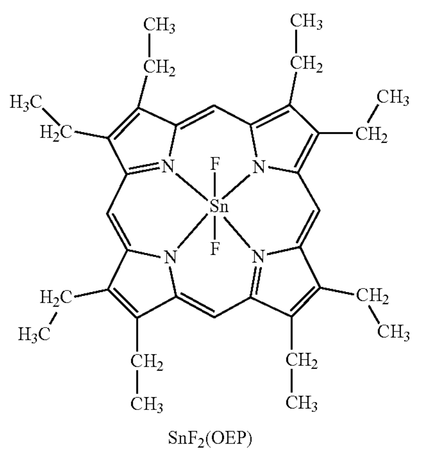

$SnF_2$(OEP)

-continued

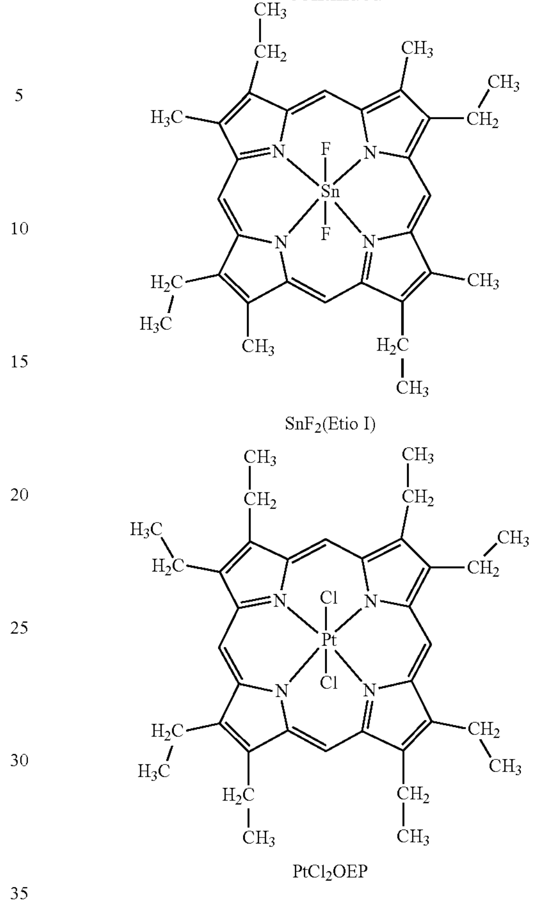

$SnF_2$(Etio I)

$PtCl_2OEP$

Alternatively, a heterocyclic compound having one or both of a π-electron rich heteroaromatic ring and a π-electron deficient heteroaromatic ring that is represented by the following structural formulae, such as 2-(biphenyl-4-yl)-4,6-bis(12-phenylindolo[2,3-α]carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA) can be used. Such a heterocyclic compound is preferable because of having excellent electron-transport and hole-transport properties owing to a π-electron rich heteroaromatic ring and a π-electron deficient heteroaromatic ring. Among skeletons having the π-electron deficient heteroaromatic ring, a pyridine skeleton, a diazine skeleton (a pyrimidine skeleton, a pyrazine skeleton, and a pyridazine skeleton), and a triazine skeleton are preferred because of their high stability and reliability. In particular, a benzofuropyrimidine skeleton, a benzothienopyrimidine skeleton, a benzofuropyrazine skeleton, and a benzothienopyrazine skeleton are preferred because of their high acceptor properties and high reliability. Among skeletons having the ii-electron rich heteroaromatic ring, an acridine skeleton, a phenoxazine skeleton, a phenothiazine skeleton, a furan skeleton, a thiophene skeleton, and a pyrrole skeleton have high stability and reliability; thus, at least one of these skeletons is preferably included. A dibenzofuran skeleton is preferable as a furan skeleton, and a dibenzothiophene skeleton is preferable as a thiophene skeleton. As a pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable. Note that a substance in which the π-electron rich heteroaromatic ring is directly bonded to the π-electron deficient heteroaromatic ring is particularly preferred because the electron-donating property of the π-electron rich heteroaromatic ring and the electron-accepting property of the π-electron deficient heteroaromatic ring are both improved, the energy difference between the Si level and the Ti level becomes small, and thus thermally activated delayed fluorescence can be obtained with high efficiency. Note that an aromatic ring to which an electron-withdrawing group such as a cyano group is bonded may be used instead of the ii-electron deficient heteroaromatic ring. As a π-electron rich skeleton, an aromatic amine skeleton, a phenazine skeleton, or the like can be used. As a π-electron deficient skeleton, a xanthene skeleton, a thioxanthene dioxide skeleton, an oxadiazole skeleton, a triazole skeleton, an imidazole skeleton, an anthraquinone skeleton, a skeleton containing boron such as phenylborane or boranthrene, an aromatic ring or a heteroaromatic ring having a nitrile group or a cyano group such as benzonitrile or cyanobenzene, a carbonyl skeleton such as benzophenone, a phosphine oxide skeleton, a sulfone skeleton, or the like can be used. As described above, a π-electron deficient skeleton and a π-electron rich skeleton can be used instead of at least one of the π-electron deficient heteroaromatic ring and the π-electron rich heteroaromatic ring.

[Chemical Formula 16]

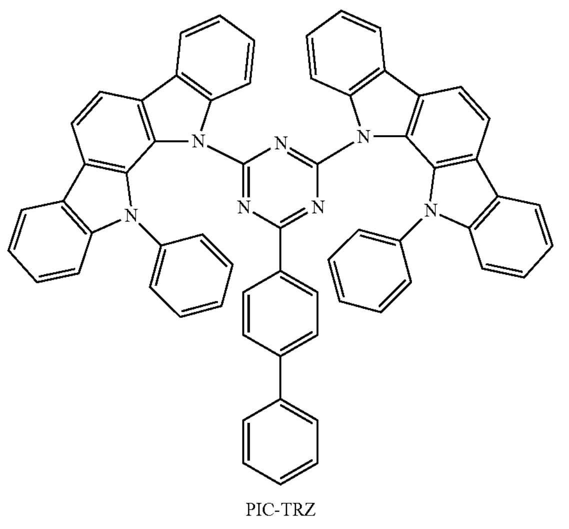

PIC-TRZ

-continued

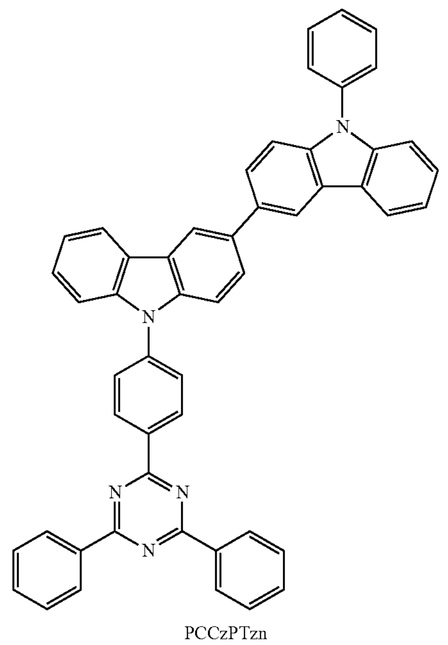

PCCzPTzn

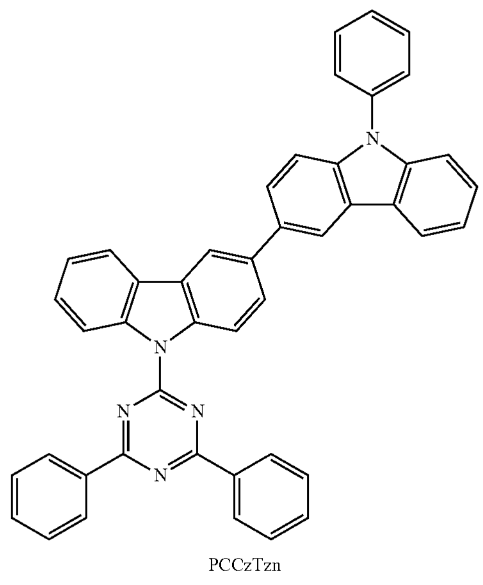

PCCzTzn

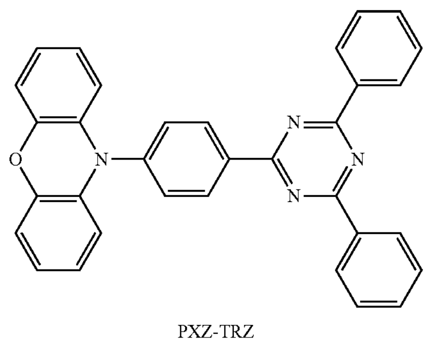

PXZ-TRZ

-continued

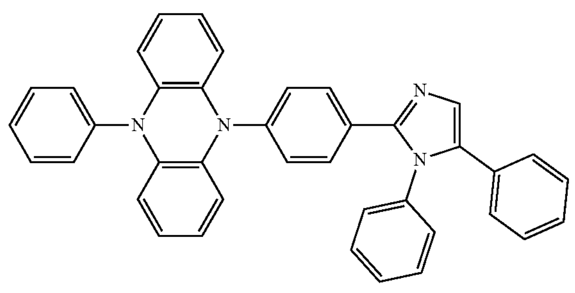

PPZ-3TPT

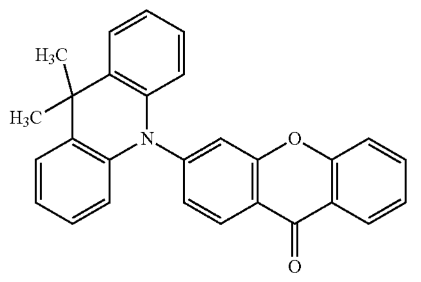

ACRXTN

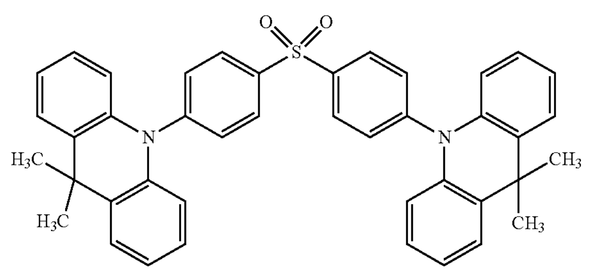

DMAC-DPS

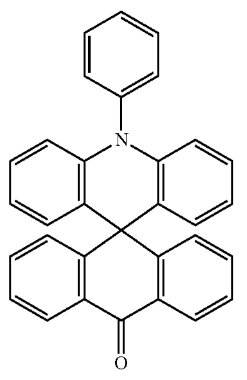

ACRSA

A TADF material, which enables reversible intersystem crossing at extremely high speed and emits light in accordance with a model of thermal equilibrium between a singlet excited state and a triplet excited state, may be used. Such a TADF material has an extremely short emission lifetime (excitation lifetime) as a TADF material and can inhibit a decrease in the efficiency in a high-luminance region of a light-emitting element. Specifically, a material having the following molecular structure can be given.

[Chemical formula 17]

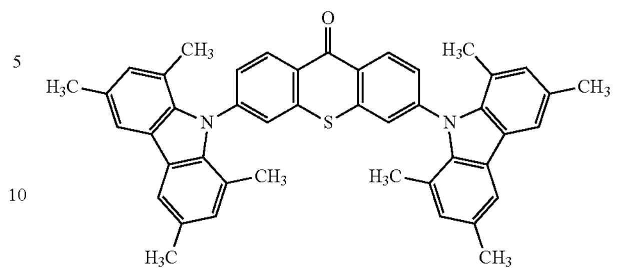

Note that a TADF material is a material having a small difference between the Si level and the Ti level and a function of converting triplet excitation energy into singlet excitation energy by reverse intersystem crossing. Thus, it is possible to upconvert triplet excitation energy into singlet excitation energy (i.e., reverse intersystem crossing) using a small amount of thermal energy and efficiently generate a singlet excited state. In addition, the triplet excitation energy can be converted into light emission.

An exciplex whose excited state is formed of two kinds of substances has an extremely small difference between the Si level and the Ti level and functions as a TADF material capable of converting triplet excitation energy into singlet excitation energy.

A phosphorescent spectrum observed at a low temperature (e.g., 77 K to 10 K) is used for an index of the Ti level. When the level of energy with a wavelength of the line obtained by extrapolating a tangent to the fluorescent spectrum at a tail on the short wavelength side is the Si level and the level of energy with a wavelength of the line obtained by extrapolating a tangent to the phosphorescent spectrum at a tail on the short wavelength side is the Ti level, the difference between Si and Ti of the TADF material is preferably smaller than or equal to 0.3 eV, further preferably smaller than or equal to 0.2 eV.

When a TADF material is used as the light-emitting substance, the Si level of the host material is preferably higher than the Si level of the TADF material. In addition, the Ti level of the host material is preferably higher than the Ti level of the TADF material.

As an electron-transport material used as the host material, for example, a metal complex such as bis(10-hydroxybenzo[h]quinolinato)beryllium(II) (abbreviation: $BeBq_2$), bis(2-methyl-8-quinolinolato) (4-phenylphenolato)aluminum(III) (abbreviation: BAlq), bis(8-quinolinolato)zinc(II) (abbreviation: Znq), bis[2-(2-benzoxazolyl)phenolato]zinc (II) (abbreviation: ZnPBO), or bis[2-(2-benzothiazolyl)phenolato]zinc(II) (abbreviation: ZnBTZ); or an organic compound including a π-electron deficient heteroaromatic ring can be used. Examples of the organic compound including a π-electron deficient heteroaromatic ring include an organic compound including a heteroaromatic ring having a polyazole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), or 2-[3-(dibenzothiophen-4-yl)phenyl]-1-phenyl-1H-benzimidazole (abbreviation: mDBTBIm-II); an organic compound including a heteroaromatic ring having a diazine skeleton, such as 2-[3-(dibenzothiophen-4-yl)phenyl]dibenzo[f,h] quinoxaline (abbreviation: 2mDBTPDBq-II), 2-[3-(3'-dibenzothiophen-4-yl)biphenyl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 2,6-bis(4-naphthalen-1-ylphenyl)-4-[4-(3-pyridyl)phenyl]pyrimidine (abbreviation: 2,4NP-6PyPPm), 6-(1,1'-biphenyl-3-yl)-4-[3,5-bis(9H-carbazol-9-yl)phenyl]-2-phenylpyrimidine (abbreviation: 6mBP-4Cz2PPm), 4-[3,5-bis(9H-carbazol-9-yl)phenyl]-2-phenyl-6-(1,1'-biphenyl-4-yl)pyrimidine (abbreviation: 6BP-4Cz2PPm), 7-[4-(9-phenyl-9H-carbazol-2-yl)quinazolin-2-yl]-7H-dibenzo[c,g]carbazole (abbreviation: PC-cgDBCzQz), 11-[(3'-dibenzothiophen-4-yl)biphenyl-3-yl]phenanthro[9',10': 4,5]furo[2,3-b]pyrazine (abbreviation: 11mDBtBPPnfpr), 11-[(3'-dibenzothiophen-4-yl)biphenyl-4-yl]phenanthro[9',10': 4,5]furo[2,3-b]pyrazine, 11-[(3'-(9H-carbazol-9-yl)biphenyl-3-yl]phenanthro[9',10': 4,5]furo[2,3-b]pyrazine, 12-(9'-phenyl-3,3'-bi-9H-carbazol-9-yl)phenanthro[9',10': 4,5]furo[2,3-b]pyrazine (abbreviation: 12PCCzPnfpr), 9-[(3'-9-phenyl-9H-carbazol-3-yl)biphenyl-4-yl]naphtho[1',2': 4,5]furo[2,3-b]pyrazine (abbreviation: 9pmPCBPNfpr), 9-(9'-phenyl-3,3'-bi-9H-carbazol-9-yl)naphtho[1',2': 4,5]furo[2,3-b]pyrazine (abbreviation: 9PCCzNfpr), 10-(9'-phenyl-3,3'-bi-9H-carbazol-9-yl)naphtho[1',2': 4,5]furo[2,3-b]pyrazine (abbreviation: 10PCCzNfpr), 9-[3'-(6-phenylbenzo[b]naphtho[1,2-d]furan-8-yl)biphenyl-3-yl]naphtho[1',2': 4,5]furo[2,3-b]pyrazine (abbreviation: 9mBnfBPNfpr), 9-{3-[6-(9,9-dimethylfluoren-2-yl)dibenzothiophen-4-yl]phenyl}naphtho[1',2': 4,5]furo[2,3-b]pyrazine (abbreviation: 9mFDBtPNfpr), 9-[3'-(6-phenyldibenzothiophen-4-yl)biphenyl-3-yl]naphtho[1',2': 4,5]furo[2,3-b]pyrazine (abbreviation: 9mDBtBPNfpr-02), 9-[3-(9'-phenyl-3,3'-bi-9H-carbazol-9-yl)phenyl]naphtho[1',2': 4,5]furo[2,3-b]pyrazine (abbreviation: 9mPCCzPNfpr), 9-{3'-[2,8-diphenyldibenzothiophen-4-yl]biphenyl-3-yl}naphtho[1',2': 4,5]furo[2,3-b]pyrazine, or 11-{3'-[2,8-diphenyldibenzothiophen-4-yl]biphenyl-3-yl}phenanthro[9',10': 4,5]furo[2,3-b]pyrazine; an organic compound including a heteroaromatic ring having a pyridine skeleton, such as 3,5-bis[3-(9H-carbazol-9-yl)phenyl]pyridine (abbreviation: 35DCzPPy) or 1,3,5-tri[3-(3-pyridyl)phenyl]benzene (abbreviation: TmPyPB); and an organic compound including a heteroaromatic ring having a triazine skeleton, such as 2-[3'-(9,9-dimethyl-9H-fluoren-2-yl)-1,1'-biphenyl-3-yl]-4,6-diphenyl-1,3,5-triazine (abbreviation: mFBPTzn), 2-[(1,1'-biphenyl)-4-yl]-4-phenyl-6-[9,9'-spirobi(9H-fluoren)-2-yl]-1,3,5-triazine (abbreviation: BP-SFTzn), 2{-3-[3-(benzo[b]naphtho[1,2-d]furan-8-yl)phenyl]phenyl}-4,6-diphenyl-1,3,5-triazine (abbreviation: mBnfBPTzn), 2-{3-[3-(benzo[b]naphtho[1,2-d]furan-6-yl)phenyl]phenyl}-4,6-diphenyl-1,3,5-triazine (abbreviation: mBnfBPTzn-02), 5-[3-(4,6-diphenyl-1,3,5-triazin-2-yl)phenyl]-7,7-dimethyl-5H,7H-indeno[2,1-b]carbazole (abbreviation: mINc(II)PTzn), 2-[3'-(triphenylen-2-yl)-1,1'-biphenyl-3-yl]-4,6-diphenyl'1,3,5-triazine (abbreviation: mTpBPTzn), 9-[4-(4,6-diphenyl-1,3,5-triazin-2-yl)-2-dibenzothiophenyl]-2-phenyl-9H-carbazole (abbreviation: PCDBfTzn), or 2-[1,1'-biphenyl]-3-yl-4-phenyl-6-(8-[1,1': 4',1"-terphenyl]-4-yl-1-dibenzofuranyl)-1,3,5-triazine (abbreviation: mBP-TPDBfTzn). Among the above materials, the organic compound including a heteroaromatic ring having a diazine skeleton, the organic compound including a heteroaromatic ring having a pyridine skeleton, and the organic compound including a heteroaromatic ring having a triazine skeleton have high reliability and thus are preferable. In particular, the organic compound including a heteroaromatic ring having a diazine (pyrimidine or pyrazine) skeleton and the organic compound including a heteroaromatic ring having a triazine skeleton have a high electron-transport property to contribute to a reduction in driving voltage.

As a hole-transport material used as the host material, an organic compound having an amine skeleton or a π-electron rich heteroaromatic ring can be used. Examples of the organic compound having an amine skeleton or a ii-electron rich heteroaromatic ring include a compound having an aromatic amine skeleton, such as 4,4'-bis[N-(1-naphthyl)-N-phenylamino]biphenyl (abbreviation: NPB), NN-bis(3-methylphenyl)-N,N-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), or N-phenyl-N-[4-(9-phenyl-9H-carbazol-3-yl)phenyl]spiro-9,9'-bifluoren-2-amine (abbreviation: PCBASF); a compound having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 3,3'-bis(9-phenyl-9H-carbazole) (abbreviation: PCCP), N-[4-(9-phenyl-9H-carbazol-3-yl)phenyl]-bis(9,9-dimethyl-9H-fluoren-2-yl)amine (abbreviation: PCBFF), N-(1,1'-biphenyl-4-yl)-N-[4-(9-phenyl-9H-carbazol-3-yl)phenyl]-9,9-dimethyl-9H-fluoren-4-amine, N-[4-(9-phenyl-9H-carbazol-3-yl)phenyl]-(9,9-dimethyl-9H-fluoren-2-yl)-9,9-dimethyl-9H-fluoren-4-amine, N-(1,1'-biphenyl-4-yl)-N-[4-(9-phenyl-9H-carbazol-3-yl)phenyl]-9,9-diphenyl-9H-fluoren-2-amine, N-(1,1'-biphenyl-4-yl)-N-[4-(9-phenyl-9H-carbazol-3-yl)phenyl]-9,9-diphenyl-9H-fluoren-4-amine, N-(1,1'-biphenyl-4-yl)-N-[4-(9-phenyl-9H-carbazol-3-yl)phenyl]-9,9'-spirobi(9H-fluoren)-2-amine (abbreviation: PCBBiSF), N-(1,1'-biphenyl-4-yl)-N-[4-(9-phenyl-9H-carbazol-3-yl)phenyl]-9,9'-spirobi(9H-fluoren)-4-amine, N-[4-(9-phenyl-9H-carbazol-3-yl)phenyl]-N-(1,1': 3',1"-terphenyl-4-yl)-9,9-dimethyl-9H-fluoren-2-amine, N-[4-(9-phenyl-9H-carbazol-3-yl)phenyl]-N-(1,1': 4',1"-terphenyl-4-yl)-9,9-dimethyl-9H-fluoren-2-amine, N-[4-(9-phenyl-9H-carbazol-3-yl)phenyl]-N-(1,1': 3',1"-terphenyl-4-yl)-9,9-dimethyl-9H-fluoren-4-amine, or N-[4-(9-phenyl-9H-carbazol-3-yl)phenyl]-N-(1,1': 4',1"-terphenyl-4-yl)-9,9-dimethyl-9H-fluoren-4-amine; a compound having a thiophene skeleton, such as 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV); and a compound having a furan skeleton, such as 4,4',4"-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II). Among the above materials, the compound having an aromatic amine skeleton and the compound having a carbazole skeleton are preferable because these compounds are highly reliable and have high hole-transport properties to contribute to a reduction in driving voltage. In addition, the organic compounds given as examples of the hole-transport material that can be used for the hole-transport layer 112 can also be used as the hole-transport material of the host.

Note that by mixing the electron-transport material with the hole-transport material, the transport property of the light-emitting layer 113 can be easily adjusted and a recombination region can be easily controlled. The TADF material can be used as the electron-transport material or the hole-transport material.

As the TADF material that can be used as the host material, the above materials mentioned as the TADF material can also be used. When the TADF material is used as the host material, triplet excitation energy generated in the TADF material is converted into singlet excitation energy by reverse intersystem crossing and transferred to the light-emitting substance, whereby the emission efficiency of the organic EL device can be increased. Here, the TADF material functions as an energy donor, and the light-emitting substance functions as an energy acceptor.

This is very effective in the case where the light-emitting substance is a fluorescent substance. In that case, the Si level of the TADF material is preferably higher than the Si level of the fluorescent substance in order that high emission efficiency can be achieved. Furthermore, the Ti level of the TADF material is preferably higher than the Si level of the fluorescent substance. Therefore, the Ti level of the TADF material is preferably higher than the Ti level of the fluorescent substance.

It is also preferable to use a TADF material that emits light whose wavelength overlaps with the wavelength on a lowest-energy-side absorption band of the fluorescent substance. This case is preferable because excitation energy is transferred smoothly from the TADF material to the fluorescent substance and light emission can be obtained efficiently.

In addition, in order to efficiently generate singlet excitation energy from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protective group around a luminophore (a skeleton which causes light emission) of the fluorescent substance. As the protective group, a substituent having no it bond and a saturated hydrocarbon are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protective groups. The substituents having no $\pi$ bond are poor in carrier transport performance; thus, the TADF material and the luminophore of the fluorescent substance can be made away from each other with little influence on carrier transportation or carrier recombination. Here, the luminophore refers to an atomic group (skeleton) that causes light emission in a fluorescent substance. The luminophore is preferably a skeleton having a it bond, further preferably includes an aromatic ring, and still further preferably includes a condensed aromatic ring or a condensed heteroaromatic ring. Examples of the condensed aromatic ring or the condensed heteroaromatic ring include a phenanthrene skeleton, a stilbene skeleton, an acridone skeleton, a phenoxazine skeleton, and a phenothiazine skeleton. Specifically, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferred because of its high fluorescence quantum yield.

In the case where a fluorescent substance is used as the light-emitting substance, a material having an anthracene skeleton is suitably used as the host material. The use of a substance having an anthracene skeleton as the host material for the fluorescent substance makes it possible to obtain a light-emitting layer with high emission efficiency and high durability. As the substance having an anthracene skeleton that is used as the host material, a substance having a diphenylanthracene skeleton, in particular, a substance having a 9,10-diphenylanthracene skeleton, is preferable because of its chemical stability. The host material preferably has a carbazole skeleton because the hole-injection and hole-transport properties are improved; further preferably, the host material has a benzocarbazole skeleton in which a benzene ring is further condensed to carbazole because the HOMO level thereof is shallower than that of carbazole by approximately 0.1 eV and thus holes enter the host material easily. In particular, the host material preferably has a dibenzocarbazole skeleton because the HOMO level thereof is shallower than that of carbazole by approximately 0.1 eV so that holes enter the host material easily, the hole-transport property is improved, and the heat resistance is increased. Accordingly, a substance that has both a 9,10-diphenylanthracene skeleton and a carbazole skeleton (or a benzocarbazole skeleton or a dibenzocarbazole skeleton) is further preferable as the host material. Note that in terms of the hole-injection and hole-transport properties described above, instead of a carbazole skeleton, a benzofluorene skeleton or a dibenzofluorene skeleton may be used. Examples of such a substance include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), 9-(1-naphthyl)-10-[4-(2-naphthyl)phenyl] anthracene (abbreviation: αN-βNPAnth), 9-(1-naphthyl)-10-(2-naphthyl)anthracene (abbreviation: α,βADN), 2-(10-phenylanthracen-9-yl)dibenzofuran, 2-(10-phenyl-9-anthracenyl)-benzo[b]naphtho[2,3-d]furan (abbreviation: Bnf(II)PhA), 9-(2-naphthyl)-10-[3-(2-naphthyl)phenyl]anthracene (abbreviation: βN-mβNPAnth), 1-[4-(10-[, 1,1'-biphenyl]-4-yl-9-anthracenyl)phenyl]-2-ethyl-1H-benzimidazole (abbreviation: EtBImPBPhA), 2,9-di(1-naphthyl)-10-phenylanthracene (abbreviation: 2αN-αNPhA), 9-(1-naphthyl)-10-[3-(1-naphthyl)phenyl]anthracene (abbreviation αN-mαNPAnth), 9-(2-naphthyl)-10-[3-(1-naphthyl)phenyl]anthracene (abbreviation βN-mαNPAnth, 9-(1-naphthyl)-10-[4-(1-naphthyl)phenyl] anthracene (abbreviation: αN-αNPAnth), 9-(2-naphthyl)-10-[4-(2-naphthyl)phenyl]anthracene (abbreviation: βN-βNPAnth), and 2-(1-naphthyl)-9-(2-naphthyl)-10-phenylanthracene (abbreviation: 2αN-βNPhA). In particular, CzPA, cgDBCzPA, 2mBnfPPA, and PCzPA exhibit excellent properties and thus are preferably selected.

Note that a phosphorescent substance can be used as part of the mixed material. When a fluorescent substance is used as the light-emitting substance, a phosphorescent substance can be used as an energy donor for supplying excitation energy to the fluorescent substance.

An exciplex may be formed of the mixed materials. The mixed materials are preferably selected so as to form an exciplex that exhibits light emission overlapping with the wavelength of a lowest-energy-side absorption band of the light-emitting substance, in which case energy can be transferred smoothly and light emission can be obtained efficiently. The use of such a structure is also preferable because the driving voltage is reduced.

Note that at least one of the materials forming an exciplex may be a phosphorescent substance. In this case, triplet excitation energy can be efficiently converted into singlet excitation energy by reverse intersystem crossing.

A combination of an electron-transport material and a hole-transport material whose HOMO level is higher than or equal to the HOMO level of the electron-transport material is preferable for forming an exciplex efficiently. In addition, the LUMO level of the hole-transport material is preferably higher than or equal to the LUMO level of the electron-transport material. Note that the LUMO levels and the HOMO levels of the materials can be derived from the electrochemical characteristics (the reduction potentials and the oxidation potentials) of the materials that are measured by cyclic voltammetry (CV).

The formation of an exciplex can be confirmed by a phenomenon in which the emission spectrum of a mixed film in which the hole-transport material and the electron-transport material are mixed is shifted to a longer wavelength than the emission spectrum of each of the materials (or has another peak on the longer wavelength side) observed in comparison of the emission spectrum of the hole-transport material, the emission spectrum of the electron-transport material, and the emission spectrum of the mixed film of these materials, for example. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the materials, observed in comparison of transient PL of the hole-transport material, the transient PL of the electron-transport material, and the transient PL of the mixed film of these materials. The transient PL can be rephrased as transient electroluminescence (EL). That is, the formation of an exciplex can also be confirmed by a difference in transient response observed in comparison of the transient EL of the hole-transport material, the transient EL of the electron-transport material, and the transient EL of the mixed film of these materials.

In the case where a hole-blocking layer is provided, the hole-blocking layer is in contact with the light-emitting layer 113, and is formed to contain an organic compound having an electron-transport property and being capable of blocking holes. As the organic compound contained in the hole-blocking layer, a material having a high electron-transport property, a low hole-transport property, and a deep HOMO level is suitably used. Specifically, it is preferable to use a substance having a deeper HOMO level than the material contained in the light-emitting layer 113 by 0.5 eV or more and having an electron mobility of $1\times10^{-6}$ $cm^2/Vs$ or higher when the square root of the electric field strength [V/cm] is 600.

In particular, 2-{3-[3-(N-phenyl-9H-carbazol-3-yl)-9H-carbazol-9-yl]phenyl}dibenzo[f,h]quinoxaline (abbreviation: 2mPCCzPDBq), 2-{3-[2-(N-phenyl-9H-carbazol-3-yl)-9H-carbazol-9-yl]phenyl}dibenzo[f,h]quinoxaline (abbreviation: 2mPCCzPDBq-02), 2-{3-[3-(N-phenyl-9H-carbazol-2-yl)-9H-carbazol-9-yl]phenyl}dibenzo[f,h]quinoxaline (abbreviation: 2mPCCzPDBq-03), 2-{3-[3-(N-(3,5-di-tert-butylphenyl-9H-carbazol-3-yl)-9H-carbazol-9-yl]phenyl}dibenzo[f,h]quinoxaline, 9-[3-(4,6-diphenyl-1,3,5-triazin-2-yl)phenyl]-9'-phenyl-3,3'-bi-9H-carbazole (abbreviation: mPCCzPTzn), 9-[3-(4,6-diphenyl-1,3,5-triazin-2-yl)phenyl]-9'-phenyl-2,3'-bi-9H-carbazole (abbreviation: mPCCzPTzn-02), 2-{4-[3-(N-phenyl-9H-carbazol-3-yl)-9H-carbazol-9-yl]phenyl}-4,6-diphenyl-1,3,5-triazine (abbreviation: PCCzPTzn), 9-(4,6-diphenyl-1,3,5-triazin-2-yl)-9'-phenyl-3,3'-bi-9H-carbazole (abbreviation: PCCzTzn (CzT)), 9-[3-(4,6-diphenyl-pyrimidin-2-yl)phenyl]-9'-phenyl-3,3'-bi-9H-carbazole (abbreviation: 2PCCzPPm), 9-(4,6-diphenyl-pyrimidin-2-yl)-9'-phenyl-3,3'-bi-9H-carbazole (abbreviation: 2PCCzPm), 4-[2-(N-phenyl-9H-carbazol-3-yl)-9H-carbazol-9-yl]benzofuro[3,2-d]pyrimidine (abbreviation: 4PCCzBfpm-02), 4-{3-[3-(N-phenyl-9H-carbazol-3-yl)-9H-carbazol-9-yl]phenyl}benzo[h]quinazoline, and 9-[3-(2,6-diphenyl-pyridin-4-yl)phenyl]-9'-phenyl-3,3'-bi-9H-carbazole are preferable because of their high heat resistance.

In the case of using other materials for the hole-blocking layer, an organic compound having a deeper HOMO level than the material contained in the light-emitting layer 113 is selected from materials that can be used for a hole-transport layer, which will be described later.

For the electron-transport layer 114, it is preferable to use an organic compound having an electron-transport property that is a substance with an electron mobility of $1\times10^{-6}$ $cm^2/Vs$ or higher when the square root of the electric field strength [V/cm] is 600. Note that any other substance can also be used as long as the substance has an electron-transport property higher than a hole-transport property. An organic compound including a π-electron deficient heteroaromatic ring is preferable as the above organic compound. The organic compound including a it-electron deficient heteroaromatic ring is preferably one or more of an organic compound including a heteroaromatic ring having a polyazole skeleton, an organic compound including a heteroaromatic ring having a pyridine skeleton, an organic compound including a heteroaromatic ring having a diazine skeleton, and an organic compound including a heteroaromatic ring having a triazine skeleton.

Specific examples of the organic compound having a π-electron deficient heteroaromatic ring skeleton that can be used for the above electron-transport layer include organic compounds having an azole skeleton, such as 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3,5-benzenetriyl)tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), and 4,4'-bis(5-methylbenzoxazol-2-yl)stilbene (abbreviation: BzOs); organic compounds having a heteroaromatic ring having a pyridine skeleton, such as 3,5-bis[3-(9H-carbazol-9-yl)phenyl]pyridine (abbreviation: 35DCzPPy), 1,3,5-tri[3-(3-pyridyl)phenyl]benzene (abbreviation: TmPyPB), 3,5-bis[3-(9H-carbazol-9-yl)phenyl]pyridine (abbreviation: 35DCzPPy), bathophenanthroline (abbreviation: Bphen), bathocuproine (abbreviation: BCP), and 2,9-di(naphthyl-2-yl)-4,7-diphenyl-1,10-phenanthroline (abbreviation: NBphen); organic compounds having a diazine skeleton, such as 2-[3-(dibenzothiophen-4-yl)phenyl]dibenzo[/h]quinoxaline (abbreviation: 2mDBTPDBq-II), 2-[3-(3'-(dibenzothiophen-4-yl)biphenyl]dibenzo[f,h]quinoxaline (abbreviation: 2mDBTBPDBq-II), 2-[3'-(9H-carbazol-9-yl)biphenyl-3-yl] dibenzo[/h]quinoxaline (abbreviation: 2mCzBPDBq), 2-[4'-(9-phenyl-9H-carbazol-3-yl)-3,1'-biphenyl-1-yl]dibenzo[f,h]quinoxaline (abbreviation: 2mpPCBPDBq), 2-[3-(dibenzothiophen-4-yl)phenyl]dibenzo[f,h]quinoxaline (abbreviation: 2mDBTPDBq-II), 2-[3'-(9H-carbazol-9-yl) biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[1 h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 9-[(3'-dibenzothiophen-4-yl)biphenyl-3-yl]naphtho[1',2': 4,5]furo[2,3-b]pyrazine (abbreviation: 9mDBtBPNfpr), 9-[(3'-dibenzothiophen-4-yl)biphenyl-4-yl]naphtho[1',2': 4,5]furo[2,3-b]pyrazine (abbreviation: 9pmDBtBPNfpr), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), 4,6-bis[3-(9H-carbazol-9-yl)phenyl] pyrimidine (abbreviation: 4,6mCzP2Pm), 9,9'-[pyrimidine-4,6-diylbis(biphenyl-3,3'-diyl)]bis(9H-carbazole) (abbreviation: 4,6mCzBP2Pm), 8-(1,1'-biphenyl-4-yl)-4-[3-(dibenzothiophen-4-yl)phenyl]-[1]benzofuro[3,2-d] pyrimidine (abbreviation: 8BP-4mDBtPBfpm), 3,8-bis[3-(dibenzothiophen-4-yl)phenyl]benzofuro[2,3-b]pyrazine (abbreviation: 3,8mDBtP2Bfpr), 4,8-bis[3-(dibenzothiophen-4-yl)phenyl]-[1]benzofuro[3,2-d]pyrimidine (abbreviation: 4,8mDBtP2Bfpm), 8-[3'-(dibenzothiophen-4-yl)(1,1'-biphenyl-3-yl)]naphtho[1',2': 4,5]furo[3,2-d]pyrimidine (abbreviation: 8mDBtBPNfpm), 8-[(2,2'-binaphthalen)-6-yl)]-4-[3-(dibenzothiophen-4-yl)phenyl]-[1]benzofuro[3,2-d]pyrimidine (abbreviation: 8(βN2)-4mDBtPBfpm), 2,2'-(pyridine-2,6-diyl)bis(4-phenylbenzo[h]quinazoline) (abbreviation: 2,6(P-Bqn)2Py), 2,2'-(pyridine-2,6-diyl) bis{4-[4-(2-naphthyl)phenyl]-6-phenylpyrimidine} (abbreviation: 2,6(NP-PPm)2Py), 6-(1,1'-biphenyl-3-yl)-4-[3,5-bis (9H-carbazol-9-yl)phenyl]-2-phenylpyrimidine (abbreviation: 6mBP-4Cz2PPm), 2,6-bis(4-naphthalen-1-ylphenyl)-4-[4-(3-pyridyl)phenyl]pyrimidine (abbreviation: 2,4NP-6PyPPm), 4-[3,5-bis(9H-carbazol-9-yl)phenyl]-2-phenyl-6-(1,1'-biphenyl-4-yl)pyrimidine (abbreviation: 6BP-4Cz2PPm), 7-[4-(9-phenyl-9H-carbazol-2-yl)quinazolin-2-yl]-7H-dibenzo[c,g]carbazole (abbreviation: PC-cgDBCzQz), 8-(1,1': 4',1"-terphenyl-3-yl)-4-[3-(dibenzothiophen-4-yl)phenyl]-benzofuro[3,2-d]pyrimidine (abbreviation: 8mpTP-4mDBtPBfpm), 4,8-bis[3-(dibenzofuran-4-yl)phenyl]benzofuro[3,2-d]pyrimidine, 8-(1,1': 4',1"-terphenyl-3-yl)-4-[3-(dibenzothiophen-4-yl)biphenyl-4-yl]-benzofuro[3,2-d]pyrimidine, 4,8-bis[3-(9H-carbazol-9-yl)phenyl]benzofuro[3,2-d]pyrimidine (abbreviation: 4,8mCzP2Bfpm), 8-(1,1': 4',1"-terphenyl-3-yl)-4-[3-(9-phenyl-9H-carbazol-3-yl)phenyl]-benzofuro[3,2-d]pyrimidine, 8-(1,1'-biphenyl-4-yl)-4-[3-(9-phenyl-9H-carbazol-3-yl)biphenyl-3-yl]-benzofuro[3,2-d]pyrimidine, 8-(1,1'-biphenyl-4-yl)-4-{3-[2-(N-phenyl-9H-carbazol-3-yl)-9H-carbazol-9-yl]phenyl}benzofuro[3,2-d]pyrimidine, 8-phenyl-4-{3-[2-(N-phenyl-9H-carbazol-3-yl)-9H-carbazol-9-yl] phenyl}benzofuro[3,2-d]pyrimidine, and 8-(1,1'-biphenyl-4-yl)-4-(3,5-di-9H-carbazol-9-yl-phenyl)benzofuro[3,2-d] pyrimidine; and organic compounds having a triazine skeleton, such as 2-[3'-(9,9-dimethyl-9H-fluoren-2-yl)-1,1'-biphenyl-3-yl]-4,6-diphenyl-1,3,5-triazine (abbreviation: mFBPTzn), 5-[3-(4,6-diphenyl-1,3,5-triazin-2yl)phenyl]-7,7-dimethyl-5H,7H-indeno[2,1-b]carbazole (abbreviation: mINc(II)PTzn), 2-[(1,1'-biphenyl)-4-yl]-4-phenyl-6-[9,9'-spirobi(9H-fluoren)-2-yl]-1,3,5-triazine (abbreviation: BP-SFTzn), 2-{3-[3-(benzo[b]naphtho[1,2-d]furan-8-yl)phenyl]phenyl}-4,6-diphenyl-1,3,5-triazine (abbreviation: mBnfBPTzn), 2-{3-[3-(benzo[b]naphtho[1,2-d]furan-6-yl) phenyl]phenyl}-4,6-diphenyl-1,3,5-triazine (abbreviation: mBnfBPTzn-02), 2-{4-[3-(N-phenyl-9H-carbazol-3-yl)-9H-carbazol-9-yl]phenyl}-4,6-diphenyl-1,3,5-triazine (abbreviation: PCCzPTzn), 9-[3-(4,6-diphenyl-1,3,5-triazin-2-yl)phenyl]-9'-phenyl-2,3'-bi-9H-carbazole (abbreviation: mPCCzPTzn-02), 2-[3'-(9,9-dimethyl-9H-fluoren-2-yl)-1,1'-biphenyl-3-yl]-4,6-diphenyl-1,3,5-triazine (abbreviation: mFBPTzn), 5-[3-(4,6-diphenyl-1,3,5-triazin-2-yl)phenyl]-7,7-dimethyl-5H,7H-indeno[2,1-b]carbazole (abbreviation: mINc(II)PTzn), 2-{3-[3-(dibenzothiophen-4-yl)phenyl]phenyl}-4,6-diphenyl-1,3,5-triazine (abbreviation: mDBtBPTzn), 2,4,6-tris[3'-(pyridin-3-yl)biphenyl-3-yl]-1,3,5-triazine (abbreviation: TmPPPyTz), 2-[3-(2,6-dimethyl-3-pyridinyl)-5-(9-phenanthryl)phenyl]-4,6-diphenyl-1,3,5-triazine (abbreviation: mPn-mDMePyPTzn), 11-(4-[1,1'-diphenyl]-4-yl-6-phenyl-1,3,5-triazin-2-yl)-11,12-dihydro-12-phenyl-indolo[2,3-a]carbazole (abbreviation: BP-Icz(II) Tzn), 2-[3'-(triphenylen-2-yl)-1,1'-biphenyl-3-yl]-4,6-diphenyl'1,3,5-triazine (abbreviation: mTpBPTzn), 9-[4-(4,6-diphenyl-1,3,5-triazin-2-yl)-2-dibenzothiophenyl]-2-phenyl-9H-carbazole (abbreviation: PCDBfTzn), and 2-[1,1'-biphenyl]-3-yl-4-phenyl-6-(8-[1,1': 4',1"-terphenyl]-4-yl-1-dibenzofuranyl)-1,3,5-triazine (abbreviation: mBP-TPDBfTzn). Among the above, the organic compounds having a heteroaromatic ring having a diazine skeleton, the organic compounds having a heteroaromatic ring having a pyridine skeleton, and the organic compounds having a heteroaromatic ring having a triazine skeleton are highly reliable and preferred. In particular, the organic compound having a heteroaromatic ring having a diazine (pyrimidine or pyrazine) skeleton and the organic compound having a heteroaromatic ring having a triazine skeleton have a high electron-transport property to contribute to a reduction in driving voltage.

Note that the electron-transport layer 114 having this structure also serves as the electron-injection layer 115 in some cases.

A layer containing an alkali metal, an alkaline earth metal, a compound thereof, or a complex thereof such as lithium fluoride (LiF), cesium fluoride (CsF), calcium fluoride ($CaF_2$), or (8-quinolinato)-lithium (abbreviation: Liq) is preferably provided as the electron-injection layer 115 between the electron-transport layer 114 and the common electrode (cathode) 102. Alternatively, a film formed by co-evaporation of ytterbium (Yb) and lithium is preferable. As the electron-injection layer 115, an electride or a layer that is formed using a substance having an electron-transport property and that contains an alkali metal, an alkaline earth metal, or a compound thereof may be used. Examples of the electride include a substance in which electrons are added at high concentration to calcium oxide-aluminum oxide.

Note that as the electron-injection layer 115, it is possible to use a layer that contains a substance having an electron-transport property (preferably an organic compound having a bipyridine skeleton) and contains a fluoride of the alkali metal or the alkaline earth metal at a concentration higher than or equal to that at which the electron-injection layer 115 becomes in a microcrystalline state (50 wt % or higher). Since the layer has a low refractive index, an organic EL device having higher external quantum efficiency can be provided.

As a substance of the cathode, any of metals, alloys, and electrically conductive compounds with a low work function (specifically, lower than or equal to 3.8 eV), mixtures thereof, and the like can be used. Specific examples of such a cathode material include elements belonging to Group 1 and Group 2 of the periodic table, such as alkali metals (e.g., lithium (Li) and cesium (Cs)), magnesium (Mg), calcium (Ca), and strontium (Sr), alloys containing these elements (e.g., MgAg and AlLi), rare earth metals such as europium (Eu) and ytterbium (Yb), and alloys containing these rare earth metals. However, when the electron-injection layer is provided between the cathode and the electron-transport layer, any of a variety of conductive materials such as Al, Ag, ITO, and indium oxide-tin oxide containing silicon or silicon oxide can be used for the cathode regardless of the work function.

Films of these conductive materials can be deposited by a dry process such as a vacuum evaporation method or a sputtering method, an ink-jet method, a spin coating method, or the like. Alternatively, the films may be formed by a wet process using a sol-gel method or a wet process using a paste of a metal material.

A variety of methods can be used as a method for forming the EL layer 103 regardless of whether it is a dry process or a wet process. For example, a vacuum evaporation method, a gravure printing method, an offset printing method, a screen printing method, an ink-jet method, a spin coating method, or the like may be used.

Different film formation methods may be used to form the electrodes or the layers described above.

The structure of the layers provided between the anode and the cathode is not limited to the above-described structure. However, a light-emitting region where holes and electrons recombine is preferably positioned away from the anode and the cathode so as to inhibit quenching due to the proximity of the light-emitting region and a metal used for electrodes or carrier-injection layers.

Furthermore, in order to inhibit energy transfer from an exciton generated in the light-emitting layer, it is preferable to form the hole-transport layer or the electron-transport layer that is in contact with the light-emitting layer 113, particularly a carrier-transport layer closer to the recombination region in the light-emitting layer 113, using the light-emitting material of the light-emitting layer or a substance having a wider band gap than the light-emitting material contained in the light-emitting layer.

The structure of this embodiment can be used in combination with any of the structures of the other embodiments as appropriate.

Embodiment 5

Figures 11A, 11B:
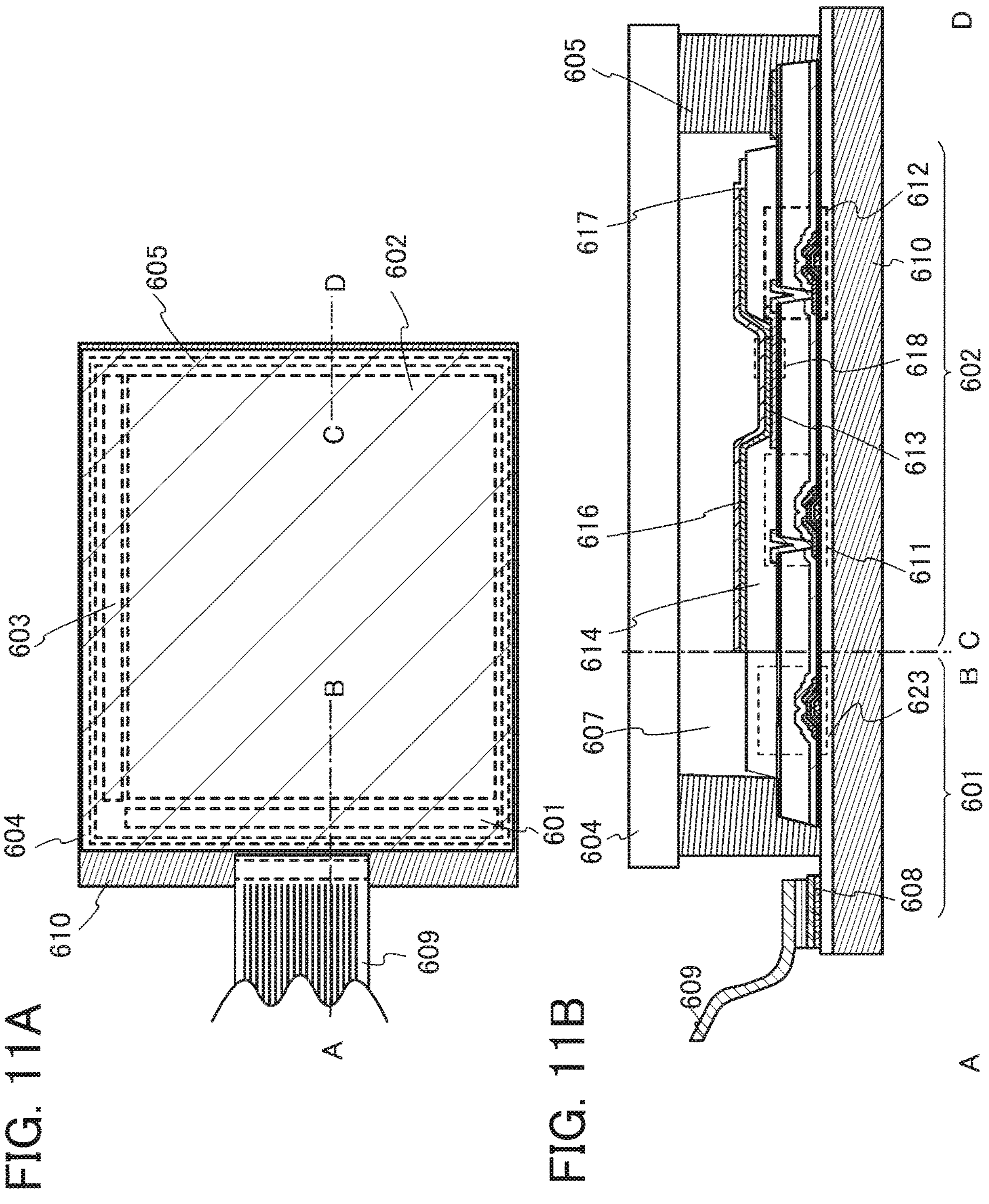
FIG. 11A and FIG. 11B are diagrams illustrating an active matrix light-emitting apparatus.

In this embodiment, a light-emitting apparatus using the organic EL device manufactured by the method for manufacturing an organic EL device described in Embodiment 2 and Embodiment 3 is described with reference to FIG. 11A and FIG. 11B. Note that FIG. 11A is a top view of the light-emitting apparatus and FIG. 11B is a cross-sectional view taken along the dashed-dotted line A-B and the dashed-dotted line C-D in FIG. 11A. This light-emitting apparatus includes a driver circuit portion (source line driver circuit) 601, a pixel portion 602, and a driver circuit portion (gate line driver circuit) 603, which are to control light emission of an organic EL device and illustrated with dotted lines. Reference numeral 604 denotes a sealing substrate; 605, a sealing material; and 607, a space surrounded by the sealing material 605.

A lead wiring 608 is a wiring for transmitting signals to be input to the source line driver circuit 601 and the gate line driver circuit 603 and receives a video signal, a clock signal, a start signal, a reset signal, or the like from an FPC (flexible printed circuit) 609 serving as an external input terminal. Although only the FPC is illustrated here, a printed wiring board (PWB) may be attached to the FPC. The light-emitting apparatus in this specification includes, in its category, not only the light-emitting apparatus itself but also the light-emitting apparatus provided with the FPC or the PWB.

Next, a cross-sectional structure will be described with reference to FIG. 11B. The driver circuit portions and the pixel portion are formed over an element substrate 610; here, the source line driver circuit 601, which is a driver circuit portion, and one pixel in the pixel portion 602 are illustrated.

The element substrate 610 is formed using a substrate containing glass, quartz, an organic resin, a metal, an alloy, a semiconductor, or the like or a plastic substrate formed of FRP (Fiber Reinforced Plastics), PVF (polyvinyl fluoride), polyester, an acrylic resin, or the like.

The structure of transistors used in pixels or driver circuits is not particularly limited. For example, inverted staggered transistors may be used, or staggered transistors may be used. Furthermore, top-gate transistors or bottom-gate transistors may be used. A semiconductor material used for the transistors is not particularly limited, and for example, silicon, germanium, silicon carbide, gallium nitride, or the like can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used because degradation of the transistor characteristics can be inhibited.

Here, an oxide semiconductor is preferably used for semiconductor devices such as transistors provided in the pixels or driver circuits described above and transistors used for touch sensors described later, for example. In particular, an oxide semiconductor having a wider band gap than silicon is preferably used. When an oxide semiconductor having a wider band gap than silicon is used, the off-state current of the transistors can be reduced.

The oxide semiconductor preferably contains at least indium (In) or zinc (Zn). Further preferably, the oxide semiconductor contains an oxide represented by an In-M-Zn-based oxide (M represents a metal such as Al, Ti, Ga, Ge, Y, Zr, Sn, La, Ce, or Hf).

As a semiconductor layer, it is particularly preferable to use an oxide semiconductor film including a plurality of crystal parts whose c-axes are aligned perpendicular to a surface on which the semiconductor layer is formed or the top surface of the semiconductor layer and having no grain boundary between adjacent crystal parts.

The use of such materials for the semiconductor layer makes it possible to provide a highly reliable transistor in which a change in the electrical characteristics is inhibited.

Charge accumulated in a capacitor through a transistor including the above-described semiconductor layer can be held for a long time because of the low off-state current of the transistor. When such a transistor is used in a pixel, operation of a driver circuit can be stopped while a gray scale of an image displayed on each display region is maintained. As a result, an electronic appliance with extremely low power consumption can be obtained.

For stable characteristics of the transistor and the like, a base film is preferably provided. The base film can be formed with a single layer or stacked layers using an inorganic insulating film such as a silicon oxide film, a silicon nitride film, a silicon oxynitride film, or a silicon nitride oxide film. The base film can be formed by a sputtering method, a CVD (Chemical Vapor Deposition) method (e.g., a plasma CVD method, a thermal CVD method, or an MOCVD (Metal Organic CVD) method), an ALD (Atomic Layer Deposition) method, a coating method, a printing method, or the like. Note that the base film is not necessarily provided when not needed.

Note that an FET 623 is illustrated as a transistor formed in the source line driver circuit 601. The driver circuit may be formed with any of a variety of circuits such as a CMOS circuit, a PMOS circuit, or an NMOS circuit. Although a driver-integrated type in which the driver circuit is formed over the substrate is described in this embodiment, the driver circuit is not necessarily formed over the substrate, and the driver circuit can be formed outside, not over the substrate.

The pixel portion 602 includes a plurality of pixels including a switching FET 611, a current controlling FET 612, and a first electrode 613 electrically connected to a drain of the current controlling FET 612; however, without being limited thereto, a pixel portion in which three or more FETs and a capacitor are combined may be employed.

Note that an insulator 614 is formed to cover an end portion of the first electrode 613. Here, the insulator 614 can be formed using a positive photosensitive acrylic resin film.

In order to improve the coverage with an EL layer or the like which is formed later, the insulator 614 is formed to have a curved surface with curvature at its upper or lower end portion. For example, in the case where a positive photosensitive acrylic resin is used as a material of the insulator 614, only the upper end portion of the insulator 614 preferably has a curved surface with a curvature radius (0.2 μm to 3 μm). As the insulator 614, either a negative photosensitive resin or a positive photosensitive resin can be used.

An EL layer 616 and a second electrode 617 are formed over the first electrode 613. Here, the first electrode 613 functions as an anode. A material having a high work function is desirably used as a material that can be used for the anode. For example, a single-layer film of an ITO film, an indium tin oxide film containing silicon, an indium oxide film containing zinc oxide at 2 to 20 wt %, a titanium nitride film, a chromium film, a tungsten film, a Zn film, a Pt film, or the like, a stack with a film containing silver as its main component, a stack of a titanium nitride film and a film containing aluminum as its main component, a stack of three layers of a titanium nitride film, a film containing aluminum as its main component, and a titanium nitride film, or the like can be used. The stacked-layer structure enables low wiring resistance, favorable ohmic contact, and a function as an anode.

The EL layer 616 is formed by any of a variety of methods such as an evaporation method using an evaporation mask, an ink-jet method, and a spin coating method. The EL layer 616 has the structure described in Embodiment 1 and Embodiment 3.

As a material used for the second electrode 617, which is formed over the EL layer 616, a material having a low work function (e.g., Al, Mg, Li, and Ca, or an alloy or a compound thereof, such as MgAg, MgIn, and AlLi) is preferably used. In the case where light generated in the EL layer 616 passes through the second electrode 617, a stack of a thin metal film or alloy film and a transparent conductive film (e.g., ITO, indium oxide containing zinc oxide at 2 to 20 wt %, an indium tin oxide containing silicon, or zinc oxide (ZnO)) is preferably used for the second electrode 617.

Note that the organic EL device is formed with the first electrode 613, the EL layer 616, and the second electrode 617. The organic EL device is manufactured by the method for manufacturing an organic EL device described in Embodiment 2 and Embodiment 3. In the light-emitting apparatus of this embodiment, the pixel portion, which includes a plurality of organic EL devices, may include both the organic EL device manufactured by the method for manufacturing an organic EL device described in Embodiment 2 and Embodiment 3 and an organic EL device having another structure. In that case, in the light-emitting apparatus of one embodiment of the present invention, a common hole-transport layer can be used for organic EL devices that emit light with different wavelengths, allowing the light-emitting apparatus to be manufactured in a simple process at low costs.

The sealing substrate 604 is attached to the element substrate 610 with the sealing material 605, so that an organic EL device 618 is provided in the space 607 surrounded by the element substrate 610, the sealing substrate 604, and the sealing material 605. The space 607 is filled with a filler, and may be filled with an inert gas (such as nitrogen or argon) or the sealing material. It is preferable that the sealing substrate be provided with a depressed portion and a drying agent be provided in the depressed portion, in which case deterioration due to influence of moisture can be inhibited.

An epoxy resin or glass frit is preferably used for the sealing material 605. It is desirable that such a material transmit moisture or oxygen as little as possible. As the sealing substrate 604, a glass substrate, a quartz substrate, or a plastic substrate formed of FRP (Fiber Reinforced Plastics), PVF (polyvinyl fluoride), polyester, an acrylic resin, or the like can be used.

Although not illustrated in FIG. 11A and FIG. 11B, a protective film may be provided over the cathode. As the protective film, an organic resin film or an inorganic insulating film is formed. The protective film may be formed so as to cover an exposed portion of the sealing material 605. The protective film can be provided so as to cover the surfaces and side surfaces of the pair of substrates and the exposed side surfaces of a sealing layer, an insulating layer, and the like.

The protective film can be formed using a material that does not easily transmit an impurity such as water. Thus, diffusion of an impurity such as water from the outside into the inside can be effectively inhibited.

As a material of the protective film, an oxide, a nitride, a fluoride, a sulfide, a ternary compound, a metal, a polymer, or the like can be used. For example, a material containing aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, indium oxide, or the like; a material containing aluminum nitride, hafnium nitride, silicon nitride, tantalum nitride, titanium nitride, niobium nitride, molybdenum nitride, zirconium nitride, gallium nitride, or the like; or a material containing a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, an oxide containing yttrium and zirconium, or the like can be used.

The protective film is preferably formed using a film formation method with favorable step coverage. One of such methods is an atomic layer deposition (ALD) method. A material that can be deposited by an ALD method is preferably used for the protective film. A dense protective film having reduced defects such as cracks or pinholes or a uniform thickness can be formed by an ALD method. Furthermore, damage caused to a process member in forming the protective film can be reduced.

By an ALD method, a uniform protective film with few defects can be formed even on, for example, a surface with a complex uneven shape or upper, side, and lower surfaces of a touch panel.

As described above, the light-emitting apparatus fabricated using the organic EL device manufactured by the method for manufacturing an organic EL device described in Embodiment 2 and Embodiment 3 can be obtained.

Since the organic EL device manufactured by the method for manufacturing an organic EL device described in Embodiment 2 and Embodiment 3 is used for the light-emitting apparatus in this embodiment, the light-emitting apparatus can have favorable characteristics.

Figures 12A, 12B:
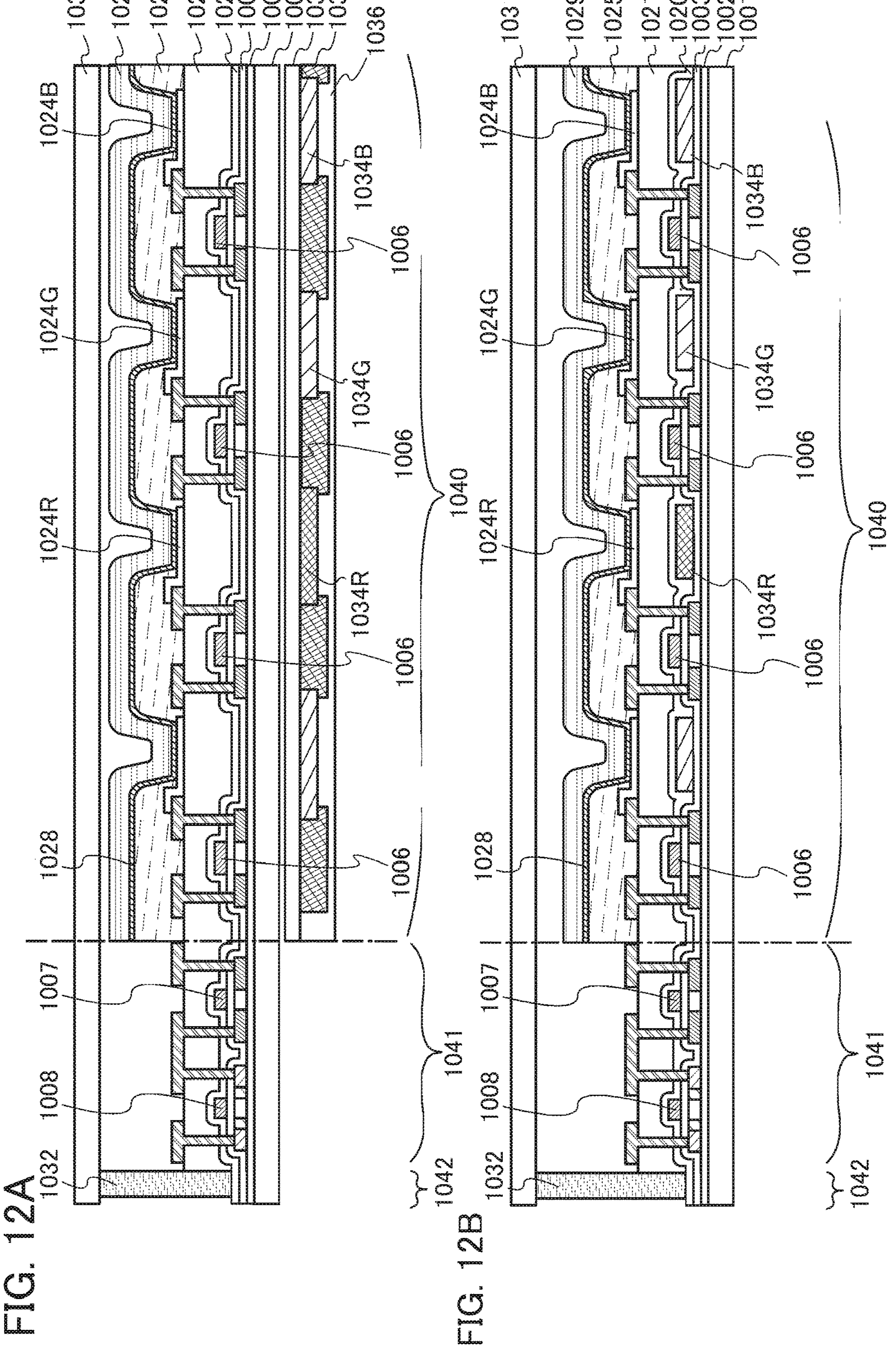
FIG. 12A and FIG. 12B are diagrams each illustrating an active matrix light-emitting apparatus.

FIG. 12A and FIG. 12B each illustrate an example of a light-emitting apparatus that includes coloring layers (color filters) and the like to improve color purity. FIG. 12A illustrates a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, first electrodes 1024R, 1024G, and 1024B of organic EL devices, a partition 1025, an EL layer 1028, a common electrode (cathode) 1029 of the organic EL devices, a sealing substrate 1031, a sealing material 1032, and the like.

In FIG. 12A, coloring layers (a red coloring layer 1034R, a green coloring layer 1034G, and a blue coloring layer 1034B) are provided on a transparent base material 1033. A black matrix 1035 may be additionally provided. The transparent base material 1033 provided with the coloring layers and the black matrix is aligned and fixed to the substrate 1001. Note that the coloring layers and the black matrix 1035 are covered with an overcoat layer 1036.

FIG. 12B illustrates an example in which the coloring layers (the red coloring layer 1034R, the green coloring layer 1034G, and the blue coloring layer 1034B) are formed between the gate insulating film 1003 and the first interlayer insulating film 1020. As in the structure, the coloring layers may be provided between the substrate 1001 and the sealing substrate 1031.

Figure 13:
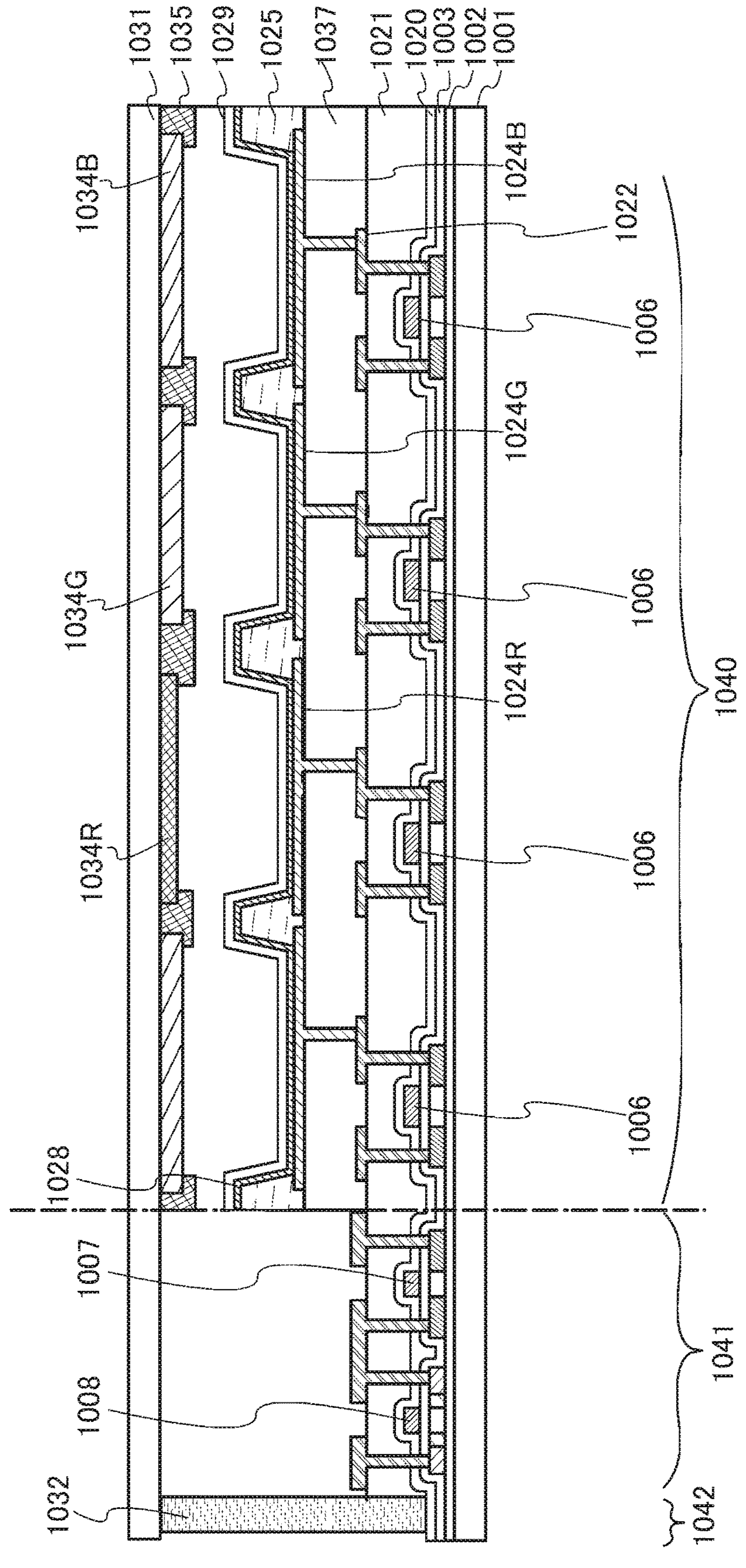
FIG. 13 is a diagram illustrating an active matrix light-emitting apparatus.

The above-described light-emitting apparatus has a structure in which light is extracted from the substrate 1001 side where FETs are formed (a bottom-emission structure), but may have a structure in which light is extracted from the sealing substrate 1031 side (a top-emission structure). FIG. 13 is a cross-sectional view of a light-emitting apparatus having a top-emission structure. In this case, a substrate that does not transmit light can be used as the substrate 1001. The process up to the step of forming a connection electrode that connects the FET and the first electrode of the organic EL device is performed in a manner similar to that of the light-emitting apparatus having a bottom-emission structure. Then, a third interlayer insulating film 1037 is formed to cover an electrode 1022. This insulating film may have a planarization function. The third interlayer insulating film 1037 can be formed using a material similar to that for the second interlayer insulating film, and can alternatively be formed using any of other known materials.

The first electrodes 1024R, 1024G, and 1024B of the organic EL devices each serve as an anode here, but may serve as a cathode. Furthermore, in the case of a light-emitting apparatus having a top-emission structure as illustrated in FIG. 13, the anodes are preferably reflective electrodes. The EL layer 1028 is formed to have a structure similar to the structure of the EL layer 103 described in Embodiment 1.

In the case of a top-emission structure as illustrated in FIG. 13, sealing can be performed with the sealing substrate 1031 on which the coloring layers (the red coloring layer 1034R, the green coloring layer 1034G, and the blue coloring layer 1034B) are provided. The sealing substrate 1031 may be provided with the black matrix 1035 that is positioned between pixels. The coloring layers (the red coloring layer 1034R, the green coloring layer 1034G, and the blue coloring layer 1034B) or the black matrix may be covered with the overcoat layer (not illustrated). Note that a light-transmitting substrate is used as the sealing substrate 1031.

In the light-emitting apparatus having a top-emission structure, a microcavity structure can be suitably employed. An organic EL device with a microcavity structure is formed with the use of an electrode including a reflective electrode as one electrode and a transflective electrode as the other electrode. At least an EL layer is provided between the reflective electrode and the transflective electrode, and the EL layer includes at least a light-emitting layer serving as a light-emitting region.

Note that the reflective electrode has a visible light reflectivity of 40% to 100%, preferably 70% to 100%, and a resistivity of $1\times10^{-2}$ Ωcm or lower. In addition, the transflective electrode has a visible light reflectivity of 20% to 80%, preferably 40% to 70%, and a resistivity of $1\times10^{-2}$ Ωcm or lower.

Light emitted from the light-emitting layer included in the EL layer is reflected and resonated by the reflective electrode and the transflective electrode.

In the organic EL device, by changing the thickness of the transparent conductive film, the composite material, the carrier-transport material, or the like, the optical path length between the reflective electrode and the transflective electrode can be changed. Thus, light with a wavelength that is resonated between the reflective electrode and the transflective electrode can be intensified while light with a wavelength that is not resonated therebetween can be attenuated.

Note that light that is reflected back by the reflective electrode (first reflected light) considerably interferes with light that directly enters the transflective electrode from the light-emitting layer (first incident light). For this reason, the optical path length between the reflective electrode and the light-emitting layer is preferably adjusted to $(2n-1)\lambda/4$ (n is a natural number of 1 or larger and λ is a wavelength of light to be amplified). By adjusting the optical path length, the phases of the first reflected light and the first incident light can be aligned with each other and the light emitted from the light-emitting layer can be further amplified.

Note that in the above structure, the EL layer may include a plurality of light-emitting layers or may include a single light-emitting layer; for example, in combination with the structure of the above-described tandem organic EL device, a plurality of EL layers each including a single or a plurality of light-emitting layer(s) may be provided in one organic EL device with a charge-generation layer interposed between the EL layers.

With the microcavity structure, emission intensity with a specific wavelength in the front direction can be increased, whereby power consumption can be reduced. Note that in the case of a light-emitting apparatus that displays a video with subpixels of four colors, red, yellow, green, and blue, the light-emitting apparatus can have excellent characteristics because the luminance can be increased owing to yellow light emission and each subpixel can employ a microcavity structure suitable for wavelengths of the corresponding color.

Since the organic EL device manufactured by the method for manufacturing an organic EL device described in Embodiment 2 and Embodiment 3 is used for the light-emitting apparatus in this embodiment, the light-emitting apparatus can have favorable characteristics. In the light-emitting apparatus described above, many minute organic EL devices arranged in a matrix can each be controlled; thus, the light-emitting apparatus can be suitably used as a display apparatus for displaying images.

This embodiment can be freely combined with any of the other embodiments.

Embodiment 6

In this embodiment, examples of electronic appliances each including the organic EL device manufactured by the method for manufacturing an organic EL device described in Embodiment 2 and Embodiment 3 are described.

Examples of the electronic appliance including the above organic EL device include television devices (also referred to as TV or television receivers), monitors for computers and the like, digital cameras, digital video cameras, digital photo frames, cellular phones (also referred to as mobile phones or mobile phone devices), portable game machines, portable information terminals, audio playback devices, and large game machines such as pachinko machines. Specific examples of these electronic appliances are described below.

FIG. 14A illustrates an example of a television device. In the television device, a display portion 7103 is incorporated in a housing 7101. Here, the housing 7101 is supported by a stand 7105. Videos can be displayed on the display portion 7103, and in the display portion 7103, the organic EL devices manufactured by the method for manufacturing an organic EL device described in Embodiment 2 and Embodiment 3 are arranged in a matrix.

The television device can be operated with an operation switch of the housing 7101 or a separate remote controller 7110. With operation keys 7109 of the remote controller 7110, channels and volume can be controlled and videos displayed on the display portion 7103 can be controlled. Furthermore, the remote controller 7110 may be provided with a display portion 7107 for displaying information output from the remote controller 7110. The organic EL devices manufactured by the method for manufacturing an organic EL device described in Embodiment 2 and Embodiment 3 may also be arranged in a matrix in the display portion 7107.

Note that the television device is provided with a receiver, a modem, and the like. With the use of the receiver, a general television broadcast can be received. Moreover, when the television device is connected to a communication network with or without wires via the modem, one-way (from a sender to a receiver) or two-way (between a sender and a receiver or between receivers) information communication can be performed.

FIG. 14B1 illustrates a computer, which includes a main body 7201, a housing 7202, a display portion 7203, a keyboard 7204, an external connection port 7205, a pointing device 7206, and the like. Note that this computer is fabricated using the organic EL devices manufactured by the method for manufacturing an organic EL device described in Embodiment 2 and Embodiment 3 and arranged in a matrix in the display portion 7203. The computer illustrated in FIG. 14B1 may have a structure illustrated in FIG. 14B2. A computer illustrated in FIG. 14B2 is provided with a display portion 7210 instead of the keyboard 7204 and the pointing device 7206. The display portion 7210 is a touch panel, and input operation can be performed by touching display for input on the display portion 7210 with a finger or a dedicated pen. The display portion 7210 can also display images other than the display for input. The display portion 7203 may also be a touch panel. Connecting the two screens with a hinge can prevent troubles; for example, the screens can be prevented from being cracked or broken while the computer is being stored or carried.

FIG. 14C illustrates an example of a portable terminal. A cellular phone is provided with a display portion 7402 incorporated in a housing 7401, operation buttons 7403, an external connection port 7404, a speaker 7405, a microphone 7406, and the like. Note that the cellular phone has the display portion 7402 in which the organic EL devices manufactured by the method for manufacturing an organic EL device described in Embodiment 2 and Embodiment 3 are arranged in a matrix.

When the display portion 7402 of the portable terminal illustrated in FIG. 14C is touched with a finger or the like, information can be input. In this case, operations such as making a call and creating an e-mail can be performed by touching the display portion 7402 with a finger or the like.

The display portion 7402 has mainly three screen modes. The first mode is a display mode mainly for displaying images, and the second mode is an input mode mainly for inputting information such as text. The third mode is a display-and-input mode in which the two modes, the display mode and the input mode, are combined.

For example, in the case of making a call or creating an e-mail, a text input mode mainly for inputting text is selected for the display portion 7402 so that text displayed on the screen can be input. In this case, it is preferable to display a keyboard or number buttons on almost the entire screen of the display portion 7402.

When a sensing device including a sensor such as a gyroscope sensor or an acceleration sensor for detecting inclination is provided inside the portable terminal, display on the screen of the display portion 7402 can be automatically changed by determining the orientation of the portable terminal (whether the portable terminal is placed horizontally or vertically).

The screen modes are switched by touching the display portion 7402 or operating the operation buttons 7403 of the housing 7401. Alternatively, the screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal sensed by an optical sensor in the display portion 7402 is sensed, the screen mode may be controlled so as to be switched from the input mode to the display mode.

The display portion 7402 may also function as an image sensor. For example, an image of a palm print, a fingerprint, or the like is taken when the display portion 7402 is touched with the palm or the finger, whereby personal authentication can be performed. Furthermore, by providing a backlight or a sensing light source that emits near-infrared light in the display portion, an image of a finger vein, a palm vein, or the like can be taken.

As described above, the application range of the light-emitting apparatus including the organic EL device manufactured by the method for manufacturing an organic EL device described in Embodiment 2 and Embodiment 3 is so wide that this light-emitting apparatus can be used in electronic appliances in a variety of fields.

Figure 15A:
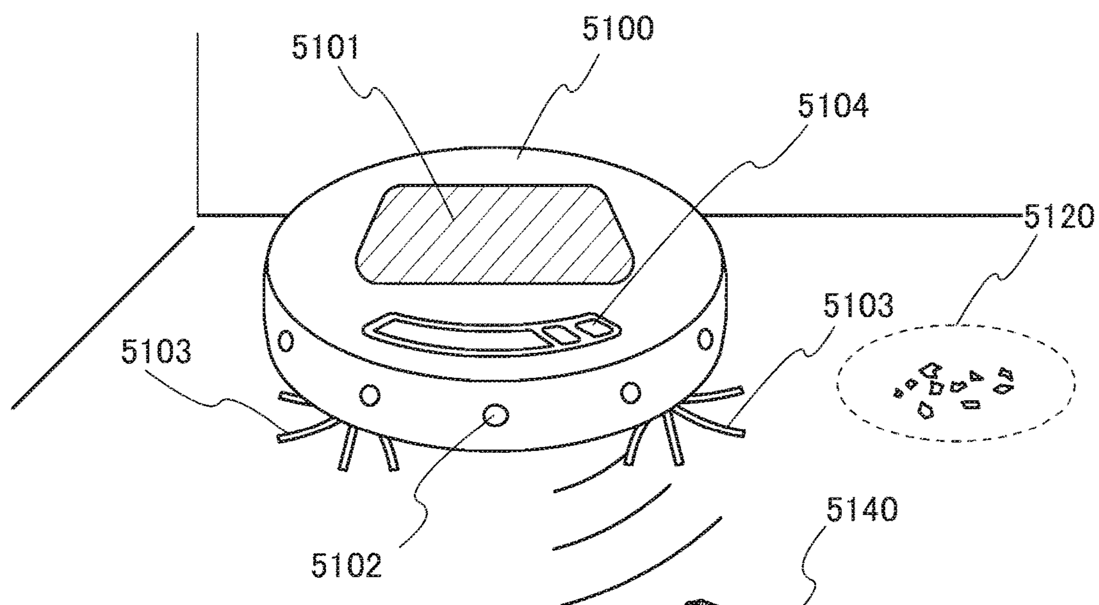
FIG. 15A, FIG. 15B, and FIG. 15C are diagrams illustrating electronic devices.

FIG. 15A is a schematic view illustrating an example of a cleaning robot.

A cleaning robot 5100 includes a display 5101 on its top surface, a plurality of cameras 5102 on its side surface, a brush 5103, and operation buttons 5104. Although not illustrated, the bottom surface of the cleaning robot 5100 is provided with a tire, an inlet, and the like. Furthermore, the cleaning robot 5100 includes various sensors such as an infrared sensor, an ultrasonic sensor, an acceleration sensor, a piezoelectric sensor, an optical sensor, and a gyroscope sensor. The cleaning robot 5100 has a wireless communication means.

The cleaning robot 5100 is self-propelled, detects dust 5120, and vacuums the dust through the inlet provided on the bottom surface.

The cleaning robot 5100 can determine whether there is an obstacle such as a wall, furniture, or a step by analyzing images taken by the cameras 5102. When an object that is likely to be caught in the brush 5103, such as a wire, is sensed by image analysis, the rotation of the brush 5103 can be stopped.

The display 5101 can display the remaining capacity of a battery, the amount of vacuumed dust, and the like. The display 5101 may display a path on which the cleaning robot 5100 has run. The display 5101 may be a touch panel, and the operation buttons 5104 may be provided on the display 5101.

The cleaning robot 5100 can communicate with a portable electronic appliance 5140 such as a smartphone. Images taken by the cameras 5102 can be displayed on the portable electronic appliance 5140. Accordingly, an owner of the cleaning robot 5100 can monitor his/her room even when the owner is not at home. The owner can also check the display on the display 5101 by the portable electronic appliance such as a smartphone.

The light-emitting apparatus of one embodiment of the present invention can be used for the display 5101.

Figure 15B:
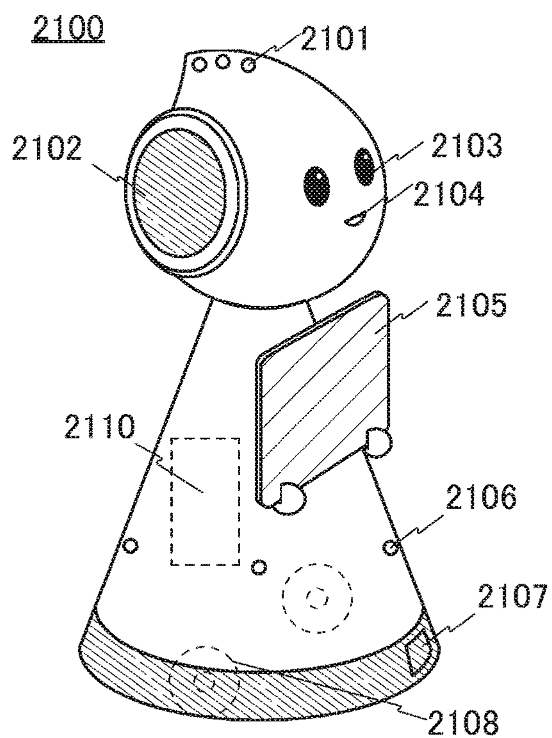

A robot 2100 illustrated in FIG. 15B includes an arithmetic device 2110, an illuminance sensor 2101, a microphone 2102, an upper camera 2103, a speaker 2104, a display 2105, a lower camera 2106, an obstacle sensor 2107, and a moving mechanism 2108.

The microphone 2102 has a function of sensing a speaking voice of a user, an environmental sound, and the like. The speaker 2104 has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel. Moreover, the display 2105 may be a detachable information terminal, in which case charging and data communication can be performed when the display 2105 is set at the home position of the robot 2100.

The upper camera 2103 and the lower camera 2106 each have a function of taking an image of the surroundings of the robot 2100. The obstacle sensor 2107 can detect an obstacle in the direction where the robot 2100 advances with the moving mechanism 2108. The robot 2100 can move safely by recognizing the surroundings with the upper camera 2103, the lower camera 2106, and the obstacle sensor 2107. The light-emitting apparatus of one embodiment of the present invention can be used for the display 2105.

Figure 15C:
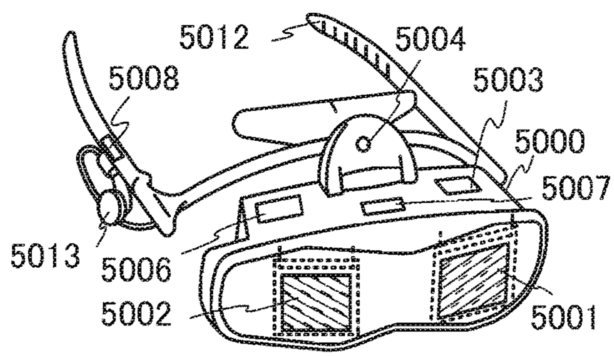

FIG. 15C illustrates an example of a goggle-type display. The goggle-type display includes, for example, a housing 5000, a display portion 5001, a speaker 5003, an LED lamp 5004, a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, a second display portion 5002, a support portion 5012, and an earphone 5013.

The light-emitting apparatus of one embodiment of the present invention can be used for the display portion 5001 and the second display portion 5002.

Figure 16:
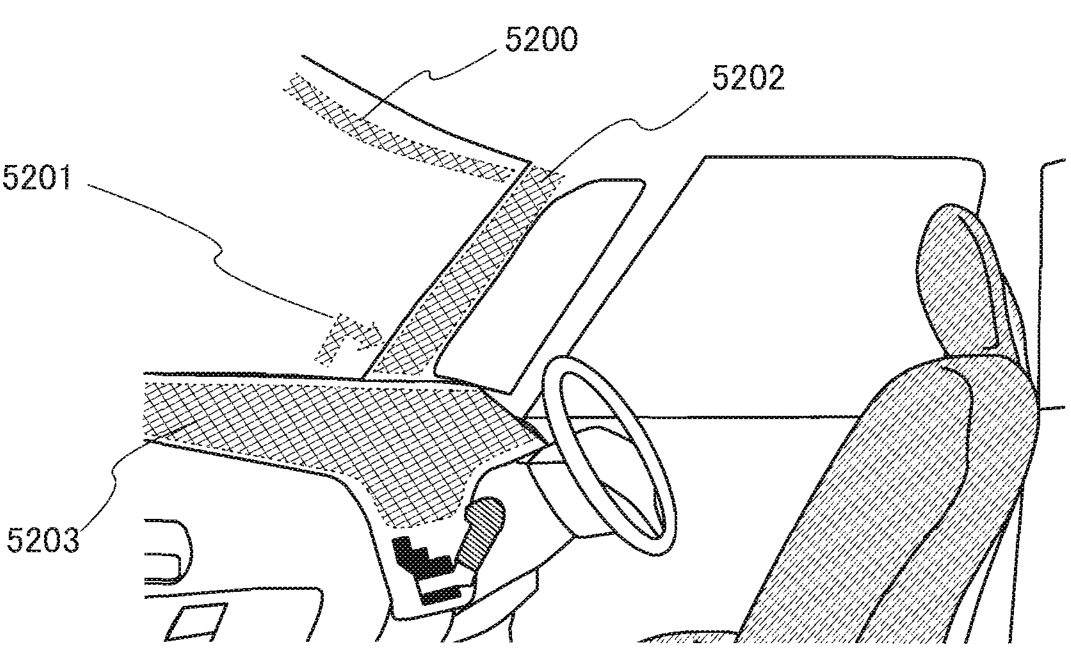
FIG. 16 is a diagram illustrating in-vehicle display apparatuses and lighting devices.

The organic EL device manufactured by the method for manufacturing an organic EL device described in Embodiment 2 and Embodiment 3 can also be used for an automobile windshield or an automobile dashboard. FIG. 16 illustrates a mode in which the organic EL devices manufactured by the method for manufacturing an organic EL device described in Embodiment 2 and Embodiment 3 are used for an automobile windshield or an automobile dashboard. A display region 5200 to a display region 5203 each a display region provided using the organic EL device manufactured by the method for manufacturing an organic EL device described in Embodiment 2 and Embodiment 3.

The display region 5200 and the display region 5201 are display apparatuses which are provided in the automobile windshield and include the organic EL devices manufactured by the method for manufacturing an organic EL device described in Embodiment 2 and Embodiment 3. The organic EL device manufactured by the method for manufacturing an organic EL device described in Embodiment 2 and Embodiment 3 can be formed into what is called a see-through display apparatus, through which the opposite side can be seen, by including an anode and a cathode formed of light-transmitting electrodes. Such see-through display apparatuses can be provided even in the automobile windshield without hindering the view. In the case where a driving transistor or the like is provided, a transistor having a light-transmitting property, such as an organic transistor including an organic semiconductor material or a transistor including an oxide semiconductor, is preferably used.

The display region 5202 is a display apparatus which is provided in a pillar portion and includes the organic EL device manufactured by the method for manufacturing an organic EL device described in Embodiment 2 and Embodiment 3. The display region 5202 can compensate for the view hindered by the pillar by displaying a video taken by an imaging unit provided in the car body. Similarly, the display region 5203 provided in the dashboard portion can compensate for the view hindered by the car body by displaying a video taken by an imaging unit provided on the outside of the automobile; thus, blind areas can be eliminated to enhance the safety. Videos that compensate for the areas which a driver cannot see enable the driver to ensure safety easily and comfortably.

The display region 5203 can provide a variety of kinds of information such as navigation data, the speed, the number of rotations, and air-condition setting. The content or layout of the display can be changed as appropriate according to the user's preference. Note that such information can also be displayed on the display region 5200 to the display region 5202. The display region 5200 to the display region 5203 can also be used as lighting devices.

Figure 17A:
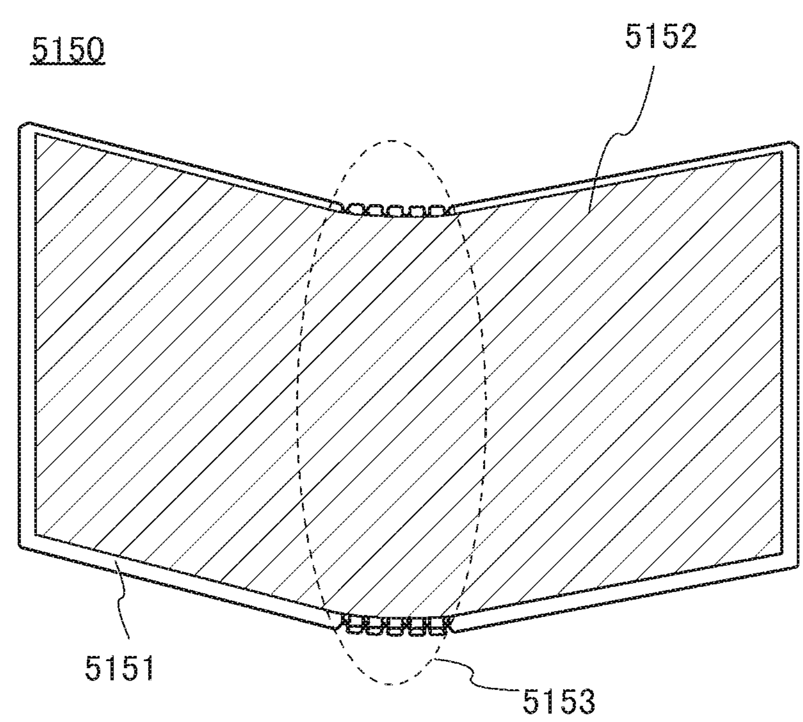
FIG. 17A and FIG. 17B are diagrams illustrating an electronic device.
Figure 17B:
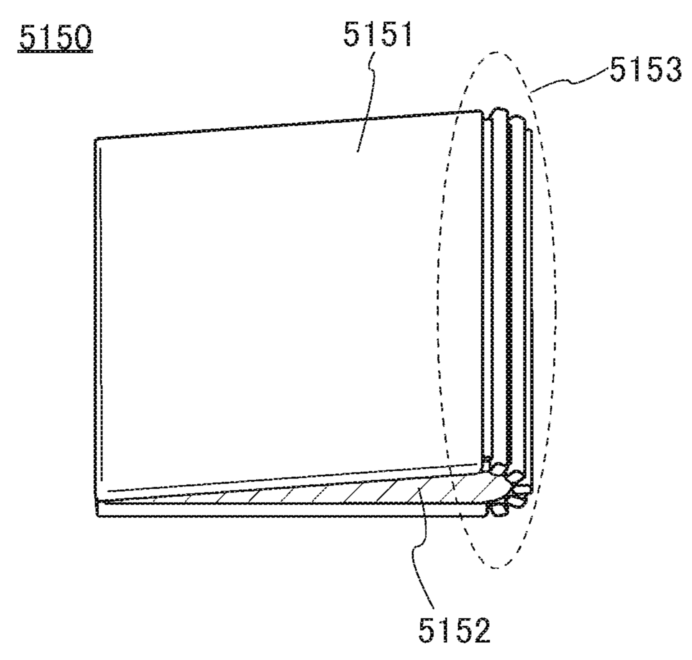

FIG. 17A and FIG. 17B illustrate a foldable portable information terminal 5150. The foldable portable information terminal 5150 includes a housing 5151, a display region 5152, and a bend portion 5153. FIG. 17A illustrates the portable information terminal 5150 that is opened. FIG. 17B illustrates the portable information terminal that is folded. Despite its large display region 5152, the portable information terminal 5150 is compact in size and has excellent portability when folded.

The display region 5152 can be folded in half with the bend portion 5153. The bend portion 5153 includes a flexible member and a plurality of supporting members. When the display region is folded, the flexible member expands. The bend portion 5153 has a radius of curvature greater than or equal to 2 mm, preferably greater than or equal to 3 mm.

Note that the display region 5152 may be a touch panel (an input/output device) including a touch sensor (an input device). The light-emitting apparatus of one embodiment of the present invention can be used for the display region 5152.

Figure 18A:
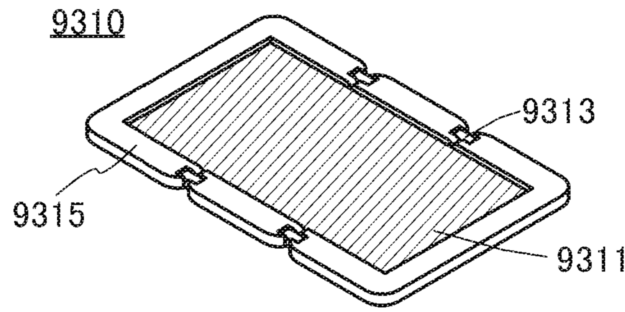
FIG. 18A, FIG. 18B, and FIG. 18C are diagrams illustrating an electronic device.
Figure 18B:
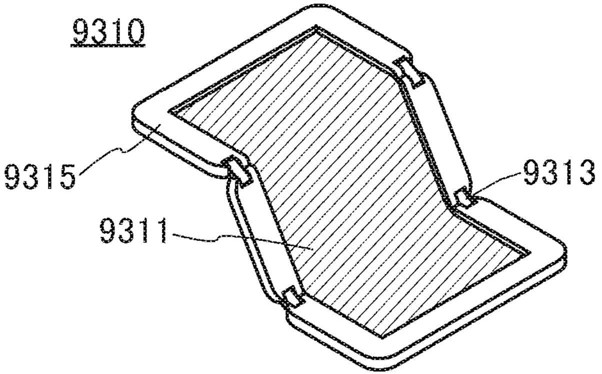
Figure 18C:
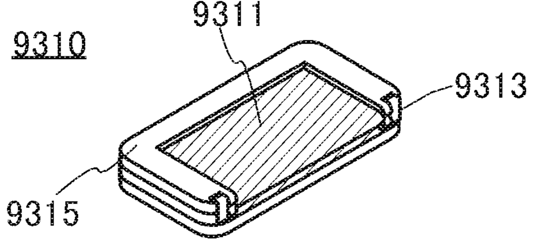

FIG. 18A to FIG. 18C illustrate a foldable portable information terminal 9310. FIG. 18A illustrates the portable information terminal 9310 that is opened. FIG. 18B illustrates the portable information terminal 9310 on the way from either the opened state or the folded state to the other state. FIG. 18C illustrates the portable information terminal 9310 that is folded. The portable information terminal 9310 is highly portable when folded, and is highly browsable when opened because of a seamless large display region.

A display panel 9311 is supported by three housings 9315 joined together by hinges 9313. Note that the display panel 9311 may be a touch panel (an input/output device) including a touch sensor (an input device). By folding the display panel 9311 at the hinges 9313 between two housings 9315, the portable information terminal 9310 can be reversibly changed in shape from the opened state to the folded state. The light-emitting apparatus of one embodiment of the present invention can be used for the display panel 9311.

At least part of any of the structure examples, the drawings corresponding thereto, and the like described in this embodiment can be combined with any of the other structure examples, the other drawings, and the like as appropriate.

At least part of this embodiment can be implemented in combination with the other embodiments described in this specification as appropriate.

EXAMPLE

This example shows examination results of substances remaining in samples in each of which a mask film was formed over an organic semiconductor film and which was then subjected to treatment of removing the mask film by means of water or a liquid containing water as a solvent. Structural formulae of compounds used in this example are shown below.

[Chemical formula 18]

(i)

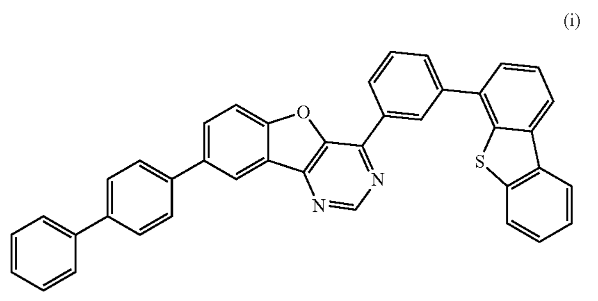

8BP-4mDBtPBfpm (ii)

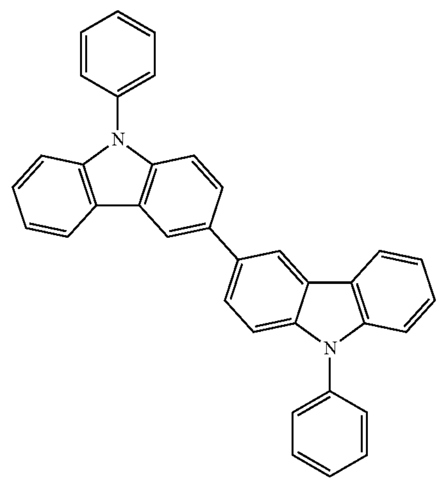

PCCP (iii)

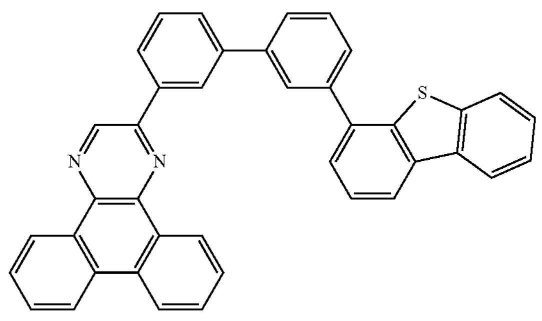

2mDBTBPDBq-II (iv)

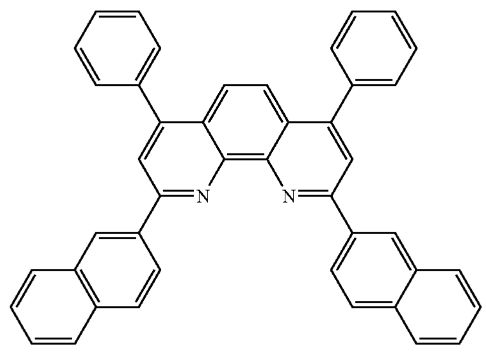

NBPhen

-continued (v)

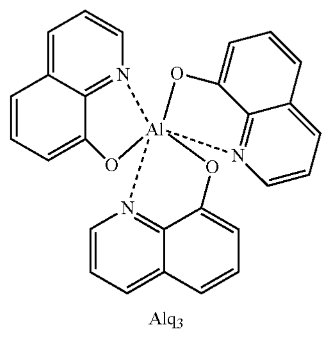

$Alq_3$

Over a glass substrate, Film 1 corresponding to a light-emitting layer and films each corresponding to an electron-transport layer (Film 2 and Film 3) for an organic EL device were stacked and then the mask film was formed, thereby forming each sample. To form Film 1,8 (1,1'-biphenyl-4-yl)-4-[3-(dibenzothiophen-4-yl)phenyl]-[1]benzofuro[3,2-d]pyrimidine (abbreviation: 8BP-4mDBtPBfpm) represented by Structural Formula (i) above and 3,3'-bis(9-phenyl-9H-carbazole) (abbreviation: PCCP) represented by Structural Formula (ii) above were co-evaporated to a thickness of 40 nm such that the weight ratio of 8BP-4mDBtPBfpm to PCCP was 0.6:0.4. To form Film 2 over Film 1,2-[3-(3'-dibenzothiophen-4-yl)biphenyl]dibenzo[f,h]quinoxaline (abbreviation: 2mDBTBPDBq-II) represented by Structural Formula (iii) above was evaporated to a thickness of 20 nm. To form Film 3 over Film 2, 2,9-di(2-naphthyl)-4,7-diphenyl-1,10-phenanthroline (abbreviation: NBPhen) represented by Structural Formula (iv) above was evaporated to a thickness of 15 nm. To form the mask film over Film 3, tris(8-quinolinolato)aluminum (abbreviation: $Alq_3$) represented by Structural Formula (v) above was evaporated to a thickness of 50 nm.

The stacked-layer structure of each sample is shown in the following table.

TABLE 1

| | Film thickness | |
|---|---|---|
| Mask film | 50 nm | $Alq_3$ |
| Film 3 | 15 nm | NBPhen |
| Film 2 | 20 nm | 2mDBTBPDBq-II |
| Film 1 | 40 nm | 8BP-4mDBtPBfpm: PCCP (0.6:0.4) |

The four samples each having the above structure were prepared. Water for Sample 1, an 8.5% aqueous solution of phosphoric acid for Sample 2, and a 5 wt % aqueous solution of tetramethylammonium hydroxide (TMAH) for Sample 3 were used as removal liquids for the treatment of removing the respective mask films. Sample 4 was a reference.

The treatment of removing each mask film was performed by 5-minute immersion in the corresponding removal liquid, wash with pure water, and then drying.

The samples having been subjected to the removal treatment were cut into 2 cm square pieces. In 1 ml of a solution containing acetonitrile:chloroform in a 7:1 ratio, the pieces were irradiated with ultrasonic waves for 15 minutes, whereby the above-described film was eluted. The solution in which the sample was eluted was measured by high performance liquid chromatography.

For the measurements by high performance liquid chromatography, Waters Acquity UPLC (registered trademark) System manufactured by Waters Corporation was used. A UV detector (Waters 2996PDA Detector, manufactured by Waters Corporation) was used as a detector to perform detection by ultraviolet/visible light absorption. ACQUITY UPLC CSH C18 Column manufactured by Waters Corporation (particle diameter: 1.7 μm, 2.1×100 mm) was used as a column. In the measurements, acetonitrile was used for the mobile phase A and water was used for the mobile phase B. The analysis was performed while A was held at 85% at a flow rate of 0.5 mL/min for 10 minutes, increased at a constant rate to 95% for 15 minutes by a gradient analysis, and then held at 95% for 20 minutes. The injection amount of the sample solution was 5 μL.

Figure 19:
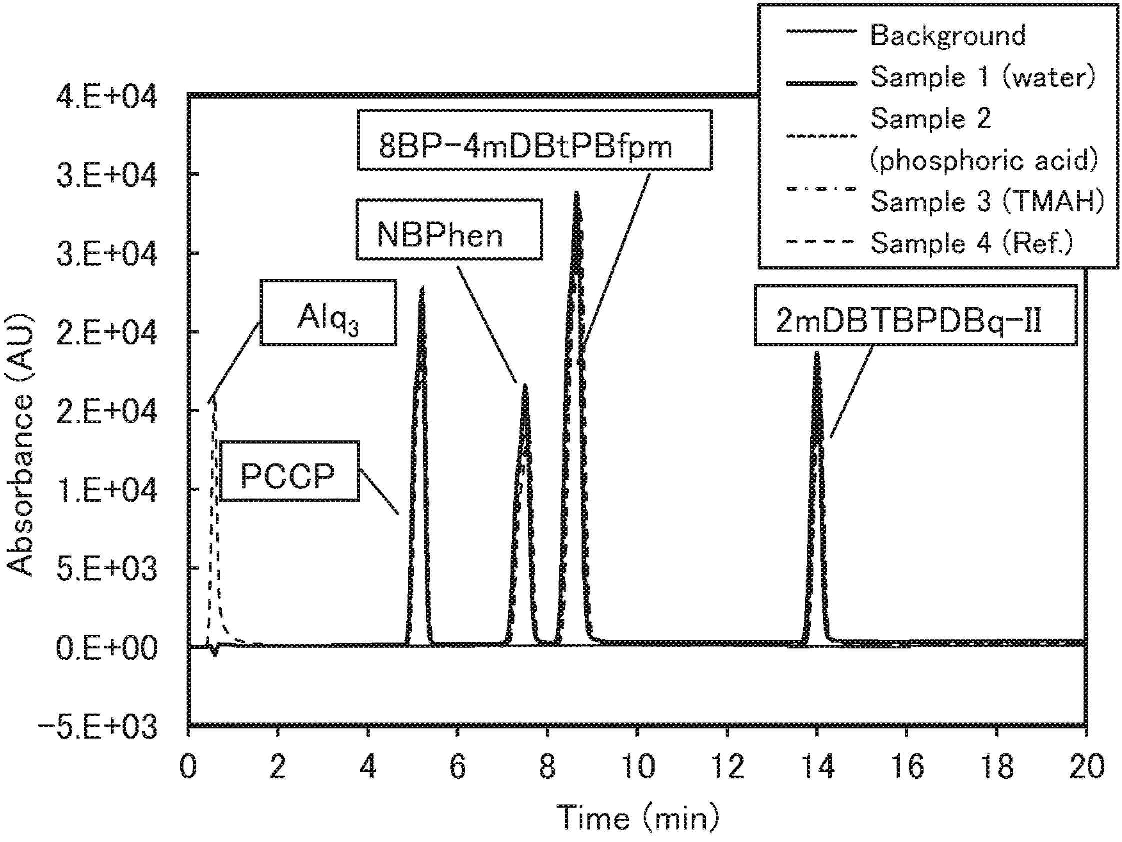
FIG. 19 is a diagram showing results of measurements by high performance liquid chromatography.

FIG. 19 shows a chromatogram obtained by the measurements (absorption wavelength: 310 nm). As shown in the chromatogram, quinolinol derived from $Alq_3$ in the mask film was detected only from Sample 4, which was not subjected to the removal treatment, and quinolinol derived from $Alq_3$ was not detected from the other samples subjected to the removal treatment. It is thus found that $Alq_3$ can be easily removed by means of water or a liquid containing water as a solvent while the film formed thereunder is left.

REFERENCE NUMERALS

100: substrate, 101R: first electrode, 101C: connection electrode, 101G: first electrode, 101B: first electrode, 101: first electrode, 102: second electrode, 103: EL layer, 107: mask layer, 108: insulating layer, 110R: organic EL device, 110G: organic EL device, 110B: organic EL device, 111: hole-injection layer, 112: hole-transport layer, 113: light-emitting layer, 114: electron-transport layer, 115: electron-injection layer, 120R: EL layer, 120Rb: EL film, 120G: EL layer, 120Gb: EL film, 120B: EL layer, 120Bb: EL film, 121: EL layer, 125: insulating layer, 125*b*: insulating layer, 126: insulating layer, 126*b*: insulating layer, 130: connection portion, 131: barrier layer, 143*a*: resist mask, 144*a*: aluminum oxide film, 145*a*: aluminum oxide layer, 145*b*: aluminum oxide layer, 145*c*: aluminum oxide layer, 146*a*: metal film or metal compound film, 147*a*: metal layer or metal compound layer, 149*a*: mask layer, 149*b*: mask layer, 149*c*: mask layer, 150: base film, 151: organic semiconductor film, 151*a*: organic semiconductor layer, 151*s*: surface, 152: mask layer, 152*a*: mask layer, 153: aluminum oxide film, 153*a*: aluminum oxide layer, 153*r*: aluminum oxide film, 154: metal film or metal compound film, 154*a*: metal layer or metal compound layer, 155: resin film, 155*a*: photomask layer, 160: insulating layer, 161: gate insulating layer, 162: gate electrode, 165: first electrode, 166: second electrode, 167: photoelectric conversion layer, 168: light-emitting layer, 450: light-emitting apparatus, 601: source line driver circuit, 602: pixel portion, 603: gate line driver circuit, 604: sealing substrate, 605: sealing material, 607: space, 608: lead wiring, 610: element substrate, 611: switching FET, 612: current controlling FET, 613: first electrode, 614: insulator, 616: EL layer, 617: second electrode, 618: organic EL device, 623: FET, 1001: substrate, 1002: base insulating film, 1003: gate insulating film, 1006: gate electrode, 1007: gate electrode, 1008: gate electrode, 1020: first interlayer insulating film, 1021: second interlayer insulating film, 1022: electrode, 1024B: first electrode, 1024G: first electrode, 1024R: first electrode, 1024W: first electrode, 1025: partition, 1028: EL layer, 1029: cathode, 1031: sealing substrate, 1032: sealing material, 1033: base material, 1034B: coloring layer, 1034G: coloring layer, 1034R: coloring layer, 1035: black matrix, 1036: overcoat layer, 1037: third interlayer insulating film, 1040: pixel portion, 1041: driver circuit portion, 1042: peripheral portion, 2100: robot, 2101: illuminance sensor, 2102: microphone, 2103: upper camera, 2104: speaker, 2105: display, 2106: lower camera, 2107: obstacle sensor, 2108: moving mechanism, 2110: arithmetic device, 5000: housing, 5001: display portion, 5002: second display portion, 5003: speaker, 5004: LED lamp, 5006: connection terminal, 5007: sensor, 5008: microphone, 5012: support portion, 5013: earphone, 5100: cleaning robot, 5101: display, 5102: camera, 5103: brush, 5104: operation button, 5120: dust, 5140: portable electronic appliance, 5150: portable information terminal, 5151: housing, 5152: display region, 5153: bend portion, 5200: display region, 5201: display region, 5202: display region, 5203: display region, 7101: housing, 7103: display portion, 7105: stand, 7107: display portion, 7109: operation key, 7110: remote controller, 7201: main body, 7202: housing, 7203: display portion, 7204: keyboard, 7205: external connection port, 7206: pointing device, 7210: display portion, 7401: housing, 7402: display portion, 7403: operation button, 7404: external connection port, 7405: speaker, 7406: microphone, 9310: portable information terminal, 9311: display panel, 9313: hinge, 9315: housing

The invention claimed is:

1. A layer between an organic semiconductor layer and an aluminum oxide film, the layer comprising an organometallic compound represented by General Formula (G1),

[Chemical formula 3]

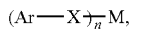

(G1)

wherein, in the General Formula (G1):

Ar represents a substituted or unsubstituted aryl group having 6 to 30 carbon atoms or a substituted or unsubstituted heteroaryl group having 1 to 30 carbon atoms;

X represents oxygen or sulfur;

M represents a metal;

n represents an integer greater than or equal to 1 and less than or equal to 5; and a valence of the M is the same as n, wherein, when n is greater than or equal to 2, a plurality of Ars is the same or different and a plurality of Xs is the same or different, and wherein, when Ar represents the substituted or unsubstituted heteroaryl group having 1 to 30 carbon atoms, a heteroatom of the heteroaryl group is coordinated to the M or is not coordinated to the M.

2. A layer used to remove an aluminum oxide film, between an organic semiconductor layer and the aluminum oxide film, the layer comprising an organometallic compound represented by General Formula (G1),

[Chemical formula 4]

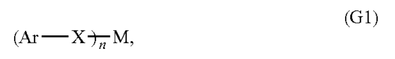

(G1)

wherein, in the General Formula (G1):

Ar represents a substituted or unsubstituted aryl group having 6 to 30 carbon atoms or a substituted or unsubstituted heteroaryl group having 1 to 30 carbon atoms;

X represents oxygen or sulfur;

M represents a metal;

n represents an integer greater than or equal to 1 and less than or equal to 5; and a valence of the M is the same as n, wherein, when n is greater than or equal to 2, a plurality of Ars is the same or different and a plurality of Xs is the same or different, and wherein, when Ar represents the substituted or unsubstituted heteroaryl group having 1 to 30 carbon atoms, a heteroatom of the heteroaryl group is coordinated to the M or is not coordinated to the M.

3. An organometallic compound represented by General Formula (G1) for a mask for an organic semiconductor layer used to remove an aluminum oxide film formed over the organic semiconductor layer,

[Chemical formula 1]

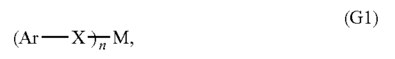

(G1)

wherein, in the General Formula (G1):

Ar represents a substituted or unsubstituted aryl group having 6 to 30 carbon atoms or a substituted or unsubstituted heteroaryl group having 1 to 30 carbon atoms;

X represents oxygen or sulfur;

M represents a metal;

n represents an integer greater than or equal to 1 and less than or equal to 5; and a valence of the M is the same as n, wherein, when n is greater than or equal to 2, a plurality of Ars is may be the same or different and a plurality of Xs is the same or different, and wherein, when Ar represents the substituted or unsubstituted heteroaryl group having 1 to 30 carbon atoms, a heteroatom of the heteroaryl group is coordinated to the M or is not coordinated to the M.

4. The organometallic compound for a mask for an organic semiconductor layer, according to claim 3, wherein the organometallic compound represented by the General Formula (G1) is an organometallic compound represented by General Formula (G2),

[Chemical formula 2]

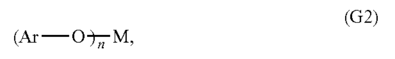

(G2)

wherein, in the General Formula (G2):

Ar represents a substituted or unsubstituted aryl group having 6 to 30 carbon atoms or a substituted or unsubstituted heteroaryl group having 1 to 30 carbon atoms;

M represents a metal;

n represents an integer greater than or equal to 1 and less than or equal to 3; and a valence of the M is the same as n, wherein, when n is greater than or equal to 2, a plurality of Ars is the same or different, and wherein, when Ar represents the substituted or unsubstituted heteroaryl group having 1 to 30 carbon atoms, a heteroatom of the heteroaryl group is coordinated to the M or is not coordinated to the M.

5. A method for manufacturing an organic semiconductor device, comprising:

a step of forming an organic semiconductor film over a first electrode;

a step of forming a mask film comprising an organometallic compound represented by General Formula (G1) over the organic semiconductor film;

a step of forming a first aluminum oxide film over the mask film;

a step of forming a metal film or a metal compound film over the first aluminum oxide film;

a step of forming a photomask over the metal film or the metal compound film;

a step of forming a metal layer or a metal compound layer overlapping with the first electrode by etching the metal film or the metal compound film with the use of the photomask;

a step of removing the photomask;

a step of forming a first aluminum oxide layer, a mask layer, and an organic semiconductor layer by etching the first aluminum oxide film, the mask film, and the organic semiconductor film with the use of the metal layer or the metal compound layer as a mask;

a step of removing the metal layer or the metal compound layer;

a step of forming an organic resin film covering the first electrode, the organic semiconductor layer, the mask layer, and the first aluminum oxide layer;

a step of forming, in the organic resin film, an opening portion overlapping with the first electrode, the organic semiconductor layer, the mask layer, and the first aluminum oxide layer; and a step of removing the mask layer and the first aluminum oxide layer that overlap with the opening portion with the use of by means of water or a liquid comprising water as a solvent,

[Chemical formula 7]

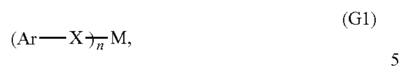

(G1)

wherein, in the General Formula (G1):

Ar represents a substituted or unsubstituted aryl group having 6 to 30 carbon atoms or a substituted or unsubstituted heteroaryl group having 1 to 30 carbon atoms;

X represents oxygen or sulfur;

M represents a metal;

n represents an integer greater than or equal to 1 and less than or equal to 5; and a valence of the M is the same as n, wherein, when n is greater than or equal to 2, a plurality of Ars is the same or different and a plurality of Xs is the same or different, and wherein, when Ar represents the substituted or unsubstituted heteroaryl group having 1 to 30 carbon atoms, a heteroatom of the heteroaryl group is coordinated to the M or is not coordinated to the M.

6. The method for manufacturing an organic semiconductor device, according to claim 5, wherein the organometallic compound represented by the General Formula (G1) is an organometallic compound represented by General Formula (G2),

[Chemical formula 8]

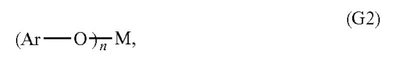

(G2)

wherein, in the General Formula (G2):

Ar represents a substituted or unsubstituted aryl group having 6 to 30 carbon atoms or a substituted or unsubstituted heteroaryl group having 1 to 30 carbon atoms;

M represents a metal;

n represents an integer greater than or equal to 1 and less than or equal to 3; and a valence of the M is the same as n, wherein, when n is greater than or equal to 2, a plurality of Ars is the same or different, and wherein, when Ar represents the substituted or unsubstituted heteroaryl group having 1 to 30 carbon atoms, a heteroatom of the heteroaryl group is coordinated to the M or is not coordinated to the M.

7. A method for manufacturing an organic semiconductor device, comprising:

a step of forming an organic semiconductor film over a first electrode;

a step of forming a mask film comprising an organometallic compound represented by General Formula (G1) over the organic semiconductor film;

a step of forming a first aluminum oxide film over the mask film;

a step of forming a metal film or a metal compound film over the first aluminum oxide film;

a step of forming a photomask over the metal film or the metal compound film;

a step of forming a metal layer or a metal compound layer overlapping with the first electrode by etching the metal film or the metal compound film with the use of the photomask;

a step of removing the photomask;

a step of forming a first aluminum oxide layer, a mask layer, and an organic semiconductor layer by etching the first aluminum oxide film, the mask film, and the organic semiconductor film with the use of the metal layer or the metal compound layer as a mask;

a step of removing the metal layer or the metal compound layer;

a step of forming a second aluminum oxide film covering the first electrode, the organic semiconductor layer, the mask layer, and the first aluminum oxide layer;

a step of forming an organic resin film covering the first electrode, the organic semiconductor layer, the mask layer, the first aluminum oxide layer, and the second aluminum oxide film;

a step of forming, in the organic resin film, an opening portion overlapping with the first electrode, the organic semiconductor layer, the mask layer, the first aluminum oxide layer, and the second aluminum oxide film; and a step of removing the mask layer, the first aluminum oxide layer, and the second aluminum oxide film that overlap with the opening portion with the use of water or a liquid comprising water as a solvent,

[Chemical formula 9]

(G1)

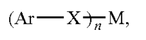

wherein, in the General Formula (G1):

Ar represents a substituted or unsubstituted aryl group having 6 to 30 carbon atoms or a substituted or unsubstituted heteroaryl group having 1 to 30 carbon atoms;

X represents oxygen or sulfur;

M represents a metal;

n represents an integer greater than or equal to 1 and less than or equal to 5; and a valence of the M is the same as n, wherein, when n is greater than or equal to 2, a plurality of Ars is the same or different and a plurality of Xs is the same or different, and wherein, when Ar represents the substituted or unsubstituted heteroaryl group having 1 to 30 carbon atoms, a heteroatom of the heteroaryl group is coordinated to the M or is not coordinated to the M.

8. The method for manufacturing an organic semiconductor device, according to claim 7, wherein the organometallic compound represented by the General Formula (G1) is an organometallic compound represented by General Formula (G2),

[Chemical formula 10]

(G2)

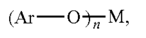

wherein, in the General Formula (G2):

Ar represents a substituted or unsubstituted aryl group having 6 to 30 carbon atoms or a substituted or unsubstituted heteroaryl group having 1 to 30 carbon atoms;

M represents a metal;

n represents an integer greater than or equal to 1 and less than or equal to 3; and a valence of the M is the same as n, wherein, when n is greater than or equal to 2, a plurality of Ars is the same or different, and wherein, when Ar represents the substituted or unsubstituted heteroaryl group having 1 to 30 carbon atoms, a heteroatom of the heteroaryl group is coordinated to the M or is not coordinated to the M.

9. A method for processing an organic semiconductor layer, comprising:

a step of forming the organic semiconductor layer over a first electrode;

a step of forming a mask layer comprising an organometallic compound represented by General Formula (G1) over the organic semiconductor layer;

a step of forming an aluminum oxide film over the mask layer;

a step of processing a shape of the organic semiconductor layer with the use of the aluminum oxide film; and a step of removing the mask layer and the aluminum oxide film with the use of water or a liquid comprising water as a solvent,

[Chemical formula 5]

(G1)

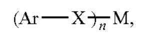

wherein, in the General Formula (G1):

Ar represents a substituted or unsubstituted aryl group having 6 to 30 carbon atoms or a substituted or unsubstituted heteroaryl group having 1 to 30 carbon atoms;

X represents oxygen or sulfur;

M represents a metal;

n represents an integer greater than or equal to 1 and less than or equal to 5; and a valence of the M is the same as n, wherein, when n is greater than or equal to 2, a plurality of Ars is the same or different and a plurality of Xs is the same or different, and wherein, when Ar represents the substituted or unsubstituted heteroaryl group having 1 to 30 carbon atoms, a heteroatom of the heteroaryl group is coordinated to the M or is not coordinated to the M.

10. The method for processing an organic semiconductor layer, according to claim 9, wherein the organometallic compound represented by the General Formula (G1) is an organometallic compound represented by General Formula (G2),

[Chemical formula 6]

(G2)

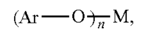

wherein, in the General Formula (G2):

Ar represents a substituted or unsubstituted aryl group having 6 to 30 carbon atoms or a substituted or unsubstituted heteroaryl group having 1 to 30 carbon atoms;

M represents a metal;

n represents an integer greater than or equal to 1 and less than or equal to 3; and a valence of the M is the same as n, wherein, when n is greater than or equal to 2, a plurality of Ars is the same or different, and wherein, when Ar represents the substituted or unsubstituted heteroaryl group having 1 to 30 carbon atoms, a heteroatom of the heteroaryl group is coordinated to the M or is not coordinated to the M.

11. The method for processing an organic semiconductor layer, according to claim 9, comprising:

a step of forming a metal film or a metal compound film over the aluminum oxide film after the step of forming the aluminum oxide film over the mask layer, wherein the aluminum oxide film and the metal film or the metal compound film are used in the step of processing the shape of the organic semiconductor layer.

12. The method for processing an organic semiconductor layer, according to claim 11, further comprising:

a step of removing the metal film or the metal compound film between the step of processing the shape of the organic semiconductor layer and the step of removing the mask layer and the aluminum oxide film with the use of water or a liquid comprising water as a solvent.

* * * * *